United States Patent
Allen

(10) Patent No.: US 7,499,270 B2
(45) Date of Patent: Mar. 3, 2009

(54) LOCK FOR PORTABLE MUSIC PLAYER OR OTHER PERSONAL ELECTRONIC DEVICE

(76) Inventor: Peter Allen, 15 Berry Hill Rd., Oyster Bay Cove, NY (US) 11771

( * ) Notice: Subject to any disclaimer, the term of this patent is extended or adjusted under 35 U.S.C. 154(b) by 241 days.

(21) Appl. No.: 11/454,137

(22) Filed: Jun. 15, 2006

(65) Prior Publication Data

US 2006/0291157 A1 Dec. 28, 2006

Related U.S. Application Data

(63) Continuation-in-part of application No. 11/359,871, filed on Feb. 22, 2006, now Pat. No. 7,324,333, which is a continuation-in-part of application No. 11/038,591, filed on Jan. 19, 2005, now Pat. No. 7,315,443.

(60) Provisional application No. 60/783,188, filed on Mar. 16, 2006, provisional application No. 60/757,737, filed on Jan. 10, 2006, provisional application No. 60/725,333, filed on Oct. 11, 2005, provisional application No. 60/691,476, filed on Jun. 17, 2005, provisional application No. 60/678,911, filed on May 6, 2005, provisional application No. 60/655,270, filed on Feb. 22, 2005, provisional application No. 60/626,839, filed on Nov. 10, 2004, provisional application No. 60/569,561, filed on May 10, 2004.

(51) Int. Cl.
*H05K 5/00* (2006.01)
*H05K 7/00* (2006.01)
*E05B 73/00* (2006.01)
*H01L 23/34* (2006.01)
*A47B 81/00* (2006.01)
*A47B 97/00* (2006.01)
*G06F 1/16* (2006.01)

(52) U.S. Cl. ............... 361/683; 361/679; 361/684; 361/686; 211/8; 211/9; 312/223.2; 257/727

(58) Field of Classification Search ................. 361/683, 361/679, 684, 686; 206/320; 224/930; 70/57.1; 211/8, 9; 312/223.2; 257/727
See application file for complete search history.

(56) References Cited

U.S. PATENT DOCUMENTS 3,275,160 A 9/1966 Zucker
3,410,122 A 11/1968 Moses
3,410,580 A 11/1968 Longenecker (Continued)

*Primary Examiner*—Jayprakash N Gandhi
*Assistant Examiner*—Anthony M Haughton
(74) *Attorney, Agent, or Firm*—Alfred M. Walker

(57) ABSTRACT

A portable music player or other personal electronic device locking assembly includes a locking base frame. The locking base frame locks the portable music player or other personal electronic device securely in place to a work surface such as a desk top or table top. The lock is adapted to engage the portable music player or other personal electronic device screen in the open position, leaving a front surface of the screen viewable. The lock prevents removal of the portable music player or other personal electronic device from the work surface. A security table top/work surface clamp includes a cable clamp having a fixed or adjustably sized generally C-shaped clamp body insertable over a table top or other flat work surface. The lower operating knob has a transverse hole or slot preventing loosening of the threaded bolt once the flexible cable is installed through the transverse hole or slot.

32 Claims, 41 Drawing Sheets

U.S. PATENT DOCUMENTS

| | | | |
|---|---|---|---|
| 3,535,898 A | 10/1970 | Allport | |
| RE28,187 E | 10/1974 | Longenecker | |
| 3,945,227 A * | 3/1976 | Reiland | 70/58 |
| 3,965,705 A | 6/1976 | Nadler | |
| 4,066,231 A | 1/1978 | Bahner et al. | |
| 4,696,449 A * | 9/1987 | Woo et al. | 248/553 |
| 4,870,842 A | 10/1989 | Plumer | |
| 5,052,198 A | 10/1991 | Watts | |
| 5,052,199 A | 10/1991 | Derman | |
| 5,076,079 A | 12/1991 | Monoson | |
| 5,085,395 A * | 2/1992 | Frater et al. | 248/552 |
| 5,135,197 A | 8/1992 | Kelley et al. | |
| 5,169,114 A | 12/1992 | O'Neill | |
| 5,351,507 A | 10/1994 | Derman | |
| 5,469,726 A | 11/1995 | Rushing et al. | |
| 5,502,989 A | 4/1996 | Murry, Jr. et al. | |
| 5,531,082 A | 7/1996 | Wolk et al. | |
| 5,582,044 A | 12/1996 | Bolich | |
| 5,595,074 A | 1/1997 | Munro | |
| 5,645,261 A | 7/1997 | Glynn | |
| 5,709,110 A | 1/1998 | Greenfield et al. | |
| 5,787,739 A | 8/1998 | Derman | |
| 5,794,463 A | 8/1998 | McDaid | |
| 5,816,076 A | 10/1998 | Biedermann et al. | |
| 5,836,183 A | 11/1998 | Derman | |
| 5,927,108 A | 7/1999 | Pierce | |
| 6,000,252 A | 12/1999 | Murray, Jr. et al. | |
| 6,006,557 A | 12/1999 | Carl et al. | |
| 6,138,483 A | 10/2000 | Galant | |
| 6,155,088 A | 12/2000 | Murray, Jr. et al. | |
| 6,185,964 B1 | 2/2001 | Addiego | |
| 6,212,921 B1 | 4/2001 | Knighton | |
| 6,216,499 B1 | 4/2001 | Ronberg et al. | |
| 6,237,375 B1 | 5/2001 | Wymer | |
| 6,308,928 B1 | 10/2001 | Galant | |
| 6,317,936 B1 | 11/2001 | McDaid et al. | |
| 6,443,417 B2 | 9/2002 | Galant | |
| 6,477,870 B1 | 11/2002 | Derman | |
| 6,497,125 B1 * | 12/2002 | Necchi | 70/57.1 |
| 6,581,420 B1 | 6/2003 | Ling et al. | |
| 6,612,455 B2 | 9/2003 | Byrne | |
| 6,684,548 B1 | 2/2004 | Petrus | |
| 6,689,954 B2 | 2/2004 | Vaughan et al. | |
| 6,705,133 B1 | 3/2004 | Avganim | |
| 6,711,921 B1 | 3/2004 | Yang | |
| 6,735,990 B1 | 5/2004 | Murray, Jr. et al. | |
| 6,755,056 B2 | 6/2004 | Igelmund | |
| 6,763,690 B2 | 7/2004 | Galant | |
| 6,810,698 B2 | 11/2004 | Weinraub | |
| 6,820,362 B1 | 11/2004 | Petrus | |
| 6,926,141 B2 * | 8/2005 | Montler | 206/320 |
| 7,255,228 B2 * | 8/2007 | Kim | 206/320 |
| 2005/0161557 A1 * | 7/2005 | Heintz | 248/121 |
| 2005/0247584 A1 * | 11/2005 | Lu | 206/320 |
| 2006/0032877 A1 * | 2/2006 | Obolo | 224/269 |
| 2007/0235493 A1 * | 10/2007 | Fortson | 224/930 |

* cited by examiner

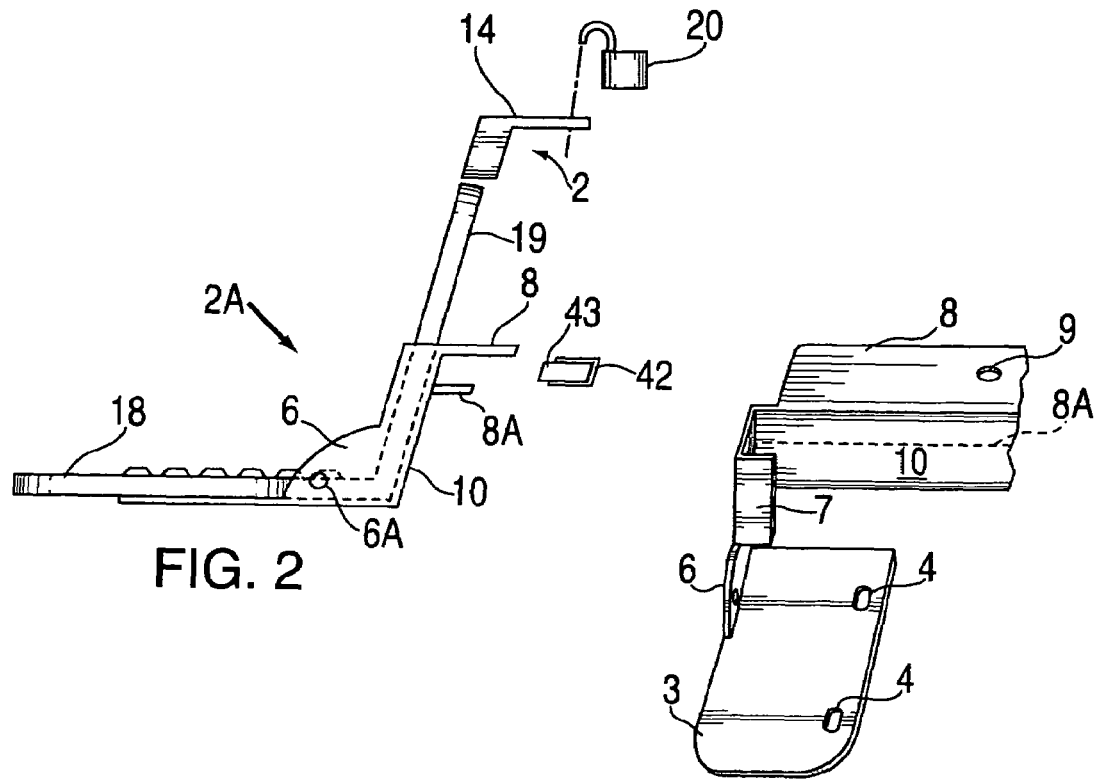
FIG. 2
FIG. 2A
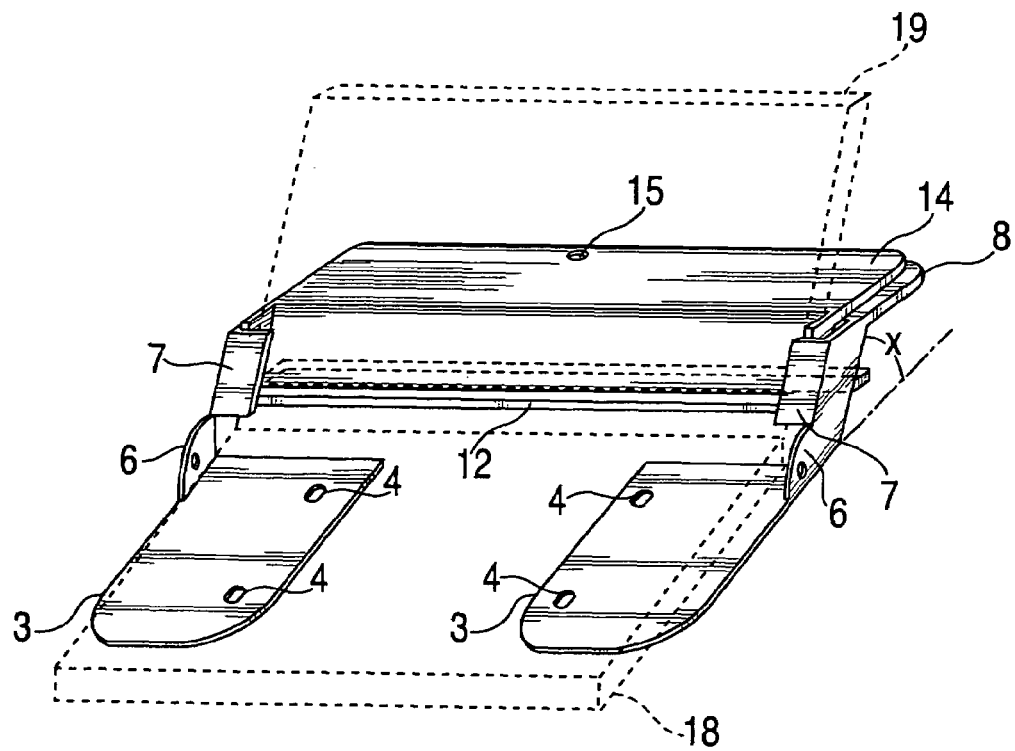
FIG. 2B

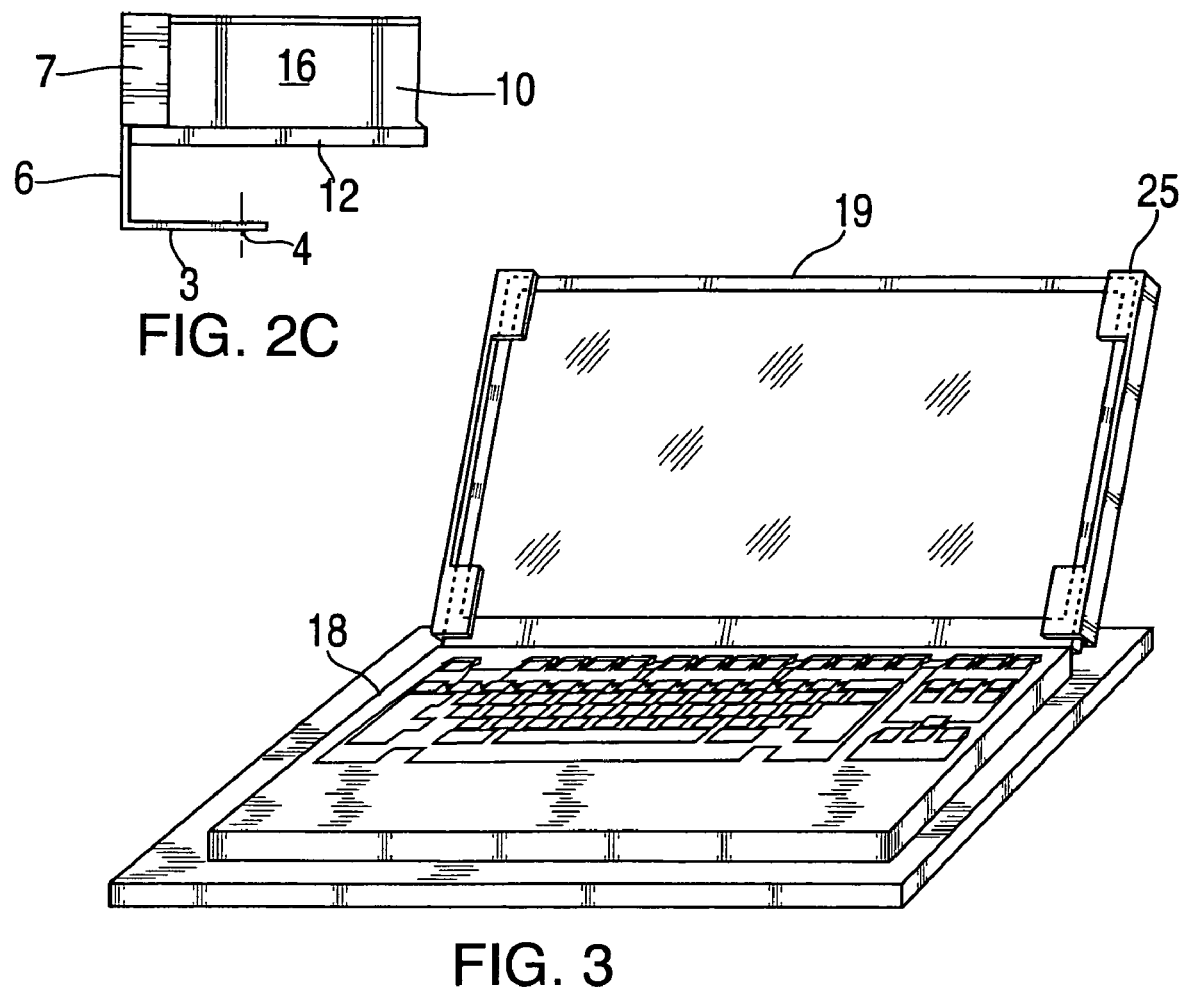

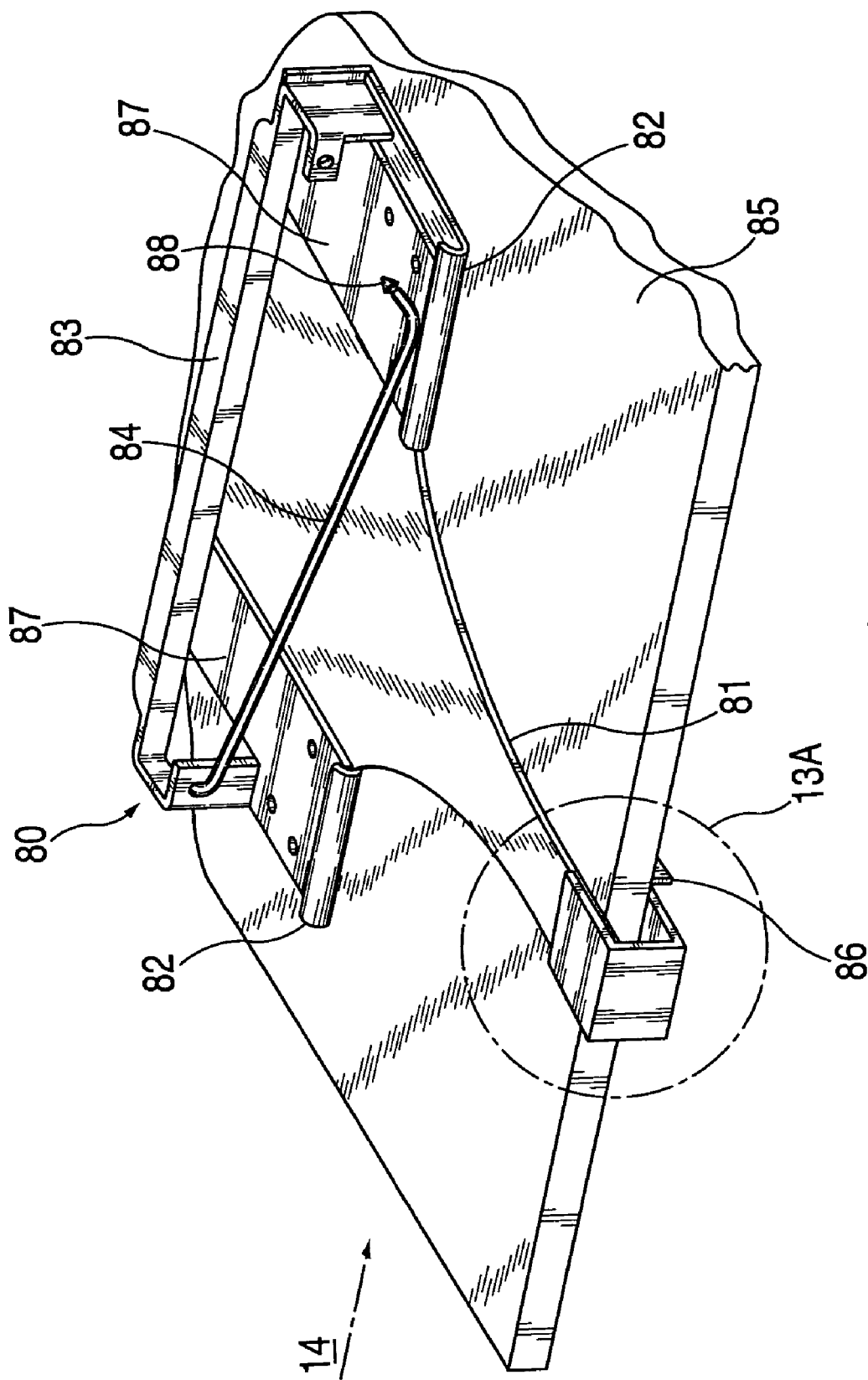

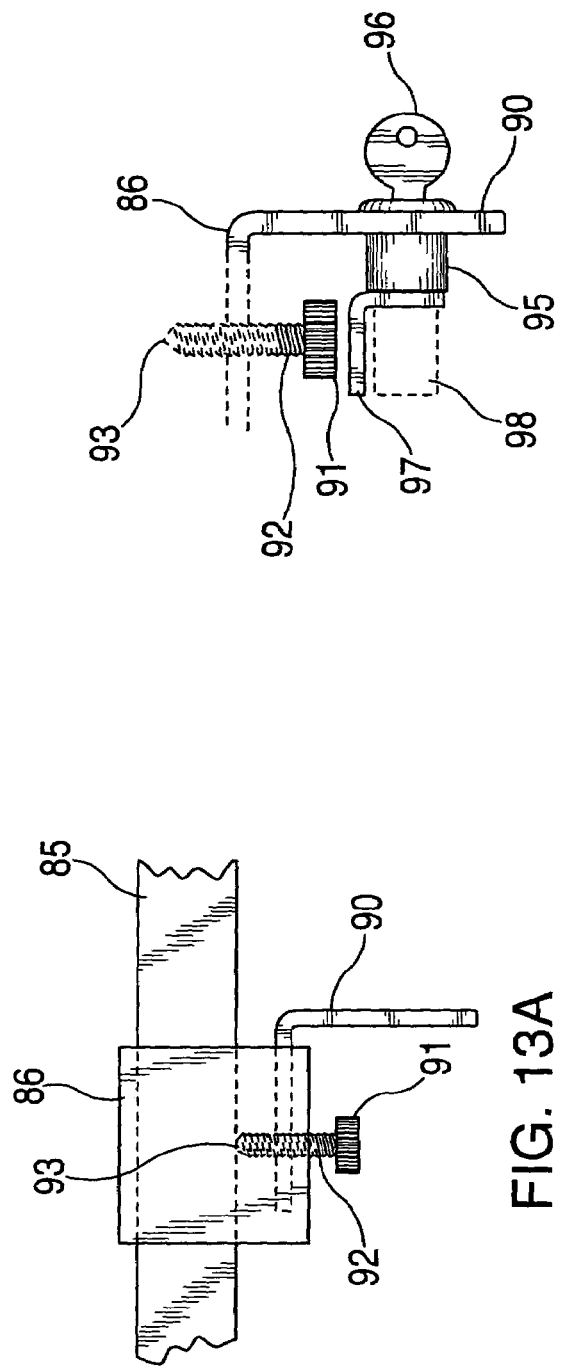
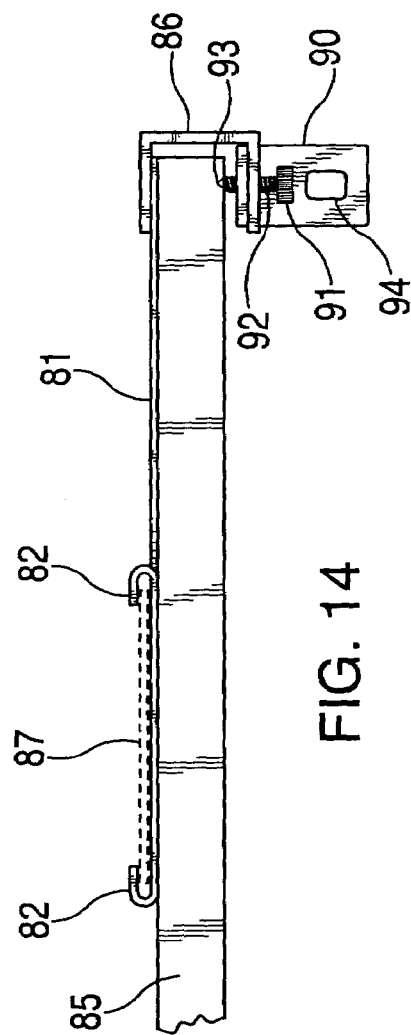

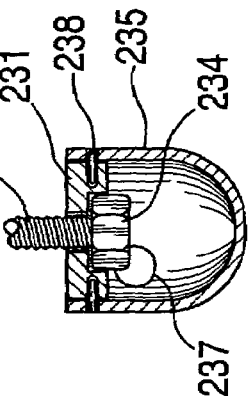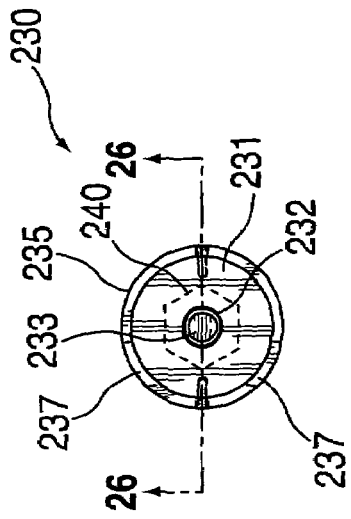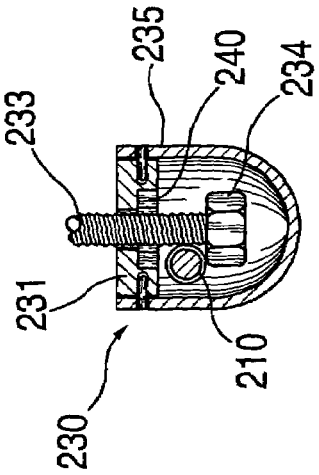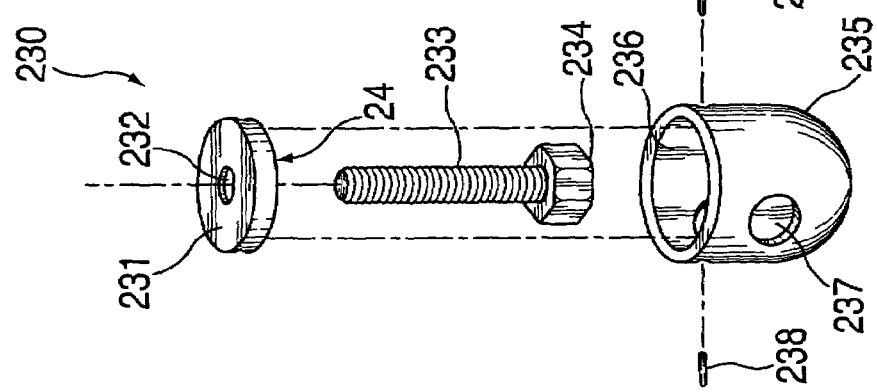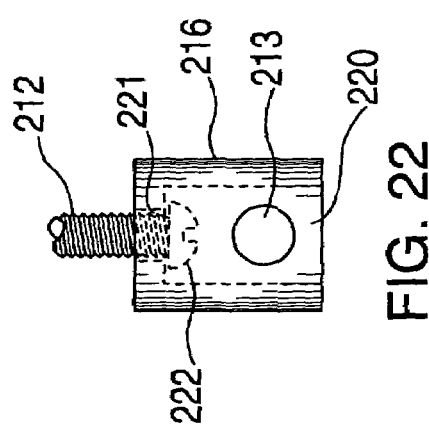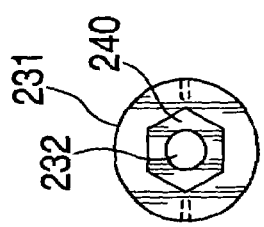

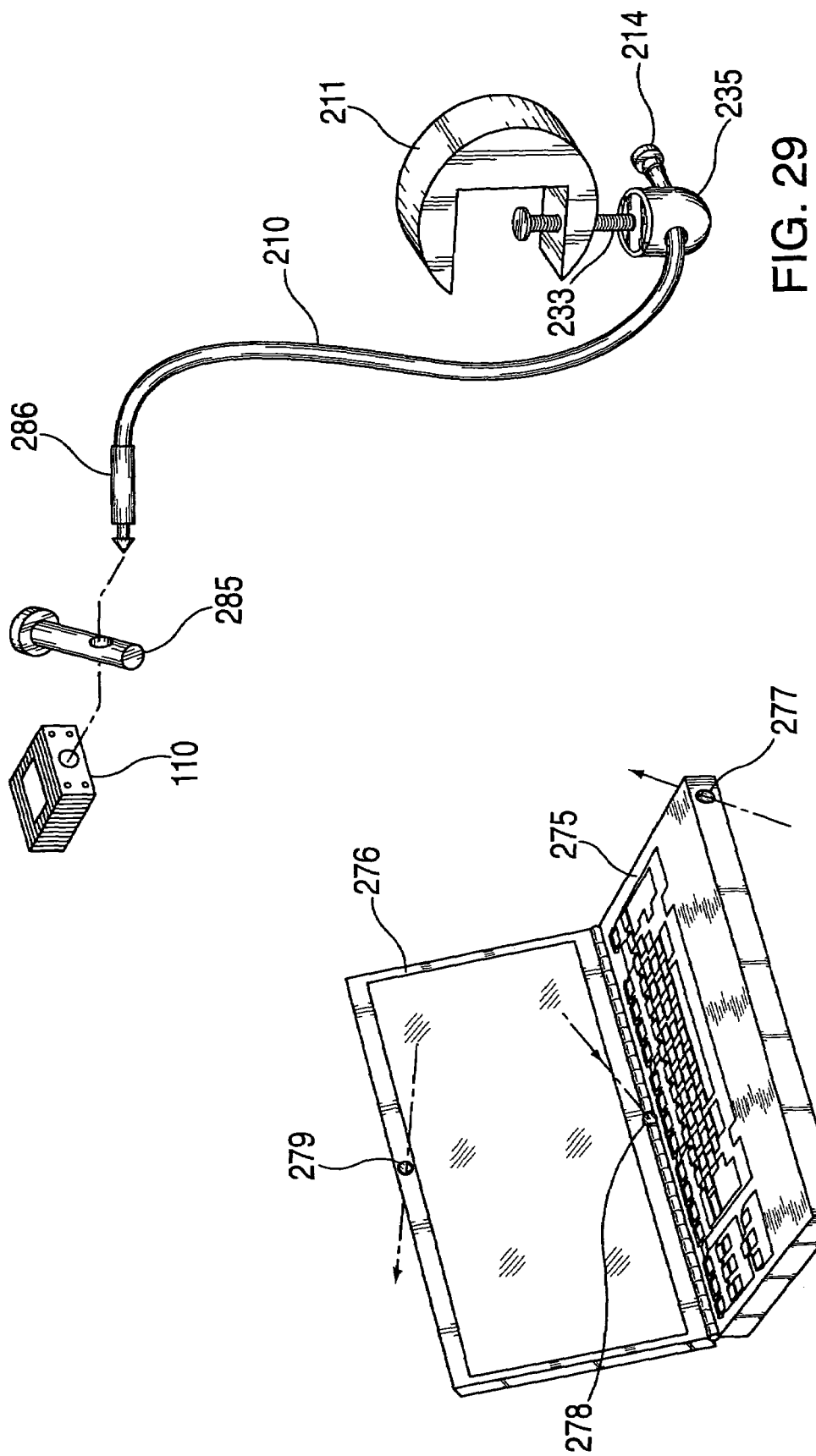

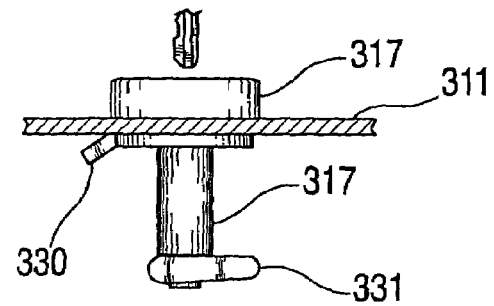
FIG. 39
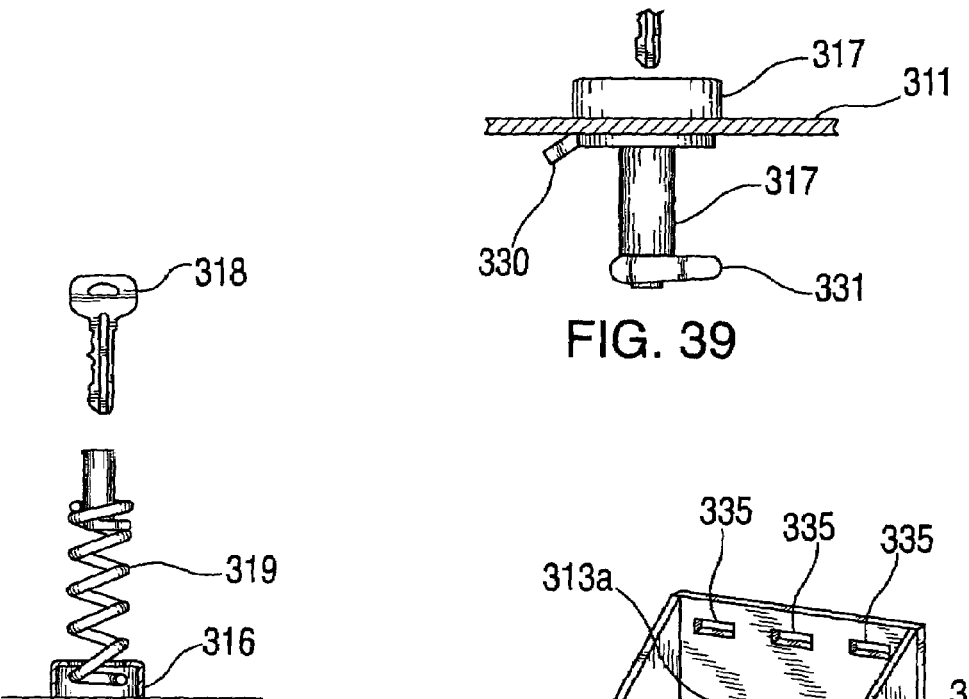
FIG. 38
FIG. 36
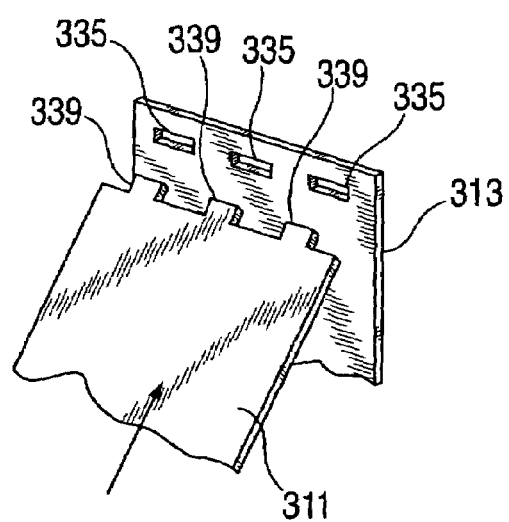
FIG. 37

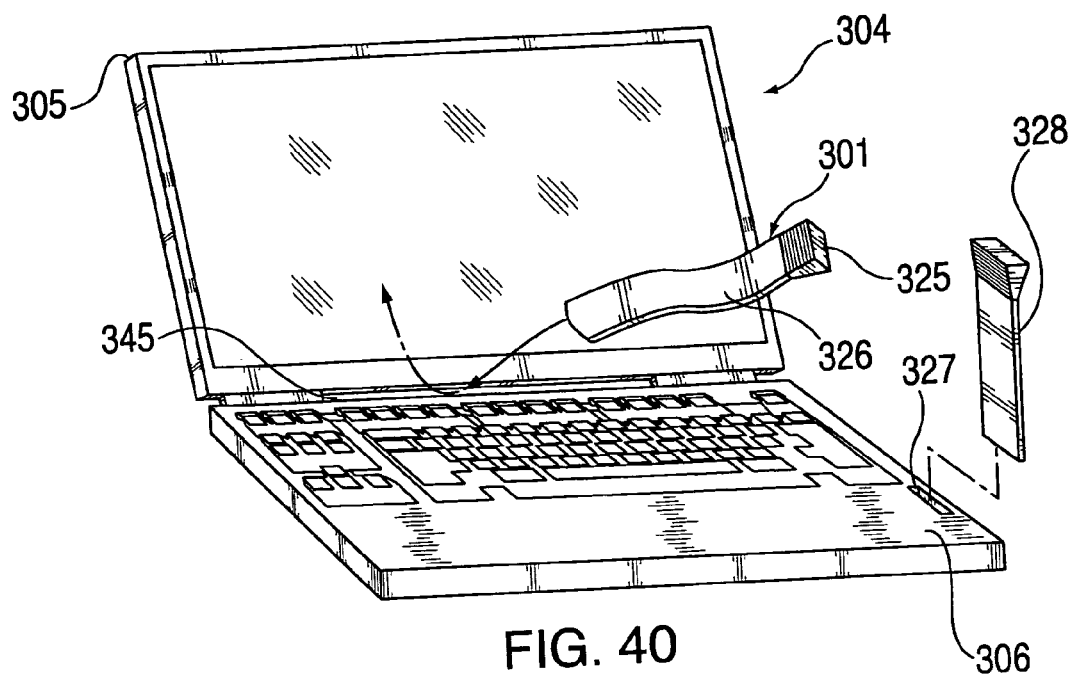
FIG. 40
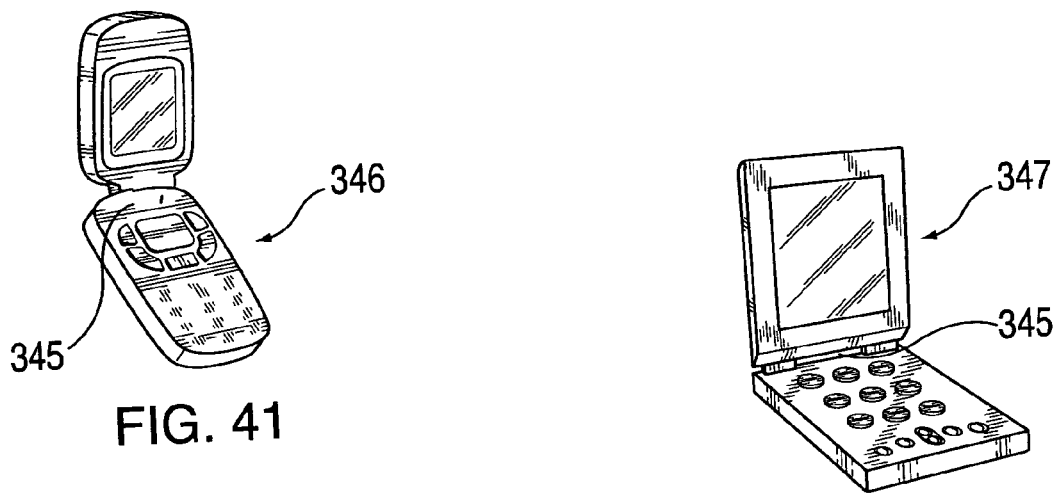
FIG. 41
FIG. 42
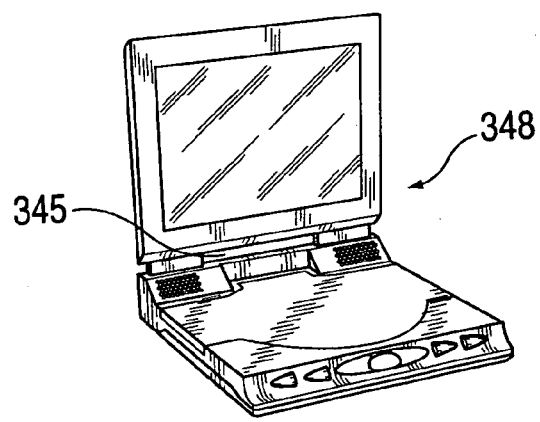
FIG. 43

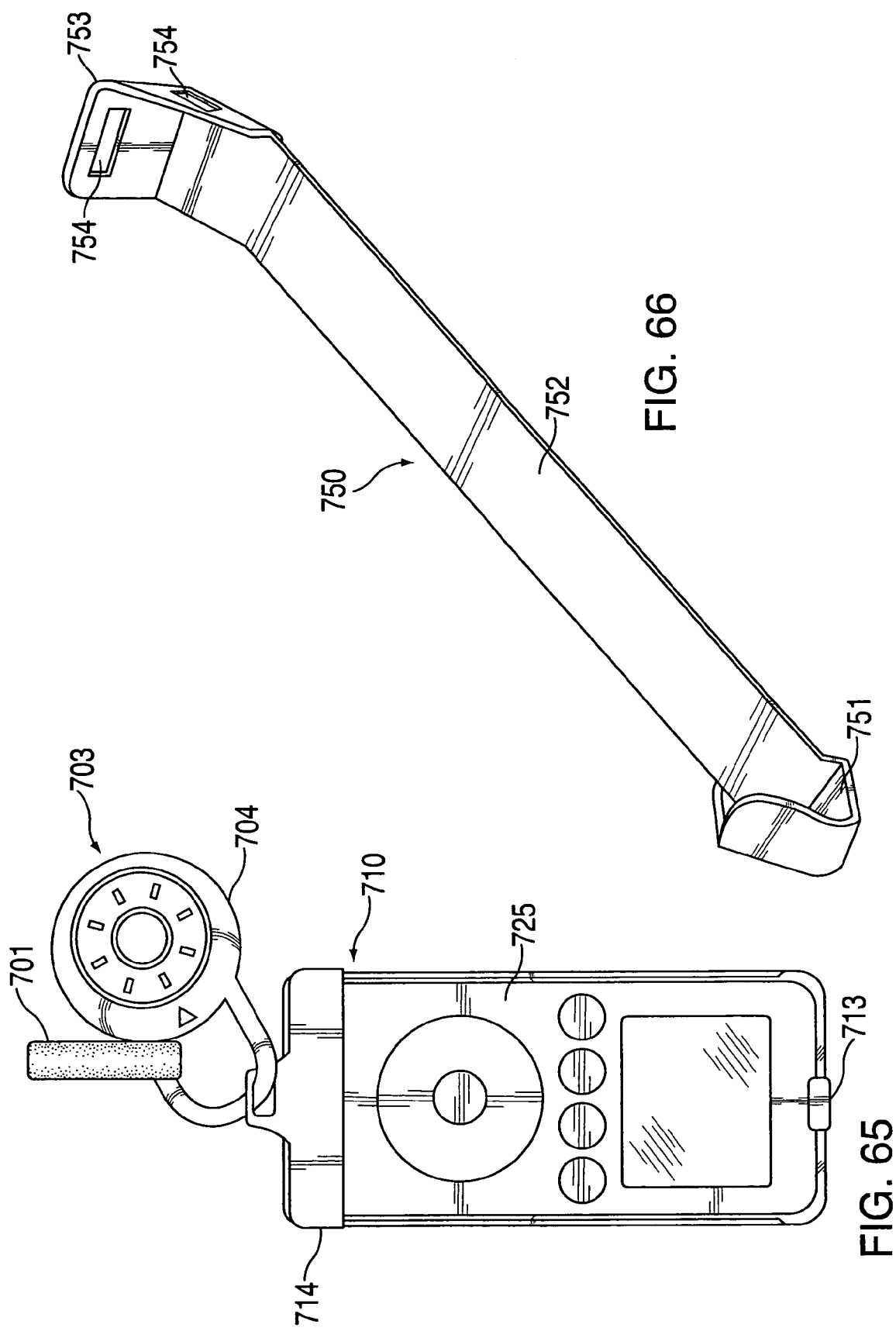

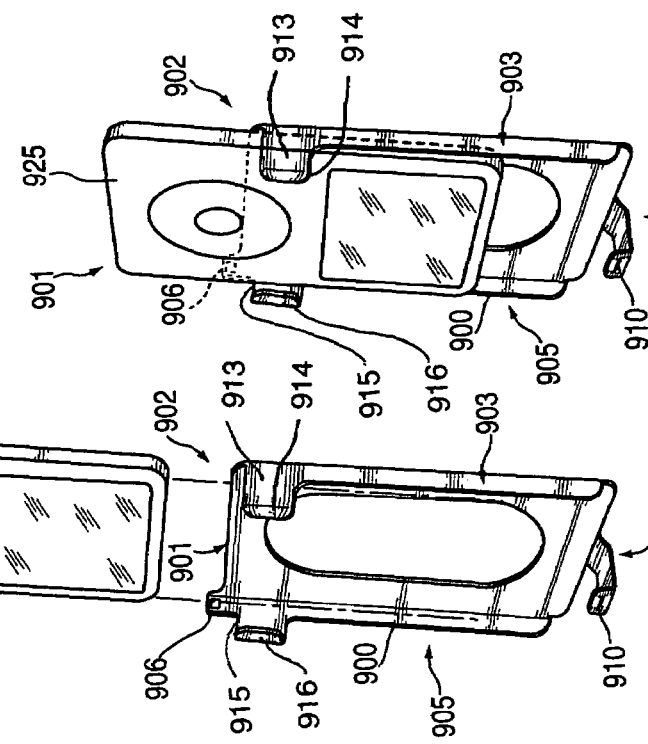
FIG. 73
FIG. 72
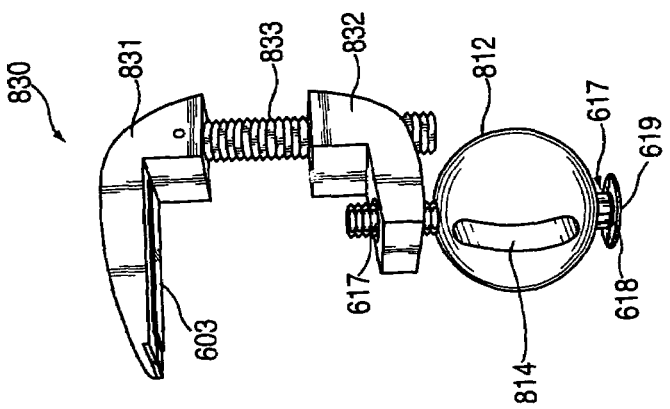
FIG. 71
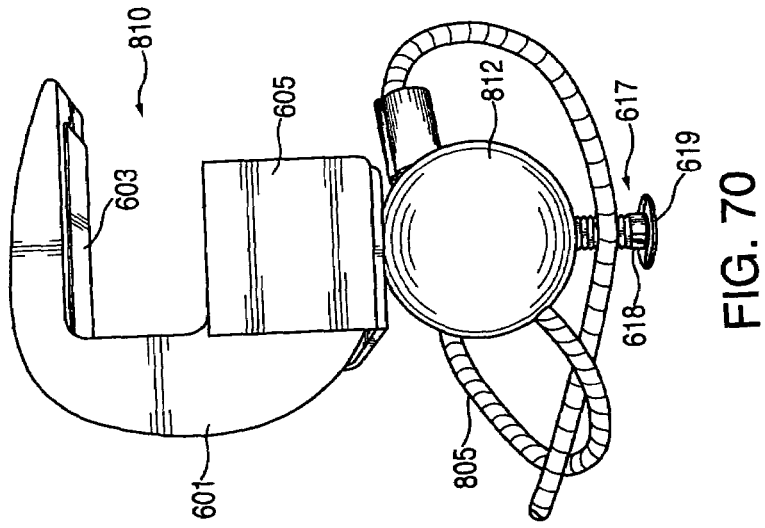
FIG. 70

LOCK FOR PORTABLE MUSIC PLAYER OR OTHER PERSONAL ELECTRONIC DEVICE

RELATED APPLICATIONS

This application is a continuation-in-part of application Ser. No. 11/359,871, filed Feb. 22, 2006, now U.S. Pat No. 7,324,333 and claims priority under 35 U.S.C. 120 therefrom, which application Ser. No. 11/359,871 claims benefit of provisional application Ser. No. 60/655,270 filed Feb. 22, 2005 and of provisional application No. 60/678,911 filed May 6, 2005, which application Ser. No. 11/359,871 is a continuation in part of application Ser. No. 11/038,591, filed Jan. 19, 2005 now U.S. Pat. No. 7,315,443 and claims priority under 35 U.S.C. 120 therefrom. Application Ser. No. 11/038,591 claims benefit under 35 U.S.C. 119(e) from provisional application No. 60/569,561 filed May 10, 2004 and from provisional application No. 60/626,839 filed Nov. 10, 2004. This application also claims benefit under 35 U.S.C. 119(e) from provisional application No. 60/691,476 filed Jun. 17, 2005, from provisional application No. 60/725,333 filed Oct. 11, 2005, from provisional application No. 60/757,737 filed Jan. 10, 2006, and from provisional application No. 60/783,188 filed Mar. 16, 2006.

FIELD OF THE INVENTION

The present invention relates to security locks for laptop and/or portable music players and other hand-held electronic devices, such as cell phones, personal digital assistants, personal music and/or video players (i.e. iPod®) and the like.

BACKGROUND OF THE INVENTION

Notebook computer or other personal electronic devices are increasingly used by students at educational institutions. They are also used by workers at job sites. Notebook computers are often referred to as laptop computers, meaning a portable, foldable computer which can be used while positioned upon the user's lap. In some instances, "laptop computer" refers to the term used in the trade for an older version of a larger portable computer. However, with increasing streamlining and downsizing of portable computers, compact, smaller versions are referred to as "notebook computers", but the terms are generally interchangeable.

In order to safeguard the personal electronic device, such as a notebook computer, it must be shut down, closed and transported by the user.

However, it is often advantageous for the user of a notebook computer to take a break and leave the computer open and operable at a work station or library study carrel, with other papers and books left at their current open position. This leaves the personal electronic device, such as a notebook computer vulnerable to theft.

Moreover, in the commercial retail environment, it is advantageous to display consumer electronic devices, such as notebook computers, cell phones or personal digital assistants in a secure but visually accessible display.

OBJECTS OF THE INVENTION

It is therefore an object of the present invention to provide a security lock for a personal electronic device, such as a notebook computer in an open position.

It is also an object of the present invention to provide a commercial retail display which allows visual access to notebook computers, cell phones and personal digital assistants while safeguarding these devices from shoplifting theft.

Other objects which become apparent from the following description of the present invention.

SUMMARY OF THE INVENTION

In keeping with these objects and others which may become apparent, the present invention is a desk surface locking base which holds a notebook and/or laptop computer, or a personal electronic device such as cell phones, personal digital assistants, personal music and/or video players (i.e. iPod® of Apple Corporation) in a secure but open position. When locked in place, the notebook computer or other personal electronic device is secure from being taken away from the surface to which it is locked. Furthermore, taking advantage of software and/or software/biometric security systems, the computer or other personal electronic device will also be unusable by unauthorized individuals when its owner is away from the area for a break, telephone call, or other short-term pursuits. With a few keystrokes, the owner of the computer or other personal electronic device can resume activity in exactly the same place as when activity had been suspended. This is especially useful for leaving an active computer or other personal electronic device on a study desk or library carrel.

In one embodiment, the notebook computer or other personal electronic device lock includes a locking base having a receptacle for receiving a distal end of a pivotable locking member pivotably attached at a proximal end thereof to the locking base. The locking member locks the computer screen between it and the locking base. The locking base is fastenable to a notebook computer work surface, such as a desk top or other table surface, in the vicinity of the notebook computer. A pin lock secures the locking bar across the display screen portion of the notebook computer or other personal electronic device and into a hole in the locking base, thereby securing the notebook computer or other personal electronic device in a locked position within the components of the notebook computer or other personal electronic device lock.

In another embodiment, the locking base is screwed or otherwise fastened to the work surface in a permanent fashion. A locking collar is then removed from the base and then placed over the liquid crystal display (LCD) screen of the open notebook computer or other personal electronic device within the framework of the locking base. A lock, such as a padlock, is then used to lock together the locking collar and the locking base, thereby making it impossible to remove the notebook computer or other personal electronic device from the work surface.

In this embodiment, the notebook computer or other personal electronic device locking assembly includes a locking base for being secured to a working surface, wherein the locking base has a rear wall to receive a keyboard portion of the notebook computer or other personal electronic device with a screen portion of the notebook computer or other personal electronic device in the open position resting parallel to the rear wall. The rear wall has a rearwardly extending locking flange along a top edge of the rear wall. A locking frame includes a second rear wall having side walls and a locking bar joining the side walls, wherein the locking frame is adapted to slide over the screen portion of the notebook computer or other personal electronic device in the open position, with the second rear wall between the screen portion and the first rear wall and the locking bar extends across a front surface of the screen portion.

This second rear wall has a rearwardly extending locking flange along a top edge of the second rear wall on top of, and flush against, the locking flange of the first rear wall. The side walls of the locking base have tabs bent toward the computer or other personal electronic device, with the locking bar falling behind the bent tabs, when the locking frame is deployed on the notebook computer or other personal electronic device, thereby preventing removal of the notebook computer or other personal electronic device from the locking base. Additionally, locking holes in both flanges are aligned with each other to receive a padlock to lock the locking frame to the locking base.

Fasteners are employed to attach the locking base to the working surface, so that the fasteners are kept under the keyboard portion of the computer or other personal electronic device.

The lower edges of the rear walls are raised a sufficient distance to allow access to connectors on a rear surface of the keyboard portion of the computer or other personal electronic device.

Preferably, an optional cage is attached to a rear of the first rear wall to house an auxiliary battery, charger or battery eliminator.

In an alternate embodiment, an elongated framework of the locking base is used that supports the LCD screen of the notebook computer at the proper viewing angle, just as in the preferred embodiment. In this case, however, the locking device is a transparent screen cover, such as of LEXAN® polycarbonate, which is placed over the screen and then locked to the locking base with a lock, such as a padlock. This panel is also a screen protector. This is a desirable feature for a demo station at a retail outlet, to display and demonstrate a notebook computer or advertise another product. Using an auxiliary locking flange, this embodiment is also compatible with the locking collar of the preferred embodiment. This use mode does not obscure viewing of the LCD screen directly, when viewing the display screen through the transparent polycarbonate sheet. Similar smaller locking bases with polycarbonate or other strong locking panels can be used to display and demonstrate consumer devices, such as personal digital assistants (PDA's), scientific calculators, and cell phones, on store shelves.

This embodiment may also have an optional accessory cage made of heavy wire mesh or perforated metal, which can be attached to the back portion of the locking base. This securely contains a battery charger/eliminator for the notebook computer.

In this embodiment with a transparent screen cover, the notebook computer or other personal electronic device locking assembly includes a locking base secured to a working surface, with the locking base having a pair of side walls and a rear wall to receive a keyboard portion of the notebook computer or other personal electronic device, wherein a screen portion of the notebook computer or other personal electronic device is oriented in the open position, resting adjacent to the rear wall. This rear wall has a rearwardly extending locking flange along a top edge thereof.

The transparent locking frame has a surface adapted to rest adjacent to, or against, a front surface of the screen. A top wall is adapted to rest against a top surface of the screen portion of the computer or other personal electronic device, with a rear wall extending down from the top wall, adjacent to a rear surface of the screen portion of the notebook computer or other personal electronic device. A rearwardly extends flange from a bottom edge of the rear wall, with the rearwardly extending flange positioned adjacent to the rearwardly extending locking flange of the locking base.

In this embodiment, locking holes in both flanges are aligned with each other to receive a padlock, to lock the transparent locking frame to the locking base.

In this embodiment, an optional shelf or shelves may be provided to display handheld electronic accessories, such as cell phones, PDA's, calculators, video game controls, etc., for retail viewing purposes through the transparent screen cover.

In yet another embodiment, the pivoting locking rod, locking collar or transparent polycarbonate locking panel is replaced by a telescoping rod, a vinyl covered steel cable, or a flexible tubing covered chain. Like the pivoting rod version, this embodiment therefore eliminates the removable portion of the locking base system (such as the locking collar or transparent polycarbonate panel), and instead uses a locking device that is permanently attached to one side of the locking base itself. This locking device is also locked with a padlock by first passing the distal end of the locking member through a hole in the opposite side panel member of the locking base thereby preventing removal of the notebook computer or other personal electronic device.

In this embodiment, the notebook computer or other personal electronic device locking assembly includes a locking base secured to a working surface, with the locking base having a pair of side walls and a rear wall to receive a keyboard portion of the notebook computer or other personal electronic device. A screen portion of the notebook computer or other personal electronic device is held in the open position, resting against and/or parallel to the rear wall, with the side walls extending past a front surface of the screen portion. A telescoping locking bar or flexible locking cable is hinged at one end to one of the side walls, in front of the screen portion. An opposite end of this telescopic or flexible locking bar or cable has a plug with an opening therethrough. An opening in the other of the side walls is configured to align with the opening in the plug, when the locking bar is rotated across a front surface of the screen portion, with the plug positioned adjacent the other of the side walls to accommodate a padlock, to lock the notebook computer or other personal electronic device into the locking base.

In a further embodiment the computer lock or electronic device lock is attached to a horizontal desk or work surface via a locking base which is separate from the computer lock itself. The computer lock is then slipped into the locking base from the side and both the computer and locking base are then secured to the work surface. In this manner, no holes are drilled into the work surface, and the locking base is removable yet secure. The locking base is secured to the work surface by a clamp which goes over the front edge and engages the bottom surface via a screw with a pointed end which is tightened so as to indent the underside and thereby attach. The screw itself can have a security head such as an allen socket with a concentric protruding rod which prevents the use of a simple allen wrench. A specialty security allen wrench with a hole to accommodate the protruding rod is required for the initial attachment as well as subsequent removal. A side bracket attached to the clamp also accommodates a mailbox type key lock which can be used to deny access to the attachment screw head for an extra measure of security. If the key lock is used, an ordinary non-security screw can be used since the lock tang itself will adequately secure the screw. The computer lock used with this embodiment has a horizontal frame member with two vertical side brackets at each end attached to base plates which can be screwed to a work surface as in the previous embodiments or used with the locking base.

A bar which is captively attached to one bracket secures the bottom of the notebook computer display when the other end is passed through a hole in the distal bracket and a key lock is then slipped over the bar end which has a groove compatible with the lock.

In an alternate embodiment wherein a clamp wraps around a work surface to lock the notebook computer or other personal electronic device in place, the clamp itself may be the locking base itself, connected to the personal electronic device by a cable or other locking connection.

In another embodiment, the above noted computer lock or electronic device lock is attached to directly to a horizontal desk or work surface by fasteners.

Yet another embodiment of a computer lock, the lock has a continuously width adjustable feature to accommodate computers with a variety of display width sizes. It includes a left portion with vertical bracket, base attachment plate, horizontal member, and captive lock bar. A right portion has a vertical bracket, base plate and hollow horizontal member sized to receive the left horizontal member in a telescoping fashion. The locking bar is fabricated of a left portion which is a threaded tubing member having coarse threads. The right portion of the locking bar is a solid member with mating external threads on its long end. This computer lock is used with the locking base of the previous embodiment to take advantage of its telescoping feature. It can also be screwed down to a work surface directly, but the adjustable feature would be defeated unless screws are moved to other adjustment holes.

To use the computer lock, the user places a notebook computer within the side brackets, and then pushes the sides in adjacent to the computer display. Then the user screws the distal end of the locking bar in or out to facilitate the end fitting through the lock holes on the right bracket. When locked with a key lock, the bar will secure the computer and prevent the spreading of the side brackets.

In a related embodiment, the width adjustable feature is discrete instead of continuous. Although any suitable width adjustment mechanism can be used, a suggested type uses a peg which fits into a hole in the larger of the two telescoping members. The inner telescoping member has a series of holes which define the width steps when in registration with the single hole of the larger/outer telescoping member. The peg locks the outer hole to one of the inner holes.

In another embodiment, the locking base described above is integrated with a computer lock or electronic device lock in a single unit. Thus the computer or other personal electronic device lock is now directly attached to the work surface via a clamp that goes over an edge of a work table and locks into the bottom surface of the work table.

In yet a related embodiment, the integrated locking base/ computer or other personal electronic device lock has two pivots from the clamp end to the computer or other personal electronic device lock so that much positional freedom is afforded the locked computer or other personal electronic device over the work surface. For example, this pivoting embodiment can be used on corners of work tables.

In a preferred embodiment for consumer use, a low profile locking base with a narrow footprint is used. Due to its smaller dimensions, less material is required. Since it can be stamped and formed from a single rectangular sheet with little waste, the process for manufacture is very efficient. Heavy gage aluminum sheet or stainless steel sheet can be used. It is therefore lighter and more economical.

In one application this locking base is permanently screwed down to the work surface, and the user would have his or her own pin lock, to secure the locking bar across the display portion and into the base back, thereby securing the notebook computer or other personal electronic device.

However, the preferred mode of use for this embodiment is to combine the locking base with a cable and clamp as a portable kit which fits into a convenient tubular carrying case. The clamp is attached to the work surface or to a table leg or any convenient non-movable structure in the vicinity.

This clamping of the clamp to a work surface is accomplished by tightening a clamp screw against the work surface, such as a table top or desk top. The clamp screw extends from a clearance hole in a container, such as a short tube, with a large axial hole at the distal end that accommodates the screw head. An appropriate tool compatible with the type of screw head used is entered from the distal hole to tighten or loosen the clamp while also capturing the short tube; this can be an allen wrench, a screwdriver, or a hex head driver as appropriate.

The cable has a small end ferrule with a transverse hole on one end and a ferrule with a larger end attached to the distal end of the cable. A transverse hole in the lower portion of the short tube accepts the ferrule and cable, but is sized to prevent access to the larger end of the distal ferrule.

In use, the clamp is attached to the structure, such as a desk top, as described; then the cable is threaded through the transverse hole in the short tube. The end of locking bar is passed through the cable ferrule with the transverse hole prior to locking it to the locking base. In this manner, although the computer or other personal electronic device can be moved around on the work surface, it is secured by the cable.

It is noted that the cable being threaded through the transverse hole in the container, such as the short tube, denies access to the clamp screw head. The cable must be removed before the clamp can be loosened from underneath of the desk top or other work surface.

In an alternate embodiment of the clamp screw subassembly of this preferred embodiment, no tool is required to tighten or loosen the clamp. For example, a hollow knob with a captive locking member, such as a clamp screw, emerging from a clearance hole in an end cap, is used.

The clamp screw has a tall head and can be a hex, square or other geometric configuration. A recess with a configuration matching the screw head is formed into the inside surface of the end cap such that a slight pull on the knob against the captive screw head (i.e.—away from the clamp) will seat the head into the recess with a slight turn. Thus the end cap is a socket wrench used to either tighten or loosen the clamp.

A strategically placed offset transverse hole is prevented from accepting the cable by the screw head if the screw head is seated in the wrench recess.

By pushing up on the end of the knob (toward the clamp), clearance for the cable to enter through the transverse hole adjacent to the screw and between the head and end cap is formed. Thus, the screw head is spaced apart from the end cap socket wrench recess as long as the cable is present. If the knob is turned while the cable is installed, it will just turn freely with no ability to loosen the clamp even if force away from the clamp is used. The cable must be removed before the clamp can be loosened.

In a further embodiment of this invention, a notebook computer or other personal electronic device is provided with a security hole through the hinge area between the display and the base, through the edge of the display, or diagonally through a corner of the base. A protruding spike or rod, with a head on one end and a transverse hole near the distal end, is used to secure the computer or other personal electronic device. The spike or rod is inserted through the security hole, and a ferrule on the end of a secure cable is then inserted through the transverse hole of the spike or rod, and is locked by a pin lock compatible with the groove feature at its distal end.

In a variation of this embodiment, the spike or rod is replaced by a captive security rod with a transverse hole. In one design, this security rod is stored in a one end of the hinge in a direction co-linear with the hinge.

In an alternate design, the security rod can rise vertically from the computer base or base of the personal electronic device. A small knob is attached to grasp the rod which may be stored in the recess by a quarter-turn feature or by a magnetic force.

An alternate type of spike locking feature does not depend on the use of a secure cable; a longer separate spike is used. It is designed to penetrate through a hole in a convenient location in the computer base or personal electronic device base from the top, through the base thickness, and further through a pre-drilled hole in the table or desk top. This long spike has a transverse hole which emerges beneath the table top. A pin with a groove near its distal end is then inserted through the transverse hole of the long spike and locked by a pin lock.

In a further alternate embodiment, the protruding rod may take the form of a thin rigid or flexible strip. The strip may be inserted within a thin, longitudinally extending hole, such as a slot, within the body of the personal electronic device, such as a notebook computer.

On the other hand, if the notebook computer has a hinge between the display screen and the main body of the personal electronic device, such as in a hinged notebook computer, cellphone or personal digital assistant (PDA), then, if the strip is flexible, it can be inserted within the hinge gap between the display screen and main body of the device, such as a keyboard portion of a notebook computer.

The thin, flexible or rigid long rectangular strip includes a wedge stop at a proximal end and a distal end being thin enough to weave within the slot of a personal electronic device, or through the hinge gap of a hinged instrument such as the gap between display and keyboard of a notebook computer. If the rectangular strip is flexible, preferably, the thickness of this strip is between 0.004 inches and 0.064 inches. The composition of the flexible strip is flexible reinforced plastic or metal such as heat treated steel shim stock. Springy stainless steel shim type stock is also a useful material as well a variety of other steel alloys.

After the distal end of the locking strip is passed through the slot in the personal electronic device, or alternatively through the hinge gap in the device being secured, it is clamped by a strip-holding locking clamp, which itself is attached to the work surface, or is otherwise secured to it as by a secure cable. The strip-holding clamp may have locking jaws with serrations which aggressively grip the distal end of the locking strip when a key lock is closed by a matching key. The lock is similar to a mailbox lock with a tang that engages a lock recess in the lower base section of the locking clamp thereby overcoming a spring force which keeps the jaws apart slightly when not locked. The key is also used to unlock the two mating jaws to release the locking strip and thereby unsecure the device. In a library environment, both the key for a particular clamp as well as a locking strip can be borrowed from a librarian to secure the device in a locked state.

In an alternate embodiment of the locking clamp, the distal end of the locking strip is inserted in the clamp end through a slot formed by two upright members and a robust leaf spring attached to a pivoted handle. The handle is pressed down toward its distal end (thereby offering much mechanical advantage for the operation) bending the leaf spring thereby clamping the distal end of the locking strip in a slight recess with transverse serrations in the clamp base. The shackle of an ordinary key or combination padlock is then passed through loops attached to the clamp base as well as a loop at the distal end of the handle (in registration) and locked. By locking the handle in a down position, the device is kept secure by frictional forces opposing pull-out arising from the normal spring force. In this manner, any person with an appropriate padlock and a locking strip can lock his own device to a work surface using any available clamp. The need to receive from and return to a librarian a specific key is eliminated.

In an alternate embodiment of the locking strip itself, whether it be flexible or rigid, a large hole is provided near the distal (free) end of the strip. This permits a variety of methods of locking the strip to the work surface in lieu of a clamp. In one method, a round stud with a transverse hole near its distal end is attached to the work surface in a perpendicular orientation (sticking up). The locking strip is inserted through the hinge gap in the device to be locked and then the hole in the locking strip is passed over the stud; the shackle of an ordinary key or combination padlock is then passed through the transverse hole in the stud thereby locking the strip to the work surface. In a second method, a secure cable with a stud at its end is provided. The cable stud is passed through the hole in the locking strip, and then a cable lock that fits the stud is locked onto it thereby locking the strip to the secure cable. In a third method, a free cable with a stop member permanently attached at one end is passed through the hole in the locking strip. The cable is then looped or otherwise secured to (or adjacent to) the work surface.

In another embodiment of this invention, a locking device specifically for an iPod® or similar music and/or video playback devices is introduced. While iPod®'s are small slim devices designed for carrying in a shirt pocket, there are some situations for which a locking device is prescribed. The lack of security in a typical dormitory room can be counteracted by locking an iPod® to a desk top at night or when away. Other areas such as school labs might be another venue where such a device might be used. This embodiment consists of a sturdy metal frame which encircles the iPod®, a clamp which can be attached to a desk or table top, and a rod which secures the frame to the clamp with the aid of a pin lock. The clamp has a groove in the upright section of its frame which receives a tab from the bottom end of the iPod® frame. With the tab in the clamp groove and the rod inserted through holes in extensions on the sides of the iPod® frame and also through an offset hole in the clamp locking knob, the iPod® is secured and the clamp knob cannot be turned to loosen the clamp.

In the preferred embodiment of the iPod® locking device, a frame with five sides is used to house and secure the iPod® with open areas as required to not impede its use. The iPod® is slid into the open edge slot and secured by bridging the two holes in registration with each other which extend from the top and bottom surfaces of the open edge. A ferrule at the distal end of a secure cable is engaged by the same padlock hasp which engages the two holes. Alternatively, the padlock can engage the holes thereby securing the iPod® within and also engage a metal ring attached to a backpack, or it can engage a belt loop or other attachment to clothing, luggage, or purse; for these methods, no cable or cable clamp is required.

A further alternative embodiment of the iPod® security device includes a frame with two right angle portions hinged together such that they can be closed with the distal ends meeting thereby forming a rectangular frame. The frame members have bent-over tabs which would capture an iPod® securely when closed. The closed position also puts two loops in registration at the distal ends, one on each swinging portion. These loops can be used to lock the two swinging portions together capturing the iPod® and connecting it to either a secure cable or to a backpack or article of clothing as in the preferred embodiment.

Four further alternative embodiments of locking devices for music and/or video playback devices, such as the various models of iPod®, are also included in this invention. Although all three can be used with a secure cable as in the previous embodiments, they are optimized for attachment to belt loops since they orient the playback device with the screen upside down while dangling to facilitate easy reading when lifted ninety degrees while still attached.

The first of these embodiments includes a frame with an open side along the long edge to permit the playback device to be inserted. The playback device is secured within the frame by engaging the hasp of a padlock within a hole on a side extension of the top edge of the frame; the hasp becomes an interference preventing the withdrawal of the music/video device from the frame.

The next alternative embodiment has a band loop near the top of the frame sized to permit the music/video playback device to be inserted through it to the distal hook in the frame which engages the front of the device near the center of the screen's top edge. Thus the insertion opening is as wide as the shorter dimension of the playback device. The top band loop has a short central extension on the front side with a hole to accept the hasp of a padlock. The hasp then becomes an interference preventing the withdrawal of the device from the frame thereby securing it to a belt loop or ring which is also engaged with the padlock hasp.

The third of the four alternative embodiments is extremely compact. It is sized to capture the music/video playback device at two diagonal corners. This locking device is a flat bar which is positioned in contact with the back side going diagonally from top to bottom. The distal end of the bar has a four-sided small rectangular recess or pocket which engages the playback device at a corner of the screen with a small portion over the screen frame. The proximal end of the diagonal bar has a small three-sided rectangular recess or pocket which permits the opposite bottom corner of the playback device to nestle within the recess with the bar against the back side. The sides of this proximal recess are higher than the thickness of the playback device and have two orthogonal holes placed just above the device thickness. The music/video playback device is secured within the diagonal bar when the hasp of a padlock is passed through the two orthogonal holes thereby creating an interference preventing the bottom corner of the music/video device from being lifted up away from the diagonal bar.

In a fourth embodiment, a sleeve frame is provided for slidably securing a personal electronic entertainment device within, wherein a frame plate forms a base from which short walls extend in perpendicular arrangement, and a hasp tab is provided for engaging a hasp to prevent removal of the music player from the frame.

A security cable for attachment to laptop or notebook computers has been on the market for some time. It is a plastic clad steel cable with a loop formed at one end and a special lock at the other end. The lock (whether key type or combination) has a locking feature at its distal end which is designed to fit into a mating recess in the computer; when locked in place, the cable is attached to the computer device. The cable is designed to be secured to a handrail, pipe, or any other convenient anchoring feature; the lock end is passed through the loop end engaging the anchoring feature prior to locking into the computer recess. Unfortunately, many work areas do not have such secure attachments in the vicinity. Such a cable is usually then just looped around a table or chair leg thereby compromising security, unless it is permanently secured for single location use.

In a further embodiment of this invention, a cable clamp that can accommodate the prior art security cables with a formed loop at one end converts the cable to secure portable use even in the absence of a secure anchoring attachment in the vicinity. This cable clamp is similar to the cable clamp described earlier which uses a transverse hole in an operating knob, which prevents loosening once a cable is installed through the transverse hole. A modification to accommodate the insertion of the looped end of the security cable part way, through a transverse slot in the operating knob, permits this desktop or tabletop secure cable clamp to be used with such a cable having a permanently attached lock at the other end.

A further embodiment of the secure cable clamp permits adjustment of the grip range of the clamp beyond that which is accommodated by the tightening screw. This is important for the use of portable devices in many venues where the thickness of table or desktop cannot be anticipated. The clamp frame is redesigned as an upper part and a separate lower part attached via a body screw which is rigidly attached to the top part, but permitted to swivel in a threaded hole thereby adjusting the grip range by rotating the lower part relative to the upper part.

BRIEF DESCRIPTION OF THE DRAWINGS

The present invention can best be understood in connection with the accompanying drawings. It is noted that the invention is not limited to the precise embodiments shown in drawings, in which:

FIG. 2 is a side view of the embodiment of FIG. 1, taken along in the direction of arrow "2" of FIG. 1, showing a typical notebook computer locked with a locking base and locking collar to a work surface with a padlock;

FIG. 2A is a partial fragmentary view of the locking base as in FIG. 2, taken along in the direction of arrow "2A" of FIG. 2;

FIG. 2B is a partial perspective view of the typical notebook computer locked in place between the locking base and locking collar of FIG. 2;

FIG. 2C is a partial front elevational view of the locking base and locking collar as in FIG. 2;

FIG. 3 is a perspective view of an alternate embodiment showing a typical notebook computer in the locking base with an elongated back side;

FIG. 13 is a perspective view of an alternate embodiment of a notebook computer lock using a separate "over the table" locking base and a computer lock using a captive swinging locking bar, which fits across lower portion of the display;

FIG. 13A is a front elevation of a clamp detail of the locking base shown in FIG. 13, taken along the ellipse 13A of FIG. 13;

FIG. 13B is a clamp bracket side elevational view thereof, showing use of a key lock;

FIG. 14 is a side edge view of the locking base of FIG. 13, shown attached to a work surface;

FIG. 22 is a detail side view of the clamp screw subassembly used in FIG. 21, shown in the ellipse "22" of FIG. 21;

FIG. 23 is an exploded perspective view of the components of an alternate embodiment with a socket wrench type clamp screw subassembly;

FIG. 24 is a bottom view of the end cap of the embodiment of FIG. 23, showing the recess which forms the socket wrench element;

FIG. 25 is a top view of the clamp screw assembly as in FIG. 23, shown with the captive screw;

FIG. 26 is a side view crossection of the clamp screw assembly as in FIG. 23, taken along line "26-26" of FIG. 25, shown with the screw head seated in the socket wrench recess and preventing insertion of the cable;

FIG. 27 is a side view in crossection of the clamp screw assembly as in FIG. 23, shown with the cable preventing seating of the screw head in the socket wrench recess.

FIG. 28 is a perspective view showing the possible locations of through-holes for use of an alternate protrusion spike embodiment security feature used with a cable;

FIG. 29 is a perspective view of the spike with a cable attached ferrule, pin lock, and secure cable clamp used to secure a notebook computer;

FIG. 36 is a perspective view of a lower protective shoe of the flexible lock;

FIG. 37 is a diagrammatic perspective view illustrating a flexible locking means;

FIG. 38 is a diagrammatic exploded view of a key locking means with a spring;

FIG. 39 is a partial view of a key locking means;

FIG. 40 is a perspective view of a notebook computer showing the hinge gap and the path of weaving the distal end of a locking strip through the hinge gap, as well a slot in the housing of the notebook computer permitting access to a rigid protruding locking strip therein;

FIG. 41 is a perspective view of a "flip top" cellular phone showing the hinge gap;

FIG. 42 is a perspective view of a PDA showing the hinge gap;

FIG. 43 is a perspective view of a personal DVD player showing the hinge gap;

FIG. 65 is a front elevation of the locking frame of FIG. 64 with playback device secured within and dangling from a belt loop;

FIG. 66 is a perspective view of a locking diagonal bar which is a further alternate embodiment of locking device for music/video playback players;

FIG. 70 is a perspective view of the clamp of FIG. 69 engaged with the cable of FIG. 68;

FIG. 71 is a perspective view of yet another alternate embodiment of cable clamp incorporating a grip range adjusting feature;

FIG. 72 is a perspective view of a further alternate embodiment for a frame for locking a music/video playback device; and, FIG. 73 perspective view of the further alternate embodiment as in FIG. 72 for a music/video playback device, shown being inserted into the frame.

DETAILED DESCRIPTION OF THE INVENTION

Figure 1:
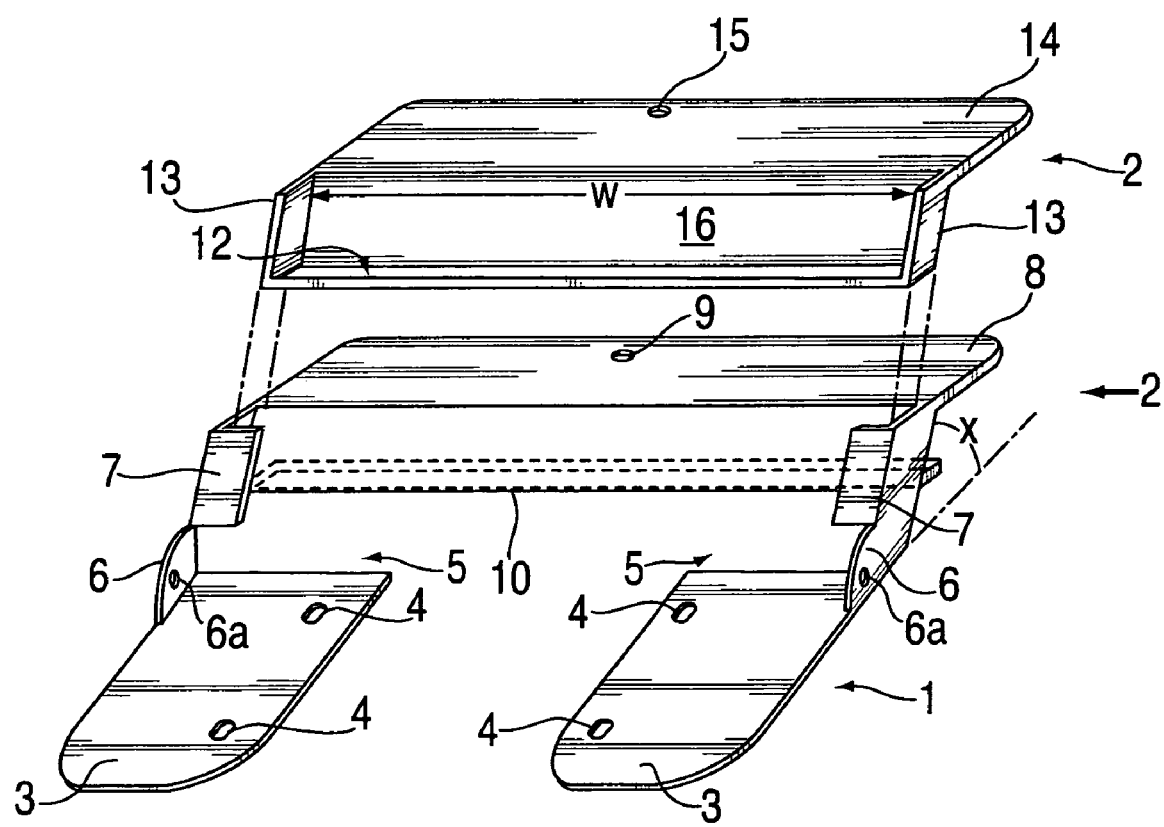
FIG. 1 is a perspective view of a locking base and locking collar of one of the embodiments for a notebook computer lock of this invention.

FIG. 1 shows locking base 1 for a notebook computer lock, which is secured to a working surface by fastener holes, such as screw through holes 4 in base mounting pads 3. A back surface 10 is tilted at angle "X" to provide a good viewing angle of the computer screen. Side panel members 6 with bent tabs 7 provide a space for sliding locking collar 2. Locking flange 8 with a locking hole, such as padlock hole 9, is used to secure locking collar 2 with flange 14 via hole 15, which is in positional registration with hole 9 when mated. Width "W" is wider than the widest notebook computer or other personal electronic device to be accommodated by this locking base system. Locking bar 12, attached to the distal ends of sides 13, actually secures the notebook computer or other personal electronic device. This is the preferred embodiment. The display screen portion rests within space 16 between sides 13. In use, the keyboard portion of a notebook computer or other personal electronic device would deny access to the fasteners, such as retaining screws, in holes 4.

Side panel members 6 may have one or more ports 6a to accommodate computer cables therethrough.

FIGS. 2, 2A, 2B and 2C show how locking collar 2 is placed over notebook computer screen 19 and then upon flange 14, and is locked to lower flange 8 via a lock, such as padlock 20. Keyboard 18 fits between sides 6. Space 5 is created by a raised back panel 10 so as to permit access to a variety of connectors at the back of computer keyboard portion 18. FIG. 2 also shows an optional compartment 42 for a power source accessory 43, such as an auxiliary battery charger or battery eliminator, wherein compartment 42 extends between power flange 8 and further lower flange 8A.

Figure 2D:
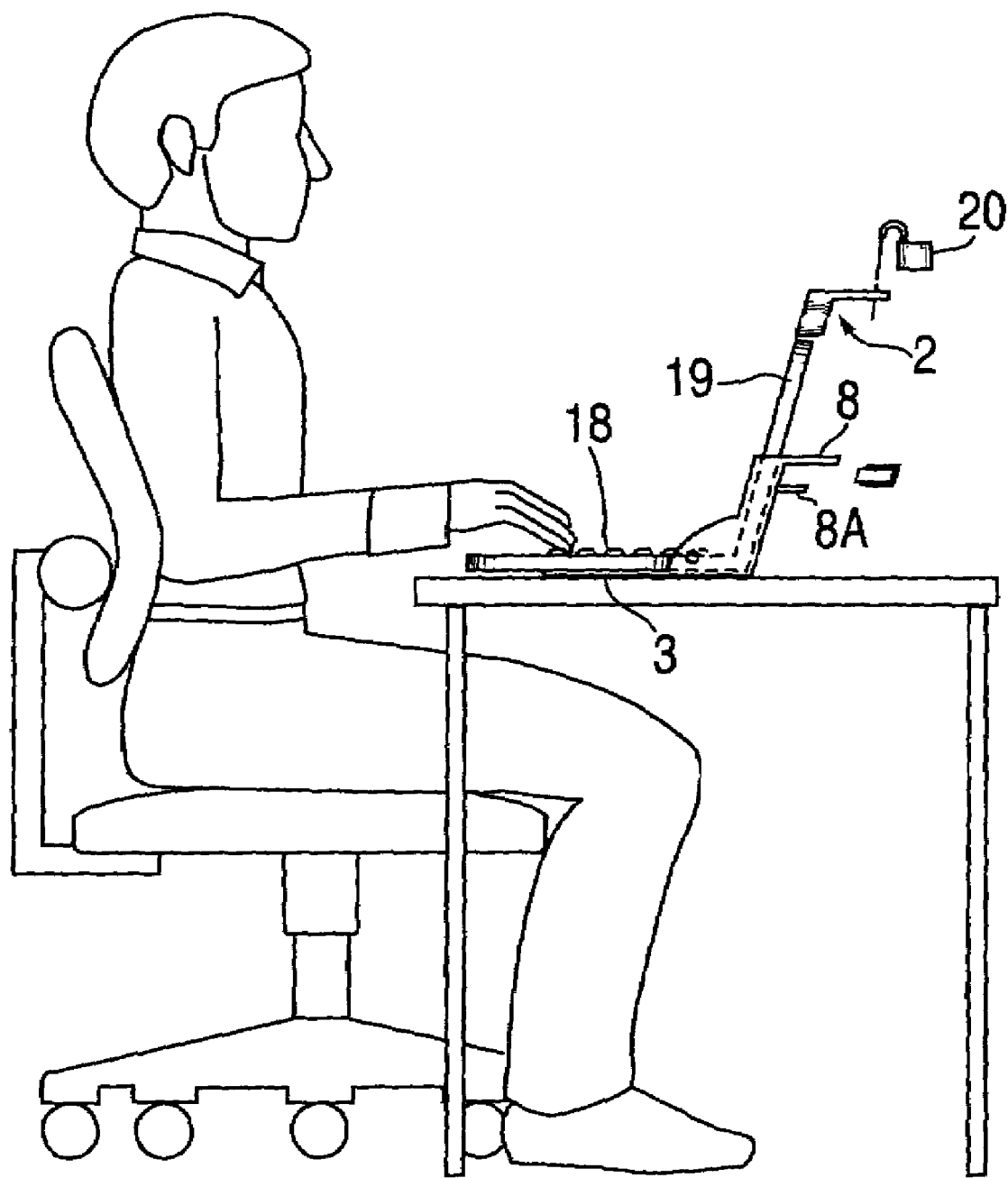
FIG. 2D is a side elevational view of the notebook computer shown used by a person at a work station.
Figure 3A:
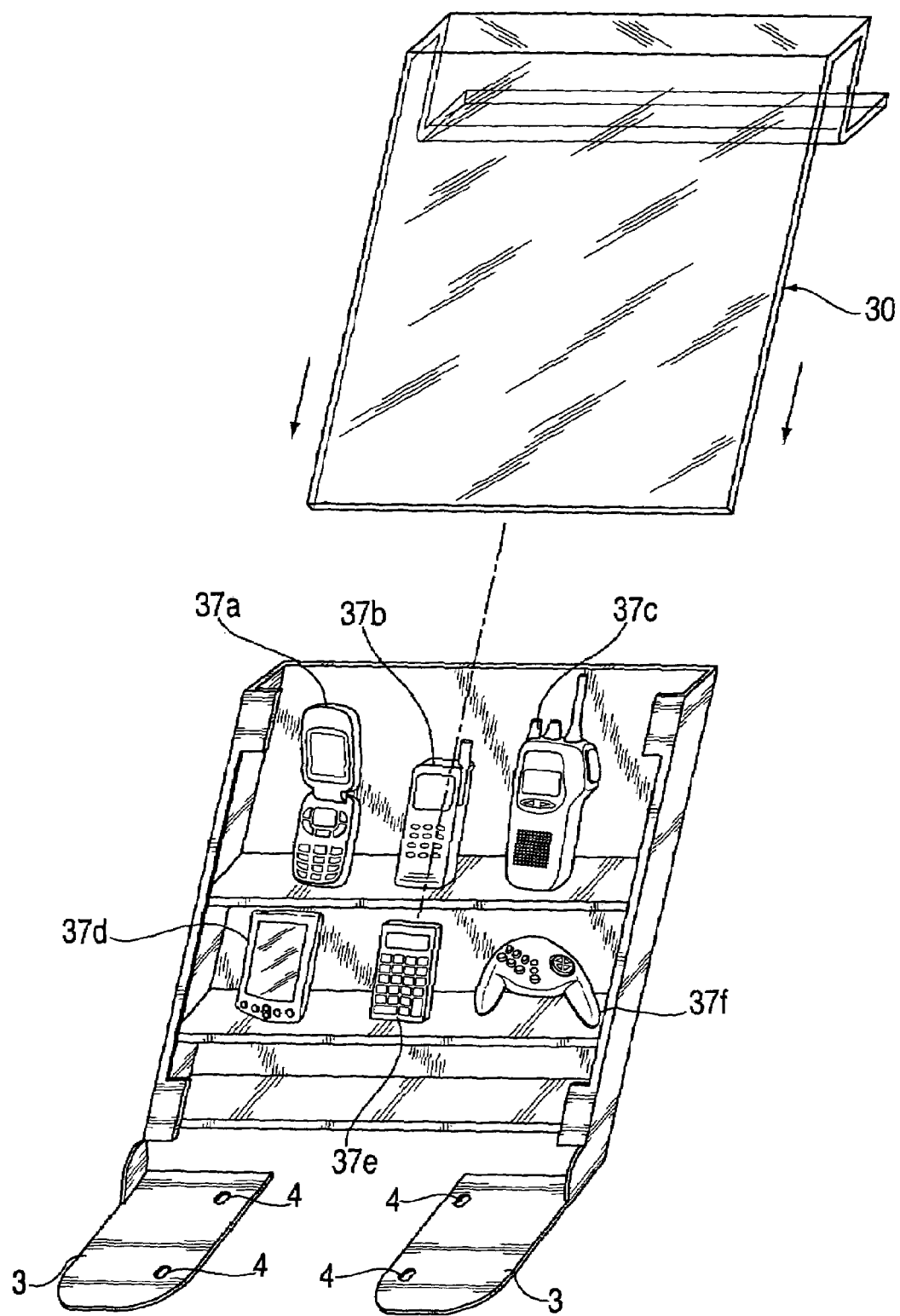
FIG. 3A is an exploded perspective view of a further embodiment, showing handheld electronic accessories displayed upon respective shelves, added to the front side of the locking base of FIG. 3.
Figure 3B:
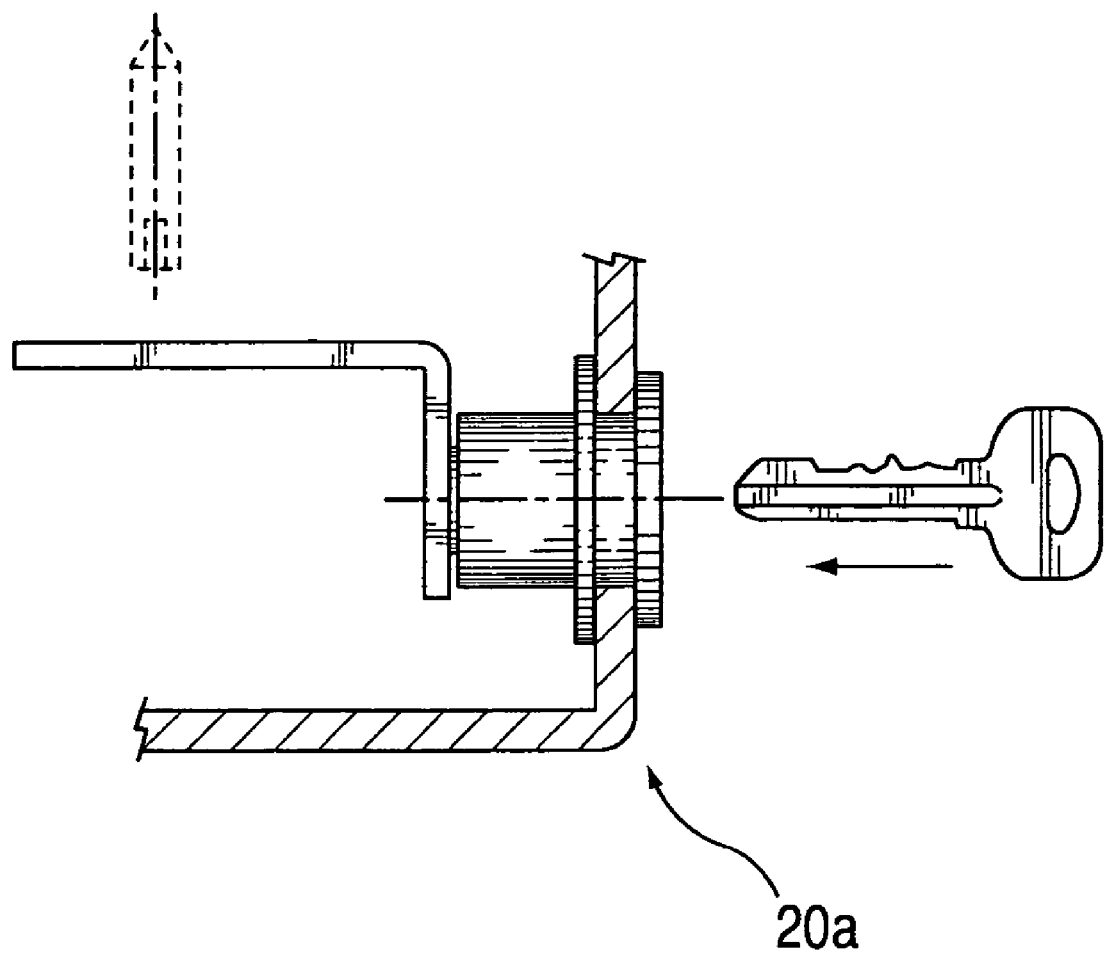
FIG. 3B is a close-up of one type of key lock used with the notebook computer lock of the present invention.
Figure 4:
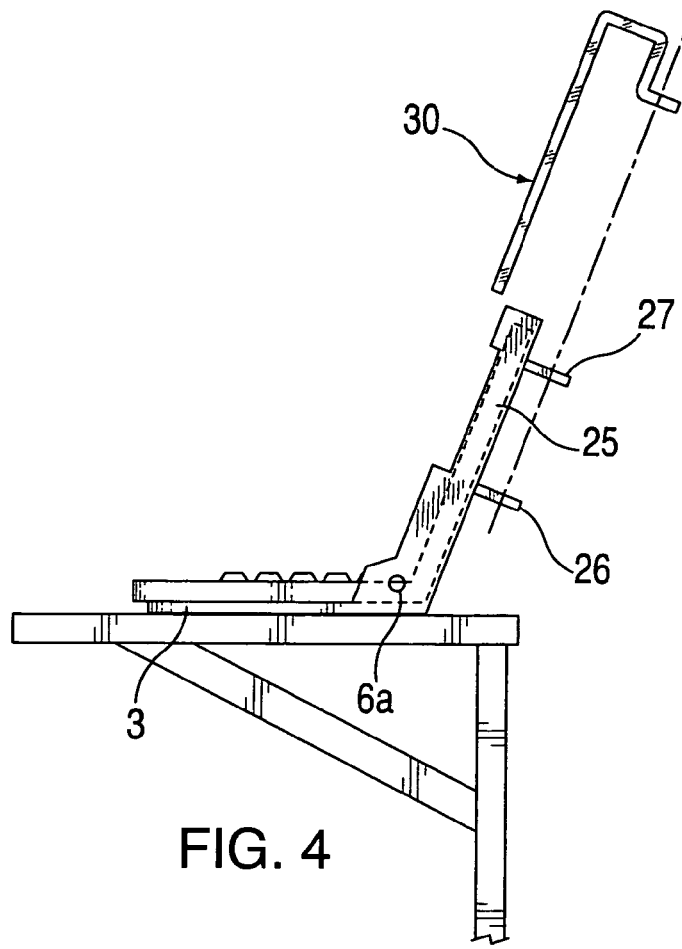
FIG. 4 is a side view of alternate embodiment for a notebook computer lock of FIG. 3, showing dual locking flanges.
Figure 6:
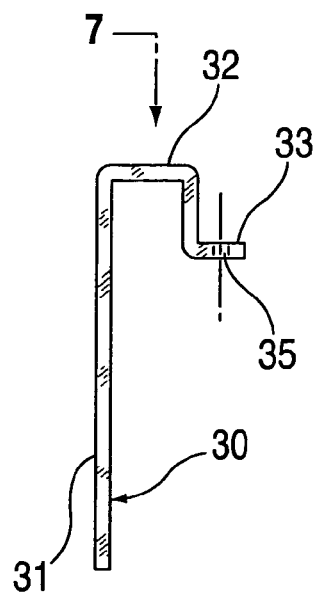
FIG. 6 is a side edge view of the transparent locking panel showing a locking flange, taken along in the direction of arrow "6" of FIG. 5.

FIG. 2D shows the notebook computer being used by a person at a work station;

In an alternate embodiment shown in FIG. 3, upright portion 25 supports the entire height of screen 19 above raised back panel 10 mounted upon base pads 3. This can also be shown in FIG. 4. FIG. 3B shows another example of a lock 20a, which can be used in lieu of padlock 20.

FIG. 3A shows a further alternate embodiment where shelves 36 and 36a are depicted supporting electronic handheld devices such as folding cell phone 37a, upright cell phone 37b, marine VHF radio 37c, personal digital assistant 37d, calculator 37e and video game pad controller 37f.

Figure 5:
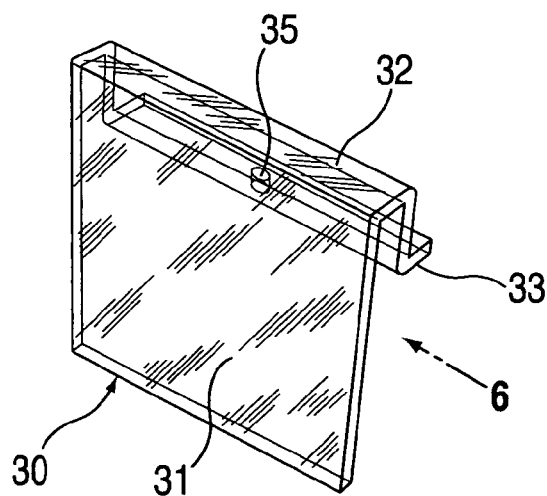
FIG. 5 is a perspective view of a transparent locking panel of the alternate embodiment shown in FIG. 4.
Figure 7:
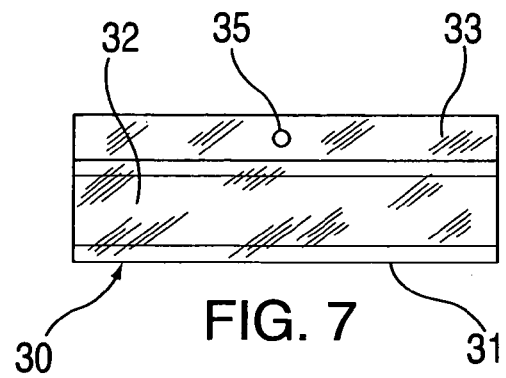
FIG. 7 is a top plan view of the transparent locking panel showing a padlock hole in the locking flange, taken along in the direction of arrow "7" of FIG. 6.

A transparent panel, such as LEXAN® polycarbonate panel 30, shown in FIG. 5, is used as a locking frame, by sliding it over screen 19 within the four tabs shown in FIG. 3 at the distal corners of upright 25.

Panel 30, shown in FIGS. 4-7, has a top portion 32 and a locking flange 33 with padlock hole 35. In use, this hole is in positional registration with that of upper locking flange 27 shown in FIG. 4. A padlock 20 or other small lock 20a can be used to secure the two members together. Front face 31 of transparent panel 30 protects the surface of computer screen 19. This can be used to advantage in a retail demo environment. Alternately, the locking collar of FIG. 1 can be used with base of FIG. 3 by locking into lower locking tab 26; this would offer a better unencumbered view of screen 19.

Figure 8:
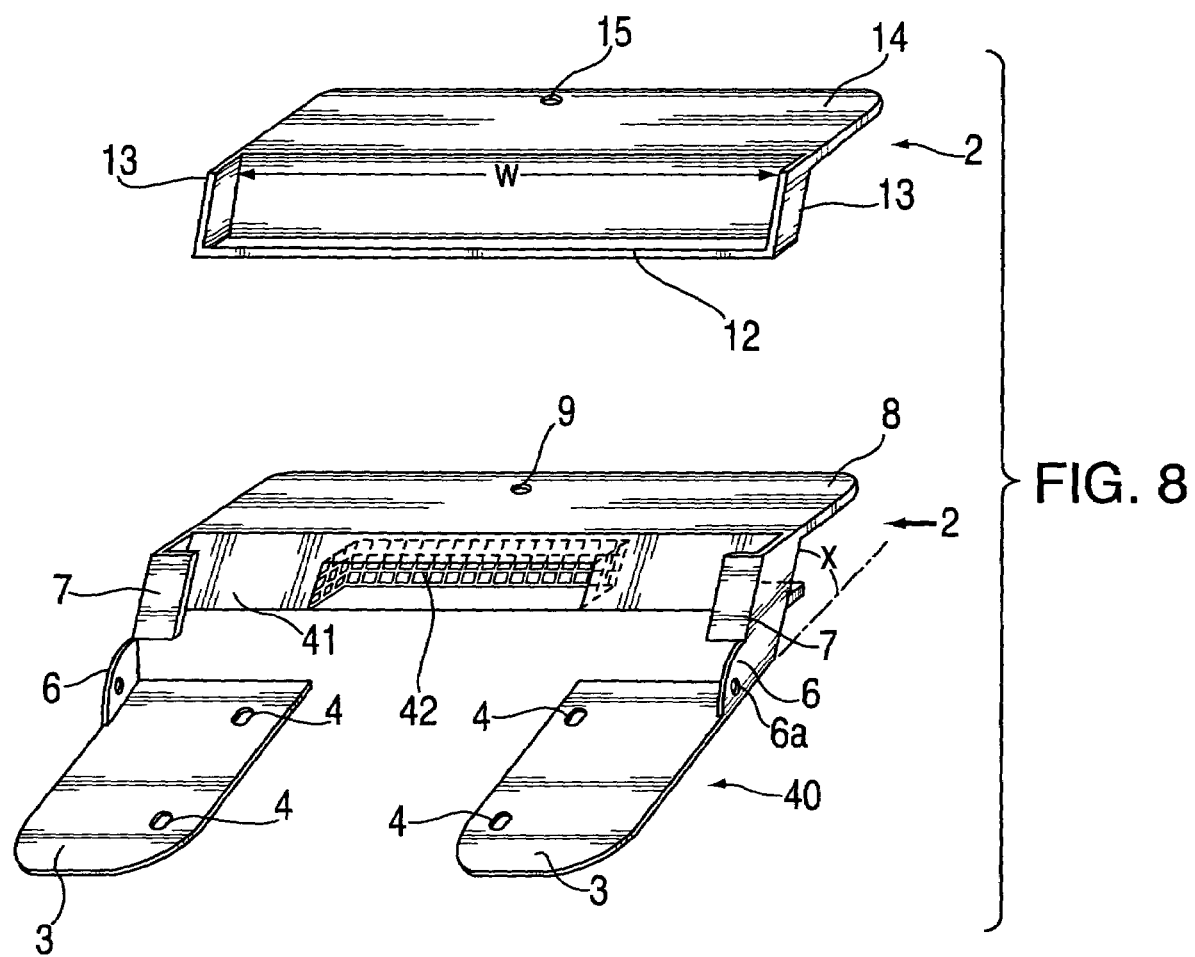
FIG. 8 is an exploded perspective view showing the addition of an optional battery pack housing cage feature to the locking apparatus of the embodiment shown in FIG. 1, although it can be used with any of the embodiments herein.

FIG. 8 shows the addition of an optional battery pack housing cage 42 feature to the locking apparatus of the embodiment shown in FIG. 1, although it can be used with any of the embodiments herein;

The optional power source component 42 of FIGS. 2 and 8 can be added to any of the embodiments of this invention, including those shown in FIGS. 3-51. It is preferably a cage made of heavy duty wire screen or perforated metal that is attached (as by welding or rivets) to a rear panel, such as panel 41 in FIG. 8. This provides a secure compartment 42 for a power source accessory 43, such as an auxiliary battery, charger, or battery eliminator.

Figure 9:
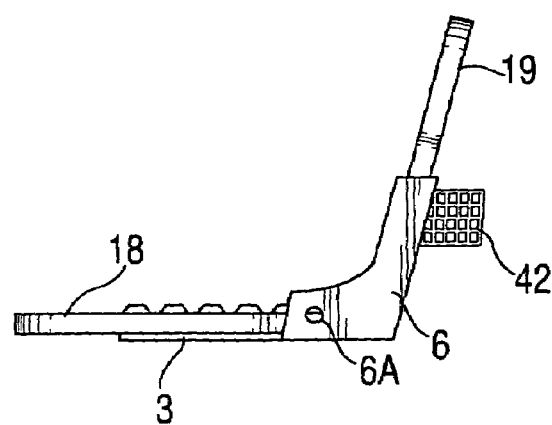
FIG. 9 is a side view of the locking apparatus of FIG. 8 used on a notebook computer showing the housing cage feature.

Compartment 42 is also shown in the side view of FIG. 9.

Figure 10:
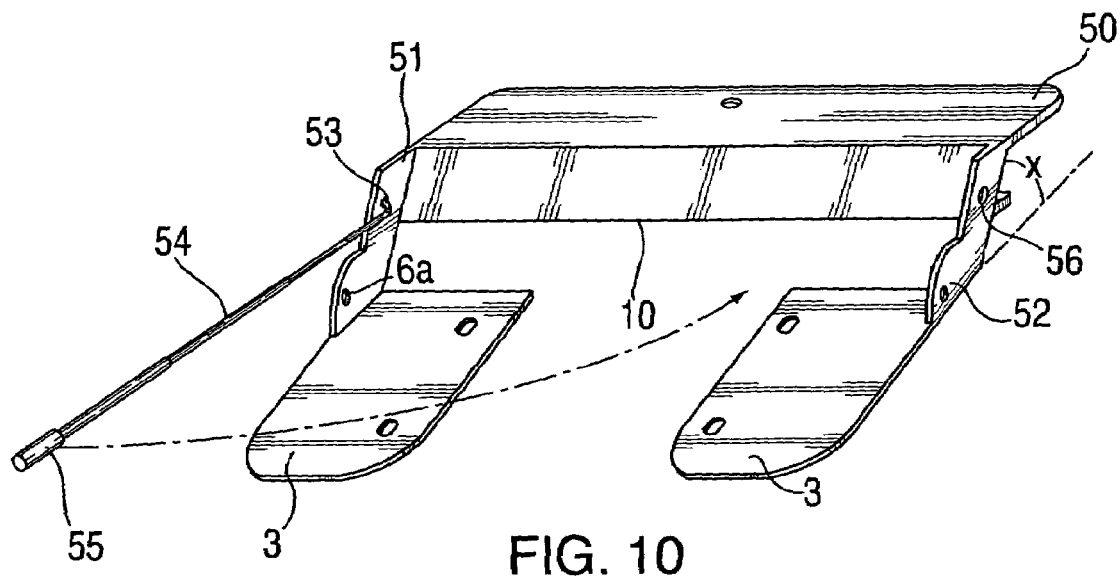
FIG. 10 is a perspective view of a further alternate swing arm embodiment using a swinging arm, such as a telescoping bar, to secure a typical notebook computer.

In a further alternate embodiment, shown in FIG. 10, a locking base using a telescoping rod 54 is shown. In this embodiment, there is no member such as locking collar 2 or transparent panel 30 that can be readily removed from the locking base when a computer or other personal electronic device is not secured to the base. This should reduce the incidence of vandalism or theft of the removable item which would render the base unusable. In FIG. 10, one end of bar 54 is attached to the left side panel member 51 of base 50 via a pivotable fastener, such as ball joint 53. After the notebook computer or other personal electronic device is inserted between sides 51 and 52, bar 54 is swung over the lower (hinge) portion of the notebook computer's screen, such as a liquid crystal display (LCD) screen and is elongated so as to insert lock plug 55 through locking hole 56 in right side 52. A lock (not shown), such as padlock 20, is then inserted through the hole in plug 55 thus locking computer to base.

Figure 11:
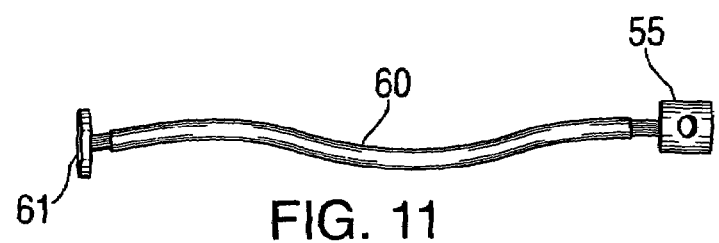
FIG. 11 is a top plan view of a clad steel cable used as a locking element for the further alternate swinging arm embodiment.
Figure 12:
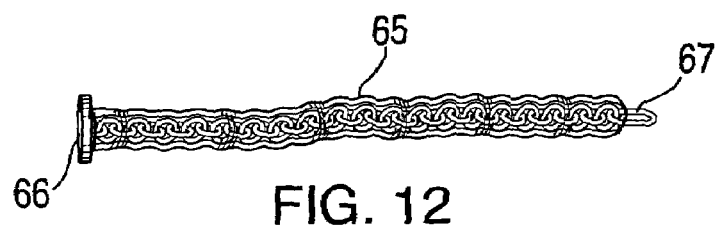
FIG. 12 is a top plan view of a chain inside a flexible tube as an alternate locking element in the embodiment of FIG. 10.

Alternate locking members include locking members such as vinyl clad steel cable 60 shown in FIG. 11, and the flexible tubing clad chain 65 shown in FIG. 12. These two devices do not require a ball joint attachment to left flange 51. Cable 60 can be simply inserted through a hole in flange 51 and then retaining washer 61 can be permanently attached as by spot welding. Lock plug 55, used as for telescoping rod, is attached to the distal end of cable 60. Chain 65 can be attached to flange 51 in a similar fashion by attaching washer 66 to its proximal end after threading through a hole. The distal end of chain 65 has an elongated link 67 with stop washer attached. The padlock is engaged through this link after it emerges through hole 56 in side 52.

FIG. 13 shows an alternate embodiment using a separate locking base 81 used with a notebook computer or other personal electronic device lock 80 which slides in from the left so that one or more base pads 87 are retained by one or more brackets 82 on base 81. FIGS. 13 and 14 also show a clamp 86 which secures the lock in place by clamping the lock over a working surface, such as a table top 85.

A better view of this is the side edge view of FIG. 14. Clamp 86 slips over the edge of work surface 85. Locking bar 84 is captive in left bracket of computer or other personal electronic device lock 80, but it can swing out to permit access of computer or other personal electronic device display. The distal end 88 is grooved to accommodate a key lock to secure the computer or other personal electronic device as well as lock 80 to base 81. The long neck portion of base 81 from clamp 86 to brackets 82 positions the computer or other personal electronic device at a convenient distance from the front edge of table working surface 85. The detail of clamp 86 in FIG. 13A shows how screw 92 with optional security head 91 is screwed into the bottom surface of table working surface 85 via pointed end 93.

FIG. 13B shows how tang 97 prevents screw 91 from being loosened when lock 95 is locked via key 96. Lock 95 can be easily removed from hole 94 in lock bracket 90. When tang 97 is turned to position 98, screw head 91 is not obstructed so that it can be removed or tightened.

Figure 15:
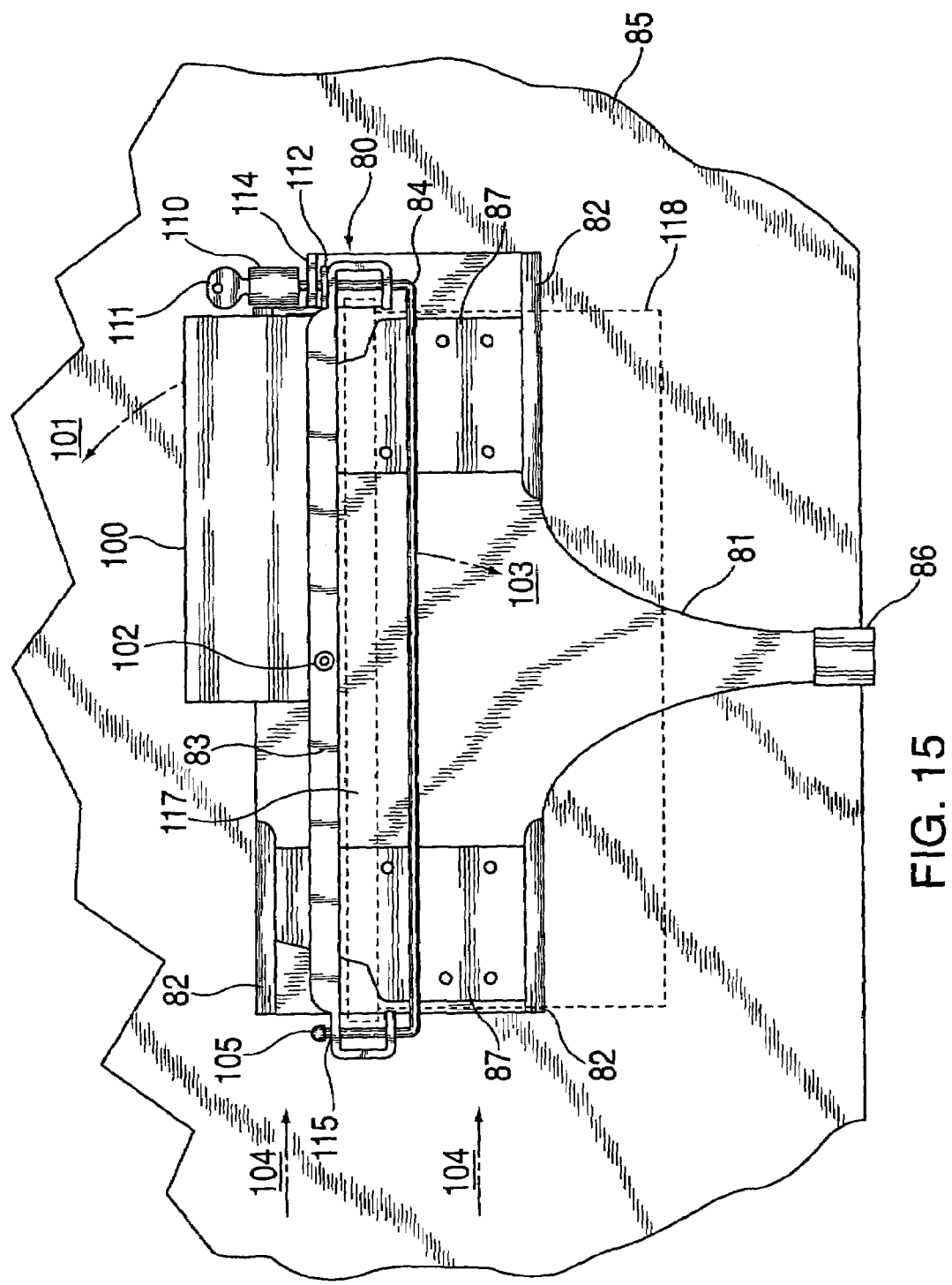
FIG. 15 is a top plan view of the computer lock of FIG. 13, secured within a locking base, also showing the position of the notebook computer with dashed lines.

FIG. 15 is a top plan view showing details of notebook computer or other personal electronic device lock 80 locked to base 81 with a computer or other personal electronic device display shown in dashed lines in position 117 and keyboard shown in dashed lines in position 118. Power supply box 100 can pivot open in the direction of arrow 101 on shaft 102 with a retaining cap; it is locked via tang 112. Notebook computer or other personal electronic device lock 80 is slid into a captive position within brackets 82 retaining the edges of base plates 87 in the direction of arrow 104. The left end of swinging locking bar 84 (which can swing out in the direction of arrow 103) is retained via retaining cap 105 within slotted hole 115 and an oversize hole on front of the left bracket. Key lock 110 grasps rod end 88 of swinging locking bar 84, which maintains the security of the assemblage via bracket tang 114, which is part of locking base 81. Key 111 can be used to remove the lock body from the end of swinging locking bar 84.

While FIG. 13-15 shows a separate over the table locking base 81 used with a notebook computer or other personal electronic device lock 80 which slides in from the left so that base pads 87 are retained by brackets 82 on base 81 of notebook computer or other personal electronic device lock 80, it is contemplated that a further alternate embodiment includes attaching notebook computer or other personal electronic device lock 80 directly to a work surface 85, such as a study desk, by providing fastener receptacles within base pads 87, wherein fasteners, such as screws or bolts fasten base 81 directly to an upper side of the work surface 85, without the use of over the table base 81.

Figure 16:
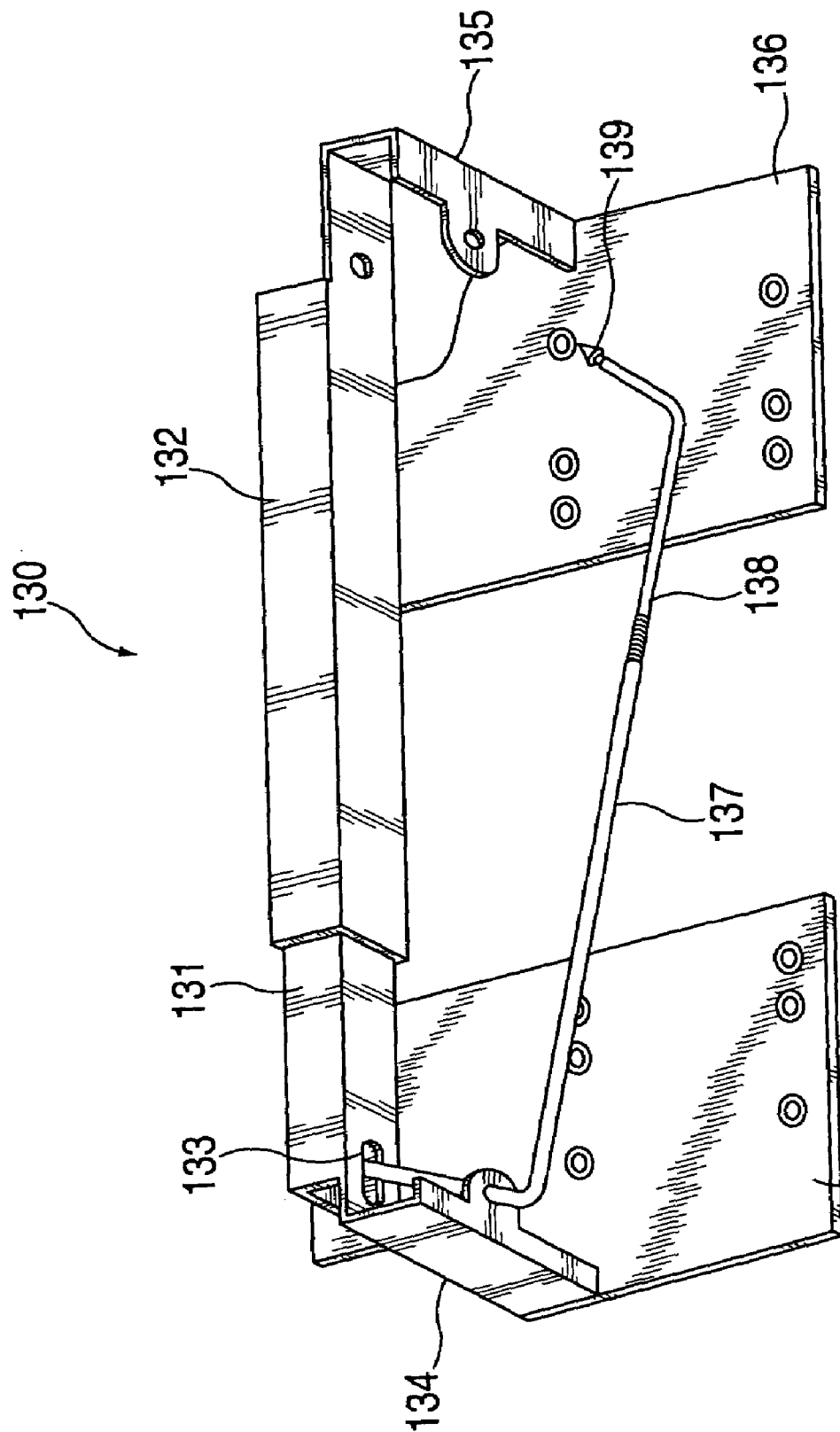
FIG. 16 is a perspective view of one embodiment for a width adjustable notebook computer lock.

FIG. 16 shows another embodiment of a notebook computer or other personal electronic device lock 130 with a telescoping width adjusting feature to accommodate computer or other personal electronic devices of varying widths more securely. Base pads 136 are compatible with the use of locking base 81 of the previous embodiment to retain this continuous adjustment feature. Locking bar portions 137 and 138 are adjustable in size.

Figure 17:
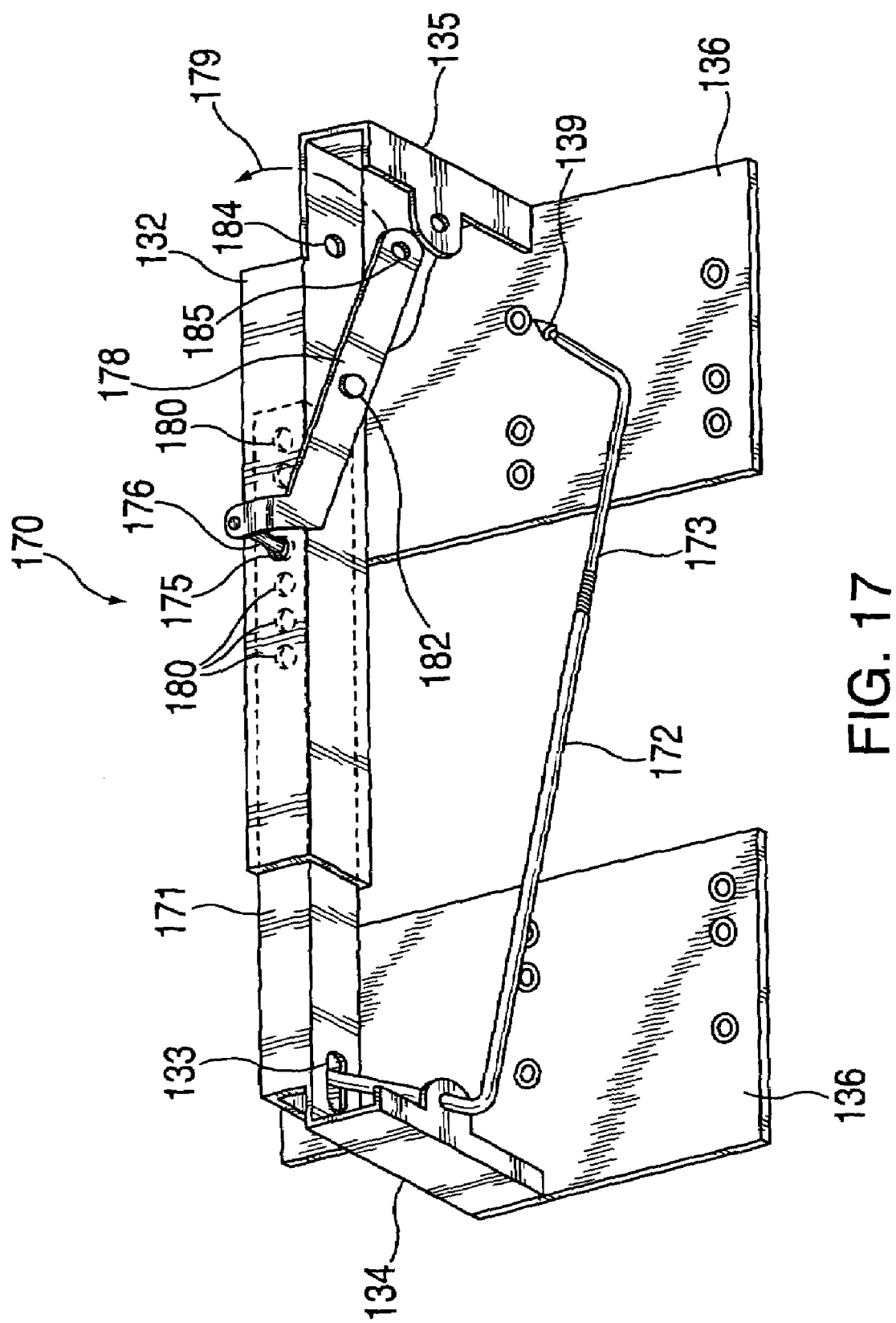
FIG. 17 is a perspective view of a further embodiment for a discrete width adjustable notebook computer lock.

For example, as in FIG. 17, incrementally spaced detents or pins and holes may be used to facilitate width adjustment.

Alternatively, as in FIG. 16, locking bar 137 may be hollow and threaded with a coarse thread; it is captive within left bracket 134 and slotted back hole 133. Right section of locking bar 138 is screwed into portion 137 and can be quickly length adjusted by twisting it clockwise or counter-clockwise. Horizontal section 131 fits into section 132 in a telescoping fashion. After the notebook or laptop computer or other personal electronic device display is placed between the spread-apart brackets, the brackets are pushed against its sides and swinging locking bar portions 137 and 138 are adjusted accordingly to fit into holes in right bracket 135 for locking.

FIG. 17 shows a different width adjustable computer or other personal electronic device lock 170 with a discrete locking mechanism including pivoted flange 178 with peg 176 at its distal end. Flange 178 is pivoted on pivot 182, such as a rivet, attached to outer telescoping member 132 of notebook computer or other personal electronic device lock 170. When swung in the direction of arrow 179, flange 178 will force peg 176 through hole 175 in telescoping section 132 and further into one of the holes 180 in inner telescoping member 171 when in positional registration. Flange 178 is locked in position when hole 185 is in positional registration with hole 184 and locking bar 173 end 139 is passed through both. The swinging locking bar includes hollow side section 172 and inner, preferably solid, side section 173, which is telescopic within outer hollow side section 172.

Figure 18:
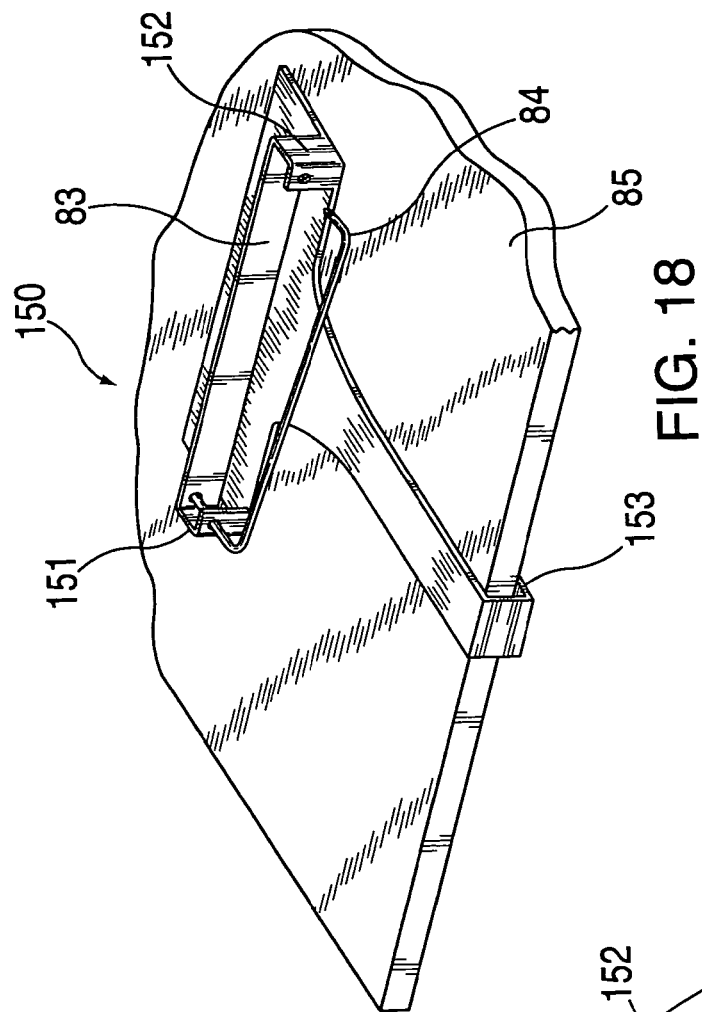
FIG. 18 is a perspective view of an integrated locking base/computer lock embodiment.

FIG. 18 shows another embodiment 150 of this invention wherein the locking base has been integrated with the notebook computer or other personal electronic device lock. Clamp 153 locks onto work surface 85 as described in a previous embodiment with a separate locking base 81 (see FIGS. 13-14). Upright brackets 151 and 152 with bar 83 between capture the notebook computer or other personal electronic device display which is then locked via swinging locking bar 84 and a key lock (not shown).

Figure 19:
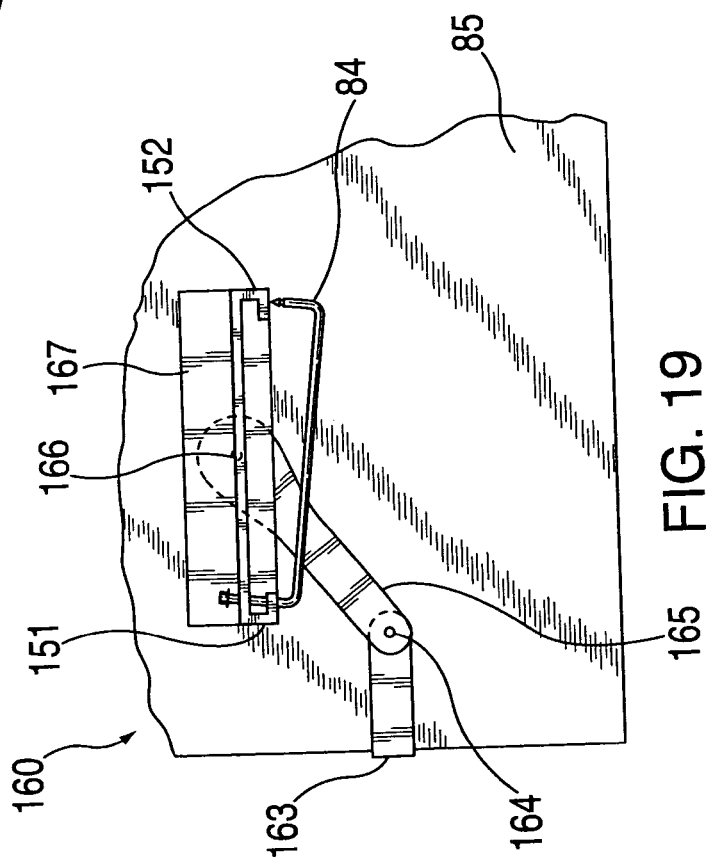
FIG. 19 is a top plan view of another integrated locking base/computer lock with two pivot links.

A related embodiment in FIG. 19 shows integrated base/ computer or other personal electronic device lock 160 which has one or more pivot points 164 and 166 (on base part 167). Link 165 now pivots in relation to clamp section 163 such that the notebook computer or other personal electronic device lock 160 can be more conveniently positioned on work surface 85.

In FIG. 19, for example, clamp 163 is placed on the edge to the side of computer or other personal electronic device lock base 167 instead of directly in front of it as would be necessary in the embodiment of FIG. 18.

The preferred low profile locking base embodiment of this invention for consumer use is detailed in FIGS. 20-27.

Figure 20:
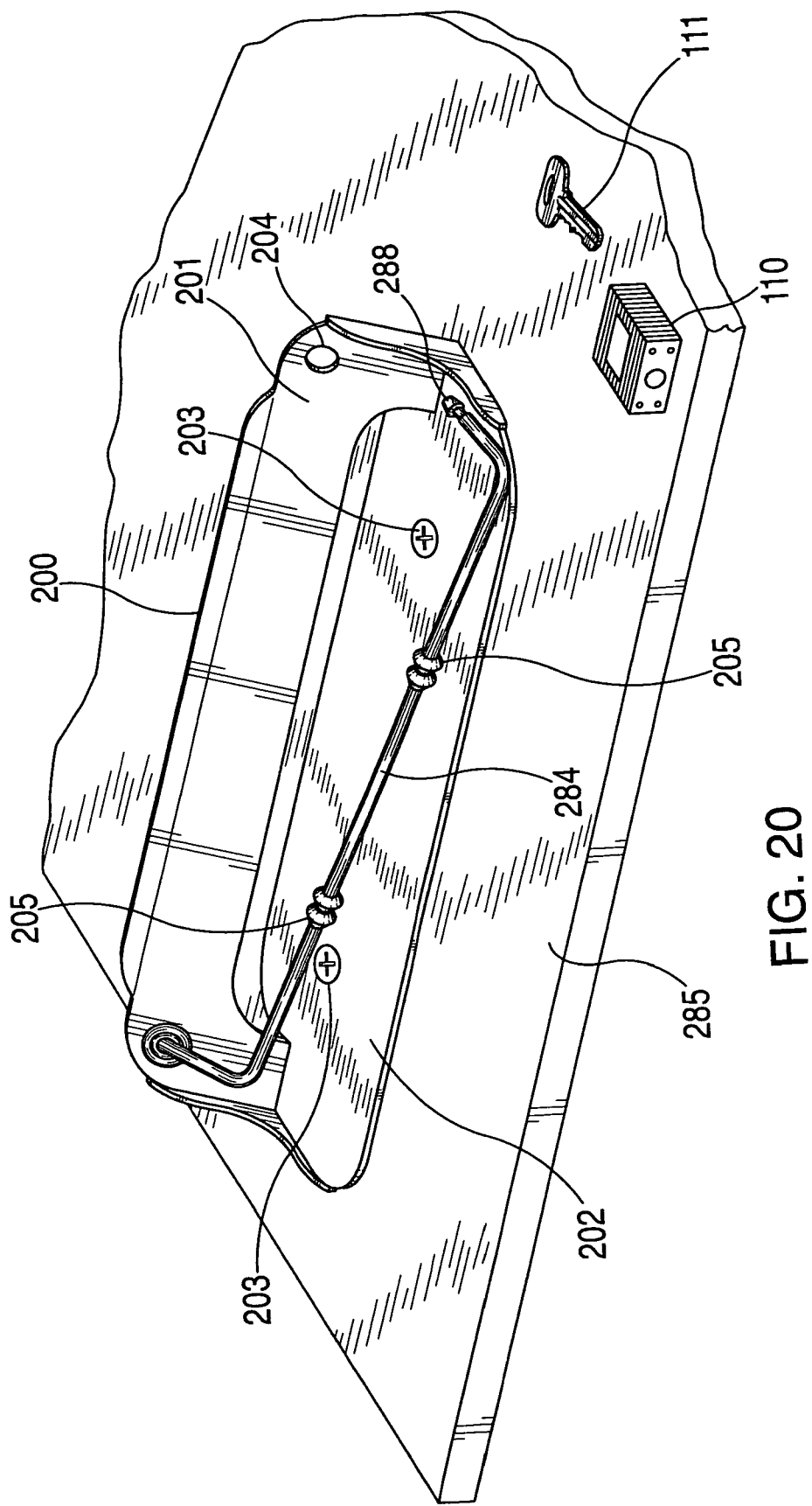
FIG. 20 is a perspective view of a preferred embodiment for a low profile notebook computer, shown attached by fasteners, such as screws, down to the work surface.

FIG. 20 shows a low profile locking base 200 with narrow base 202 and low rise back 201. It is screwed to work surface 285 via fasteners, such as screws 203. Locking bar 284 with optional rubber or elastomer grommets 205 and machined end 288 is used to lock the display of a notebook or laptop computer or other personal electronic device (not shown) to locking base 200. End 288 is passed through hole 204 and locked with pin lock 110. Key 111 is used to unlock and remove the computer or other personal electronic device.

Figure 21:
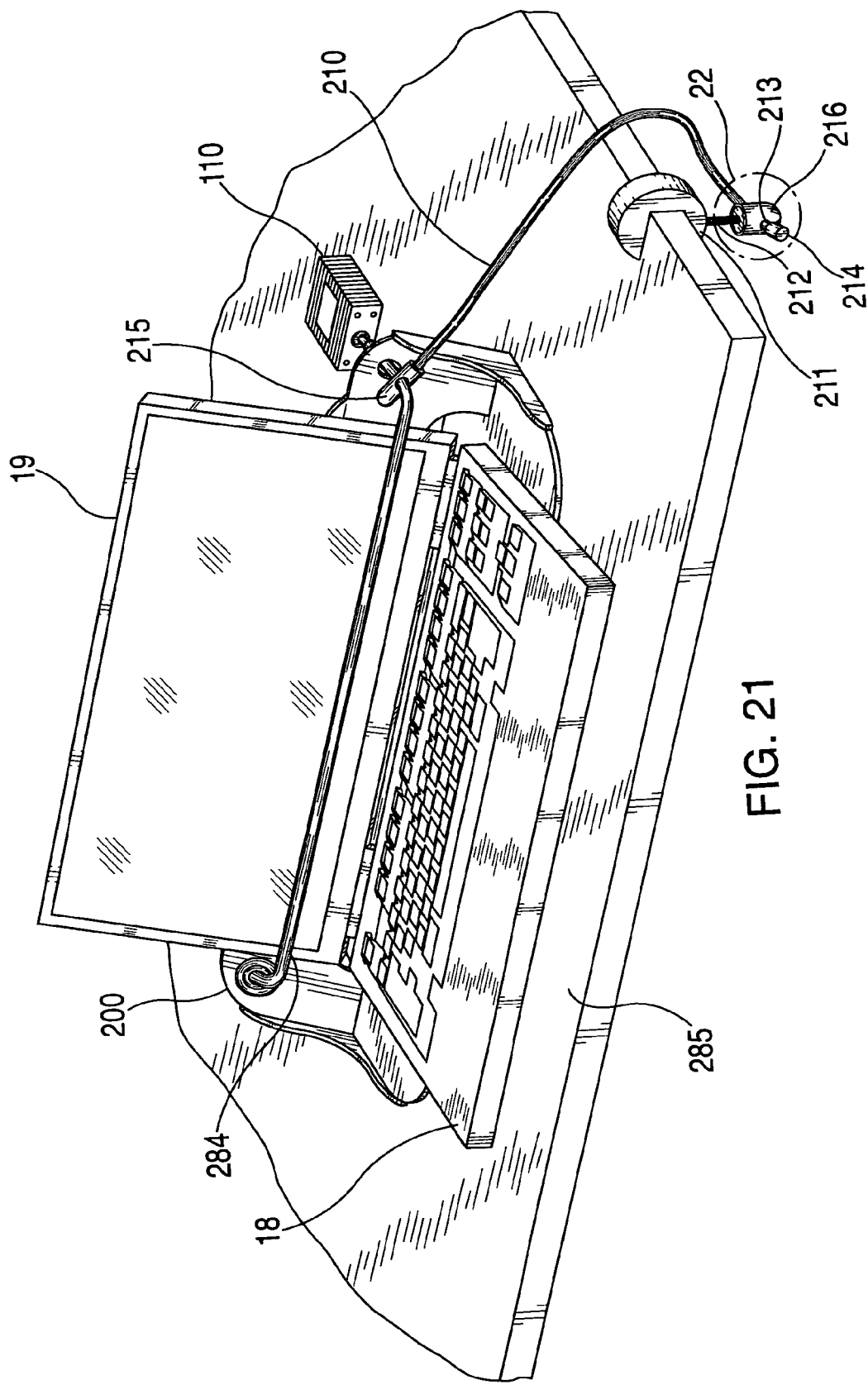
FIG. 21 is a perspective view of the locking base of FIG. 20 used as a portable device secured to the work surface via a cable and clamp.

The preferred simpler method of use of a locking base is not to screw it down as shown in FIG. 20 but instead to create a portable locking kit by adding a clamp 211 and cable 210 as shown in FIG. 21.

Due to the low profile design with a narrow base, all components of the portable kit conveniently fit into a tubular carrying case (not shown).

FIG. 21 also shows Clamp 211 having a fastener, such as a screw subassembly, including screw 212 and short container, such as a cylinder 216, with transverse cable attachment hole 213. At the first end of cable 210 is a ferrule 215 with a transverse hole. This fits through hole 213. The cable is threaded through hole 213 after clamp 211 is secured using the appropriate tool to tighten screw 212. The distal end of cable 210 has ferrule 214 with enlarged end which does not fit through hole 213.

FIG. 22 shows the arrangement more clearly. It is noted that cylinder 216 has distal hole 220 which accommodates the screw head and also has a screw clearance hole 221 on its top surface. After cable 210 is threaded through hole 213, a tool cannot reach screw head 222 to loosen clamp 211 since access is denied through distal hole 220. After cable 210 is installed through cylinder 216, the end 288 of locking bar 284 is passed through the transverse hole in ferrule 215 prior to locking bar 284 to base 200.

In an alternate embodiment of the clamp screw subassembly no tool is required to tighten or loosen clamp 211.

For example, an exploded view of subassembly 230 is shown in FIG. 23 with end cap 231 pushed down over clamp screw 233 and press fit into the end of knob 235. Optional pins 238 can be driven radially to insure positive attachment. Cap 231 has screw clearance hole 232 at its center. Screw 233 becomes captive as a subassembly with tall head 234 within knob 235 once cap 231 is attached. Offset transverse hole 237 in knob 235 goes through both walls and is sized for cable attachment.

FIG. 24 shows the underside of cap 231 revealing hexagonal recess 240 sized to engage bolt head 234.

FIG. 25 is a top view of subassembly 230. In the side crossection of FIG. 26, bolt head 234 is seated in recess 240 of cap 231. This is prior to the insertion of cable 210 through holes 237. Clamp 211 can be tightened in this depicted configuration by turning knob 235 since recess 240 acts as a socket wrench to bolt 233. It is noted also that the size of head 234 interferes with the placement of hole 237 thereby preventing insertion of cable 210 while head 234 is seated in recess 240.

If knob 235 is pushed up as shown in FIG. 27, cable 210 can now be easily inserted through holes 237 adjacent to screw 233 and spacing head 234 away from recess 240. In this configuration with cable 210 installed through knob 235, if turned, knob 235 will spin freely regardless of the up or down forces exerted. Clamp 211 can only be removed after cable 210 is removed and head 234 is re-seated in recess 240. In lieu of a non-standard screw 233 with tall head 234, a standard hex screw can be used with a nut screwed up against the head and adhesively bonded as a unit. A washer between the nut and the screw head would only enhance the operation creating a more positive barrier with cable 210.

In an alternate protruding member locking embodiment of this invention, spikes, security rods or strips are used to secure a personal electronic device, such as a notebook computer, cellphone, personal digital assistant (PDA) or electronic music/video player (i.e. iPod®).

For example, in FIG. 28, a notebook computer or other personal electronic device with base 275 and display 276 is shown. One of the three through-holes is required for this embodiment. Hole 278 is at the hinge line, while hole 279 is through the display housing; hole 277 is diagonally through one of the front or rear corners of the base.

FIG. 29 shows locking rod or spike 285 which is inserted in any of the three hole locations discussed. Ferrule 286 with a groove near its distal end is then inserted through the transverse hole of spike 285 and locked with pin lock 110. Ferrule 286 is securely attached to cable 210 which had been passed through knob 235 after clamp 211 had been tightened at the edge of a table or desk top. In this manner, the illustrated notebook computer or other personal electronic device is secured via a secure cable.

Figure 30:
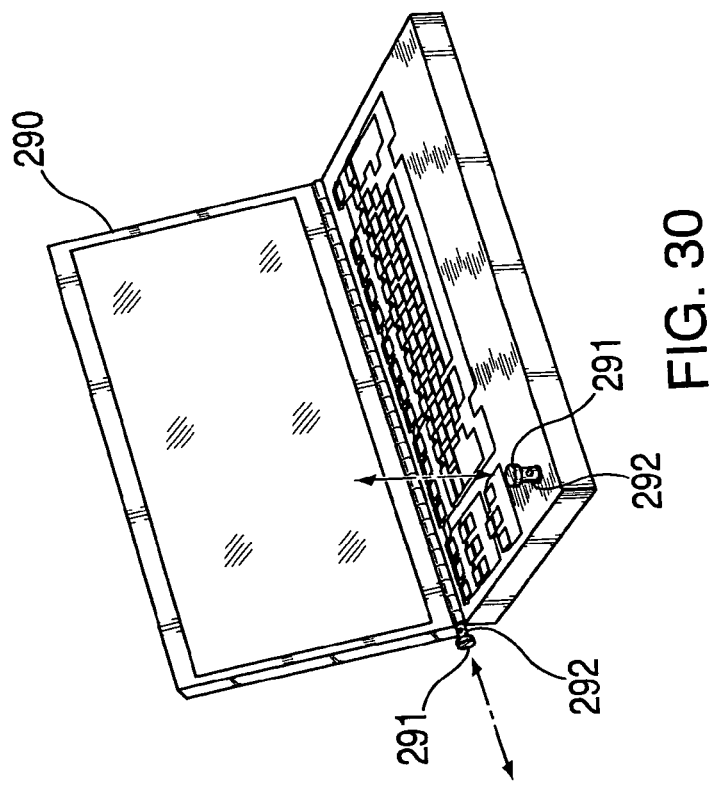
FIG. 30 is a schematic perspective view of a notebook computer with captive security rods for cable attachment.

In a variation of this embodiment, the separate spike 285 is replaced by a captive security rod 291 as shown in FIG. 30. Note that rod 291 may be attached either to one end of the hinge or alternatively to the top surface of the base of computer or other personal electronic device 290 at any convenient location where space permits. Rods 291 are stored in a recessed position with only a small knob protruding so that they may be easily grasped to unlock into the extended position to expose a transverse hole. Ferrule 286 and lock 110 are then used in the same manner as with the separate spike 285.

Figure 31:
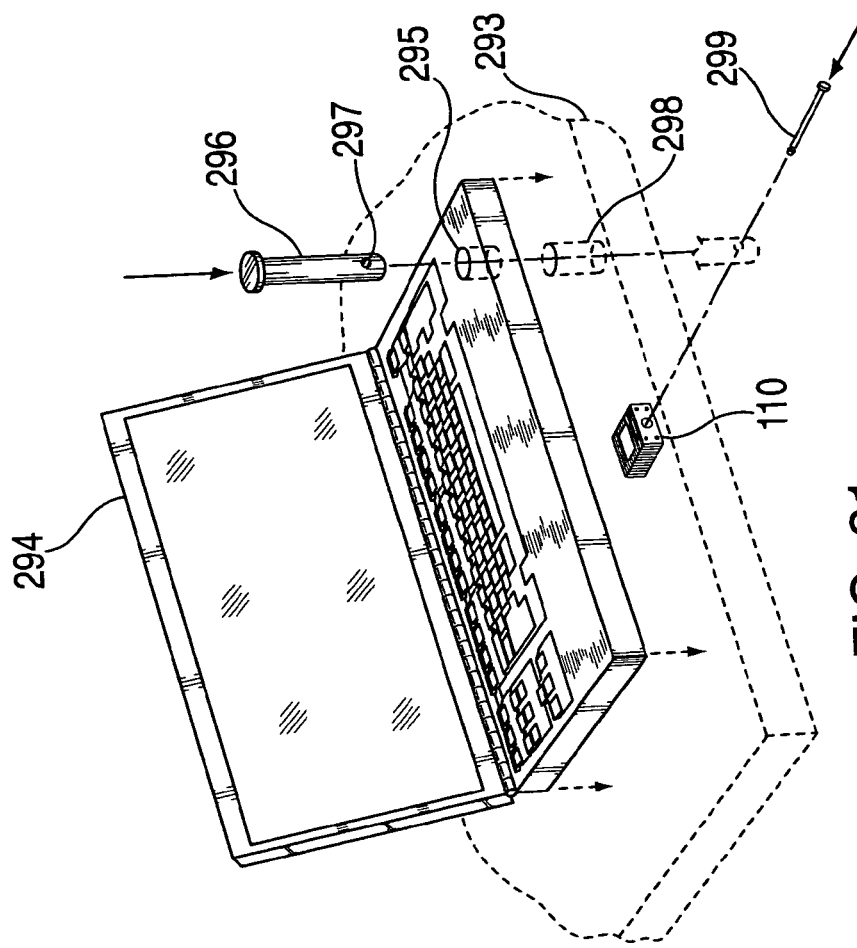
FIG. 31 is a schematic perspective view of a notebook computer with a hole downward through the base for use with a long protrusion spike and a transverse locking pin.

In another spike variation shown in FIG. 31, long spike 296 is used to secure computer or other personal electronic device 294 which has a hole 295 through its base. Hole 295 is placed over pre-existing hole 298 through table top 293; then spike 296 is inserted such that transverse hole 297 is accessible beneath table top 293. Then transverse pin 299 with a groove adjacent its distal end is inserted through hole 297 and locked with pin lock 110. Thus this variation locks a notebook computer or other personal electronic device using a spike without the aid of a cable.

Figure 32:
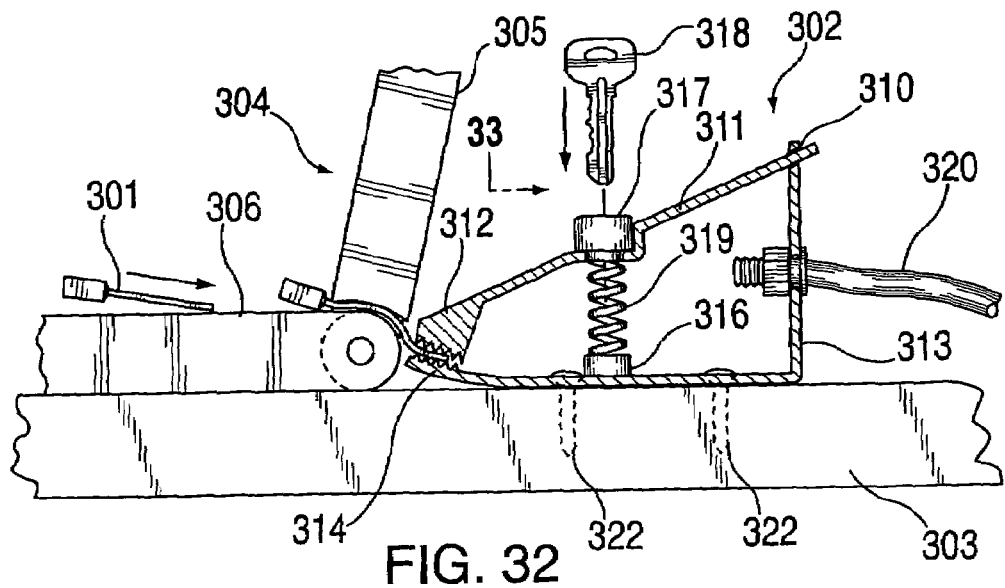
FIG. 32 is a diagrammatic side elevational view of one embodiment for a flexible strip lock for a computer.

In another embodiment shown in FIG. 32 with a flexible locking strip 301, a detail of notebook computer 304 with display 305 and keyboard portion 306 is shown adjacent to clamp 302. Flexible locking strip 301 is shown prior to insertion through the hinge gap between display 305 and keyboard 306 (not shown) and further between bottom jaw 314 and top movable jaw 312 of clamp 302.

In lieu of being inserted within a hinge gap, flexible locking strip 301 may be inserted within a thin, longitudinally extending slot, similar to holes 277, 278, 279 for rod 285 of FIG. 29.

Figure 33:
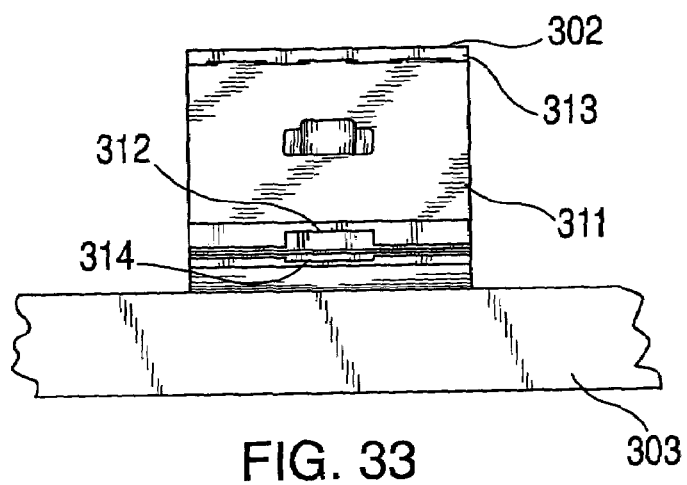
FIG. 33 is a front elevational view thereof, taken in the view direction of arrow "33" shown in FIG. 32.
Figure 34:
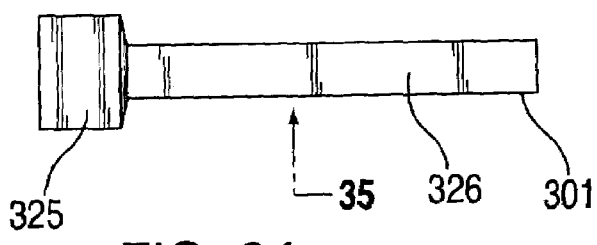
FIG. 34 is a top plan view of the shim strip of the flexible lock.
Figure 35:
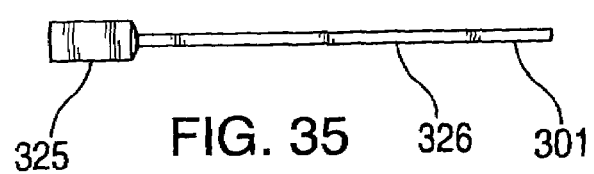
FIG. 35 is a side elevational view taken in the view direction of arrow "35" of FIG. 34.
Figure 44:
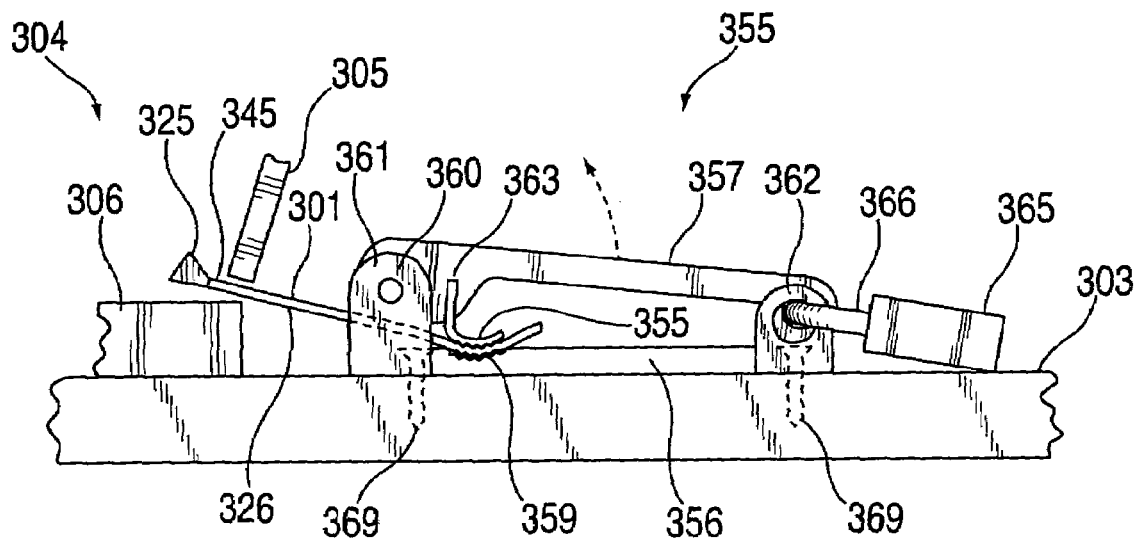
FIG. 44 is a side elevation of an alternative embodiment of a strip captivating locking clamp of this invention, shown using an ordinary padlock.
Figure 45:
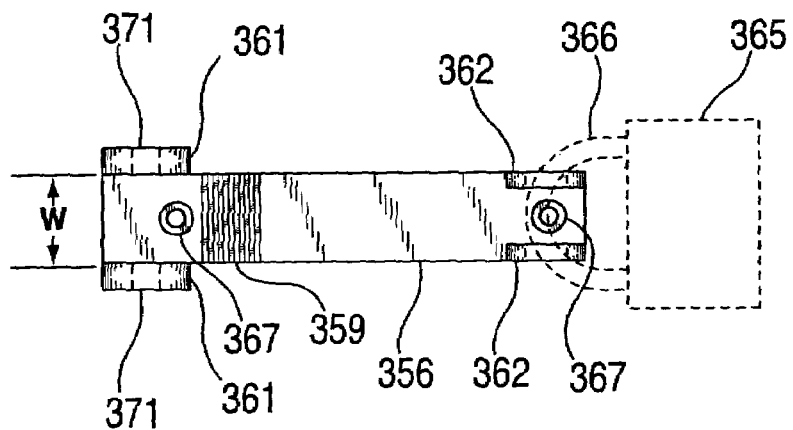
FIG. 45 is a top view of the base portion of FIG. 44.

FIGS. 33, 36 and 37 show other features of clamp 302 with movable top 311 and stationary base 313. Locking strip 301 is clearly shown in top view and side view in FIGS. 34 and 35 respectively. Wedge stop 325 is shown at one the proximal end with narrow rectangular strip 326 at the distal end. Wedge stop 325 is preferably plastic which is bonded to strip 326 as by overmolding. It is noted that base portion 313 of clamp 302 is typically screwed to work surface 303 via screws 322, however, alternatively security cable 320 with secured distal end (not shown) can be used.

Gripping means, such as serrations 337 in FIG. 36, form lower static jaw 314 of FIGS. 32 and 33; they engage strip 301. Hole 336 is used for optional cable 320. Holes 322*a* accommodate fasteners 322, such as screws. Rectangular holes 335 accept tabs 339 of upper movable jaw 311 to form a hinge. The vertical wall 313*a* of base 313 can be alternatively joined to movable section 311 via ordinary hinges.

As in FIGS. 38 and 39, spring 319 tends to keep jaws 312 and 314 slightly apart unless lock 317 is locked via key 318. In that case if key 318 is rotated while moving member 311 is pressed down, lock tang 331 will engage lock recess 316 at the distal end of spring 319; recess 316 is attached to base 313. This action will lock locking strip 301 between jaws 312 and 314. Note that lock 317 is attached to hinged part 311 via a fastener, such as lock nut 330.

FIGS. 40-43 show notebook computer 304, cellular phone 346, PDA 347 and personal DVD player 348 each with hinge gap 345. In addition, the entry path of locking strip 301 is shown by arrows in FIG. 40.

FIG. 40 also shows a further alternate embodiment whereby the housing of notebook computer 304 contains a slot 326 for insertion of a flexible or rigid locking strip 328 therethrough.

Figure 46:
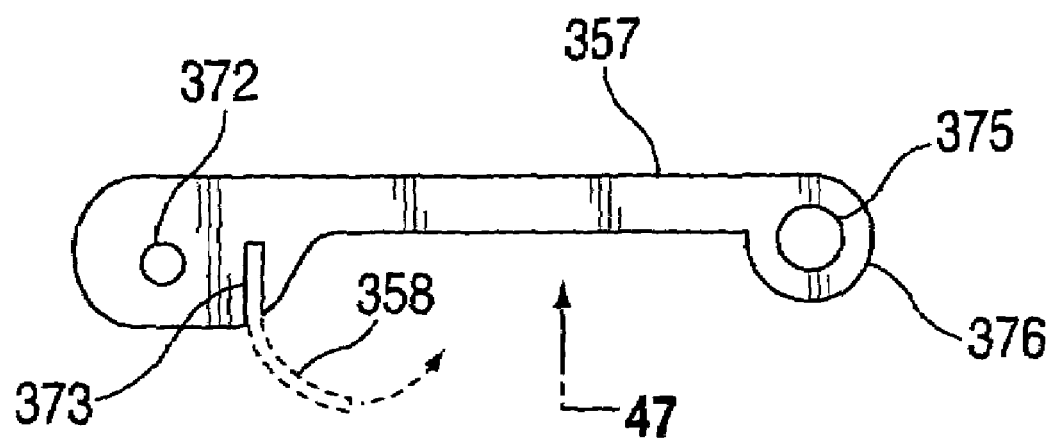
FIG. 46 is a side elevation of the handle portion of the alternate embodiment clamp of FIG. 44.
Figure 47:
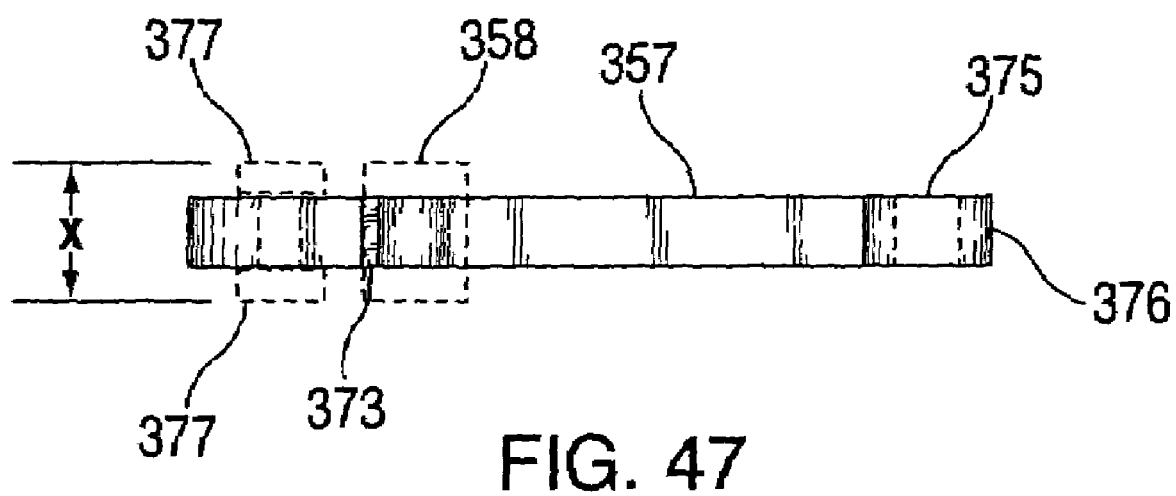
FIG. 47 is a bottom view (in the direction of arrow "47" in FIG. 46) of the handle of FIG. 46.

FIGS. 44-47 relate to an alternate embodiment of clamp 355 which incorporates a leaf spring 358 to impart locking force to locking strip 301 when shackle 366 of padlock 365 is passed through lock loops 362 and handle loop 376 (as in FIG. 46). In this embodiment, shallow recess 359 with transverse serrations aggressively grasps strip end 326 under bending force of spring 358, which itself can have optional transverse serrations on its contact surface.

When handle 357 is free to swing up, strip end 326 can be easily passed between brackets 371 which are spaced apart a distance "W" (as in FIG. 45) to accommodate the width of strip end 326. Base 356 is secured to work surface 303 via fasteners, such as screws 369, which are passed through countersink holes 367 (as in FIG. 45). Leaf spring 358 is swaged or brazed at region 363 within slot 373 of handle 357. Hole 375 in loop 376 accommodates shackle 366. It is noted that spring 358 has to be bent somewhat for handle 357 to be in registration with the holes in padlock brackets 362. This bending also permits clamp 355 to accommodate strip ends 326 of varying thicknesses. Also, with respect to the geometry of spring 358 in FIG. 44, if a pulling force is placed on locking strip 301, frictional forces will tend to rotate the free end of spring 358 in a counter-clockwise direction thereby increasing clamping force on strip end 326; this further counteracts the pull-out force. Since spring 358 is wider than handle 357 (as in FIG. 47), centering washers 377 are used on either side of it to increase the combined width to X which is just slightly smaller than W. Rivet 360 in brackets 361 acts as an axle for handle 357; hole 372 is a clearance fit for rivet 360.

Figure 48:
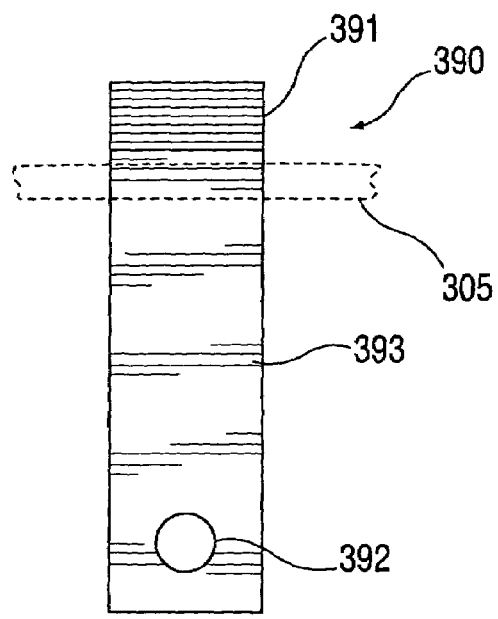
FIG. 48 is a top plan view of a further alternate embodiment for a locking strip of this invention.

FIG. 48 illustrates alternate embodiment locking strip 390 with locking wedge 391, strip 393 and end hole 392. Locking strip 390 may be rigid or flexible.

Figure 50:
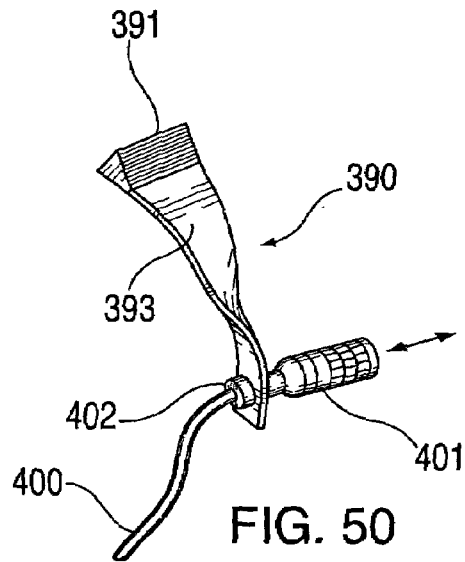
FIG. 50 is a perspective of an alternate method of securing the locking strip of FIG. 48 by the use of a secure cable and a cable lock.
Figure 51:
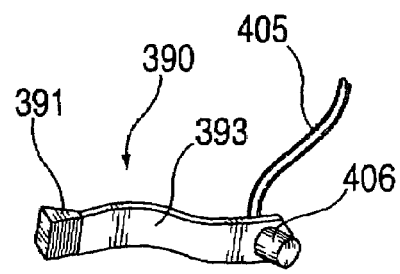
FIG. 51 is a perspective view of yet another method of securing the locking strip of FIG. 48 by virtue of a free cable with attached stop member.

Dashed lines 305 of FIG. 48 show the position of a computer display if this is being secured. Added hole 392 permits at least three non-clamp locking methods to be used. These are illustrated in FIGS. 49-51; for clarity, no item is shown being locked in these FIGS. 49-51.

It is understood that instead of being inserted through a hinge gap, locking strip 390 may be first passed through a thin, longitudinally extending slot in the housing of the personal electronic device, such as a notebook computer, instead of a round hole provided for a rod 285 or 296, as is shown in FIGS. 29-31. In this case, the thinness of the slot 327 for strip 328 minimizes any intrusion into the interior of the walls of the personal electronic device, such as a notebook computer 305 and the like, with its intricate wiring located in a tight space within the walls of the notebook computer 305, or other personal electronic device.

The strip 390 may be a rigid rectangle or other geometric shape. Additionally strip 390 may be flexible. If flexible, strip 390 may pass through a slot in the housing of the personal electronic device, or if the device is hinged, through a hinge gap between the display of the device and the main body of the device being secured.

Figure 49:
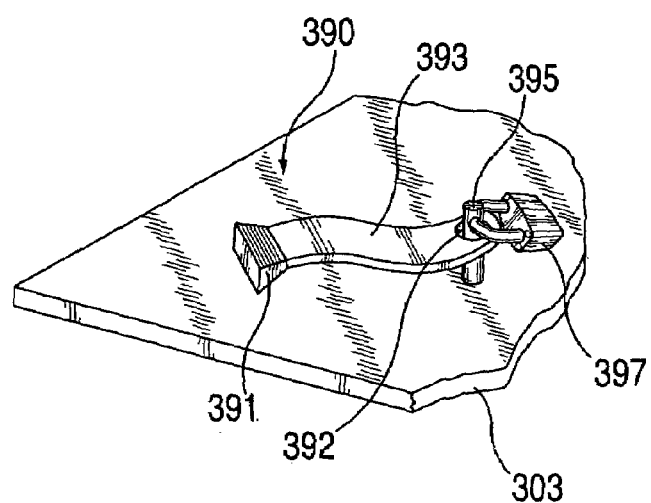
FIG. 49 is a perspective view of the locking strip of FIG. 48 secured to a stud attached to the work surface by the use of a padlock.

In FIG. 49, stud 395 is attached to and protrudes from work surface 303. Hole 392 is simply passed over the distal end of stud 395 and then the shackle of padlock 397 is passed through the transverse hole in stud 395 to lock strip 390.

In FIG. 50, secure cable 400 with collar 402 and a rigid stud at its distal end is used to secure strip 390. After the rigid stud is passed through hole 392, cable lock 401 is snapped over the end of the stud thereby securing strip 390.

In FIG. 51, free cable 405 with lock member 406 permanently attached is passed through hole 392. Since member 406 is a bulge larger than the diameter of hole 392, locking strip 390 will be secured when the distal end of cable 405 is looped or otherwise secured to work surface 303 or to some point adjacent to it.

A locking device for locking an iPod® to a table top is illustrated in FIGS. 52-56. It includes several distinct parts.

Figure 52:
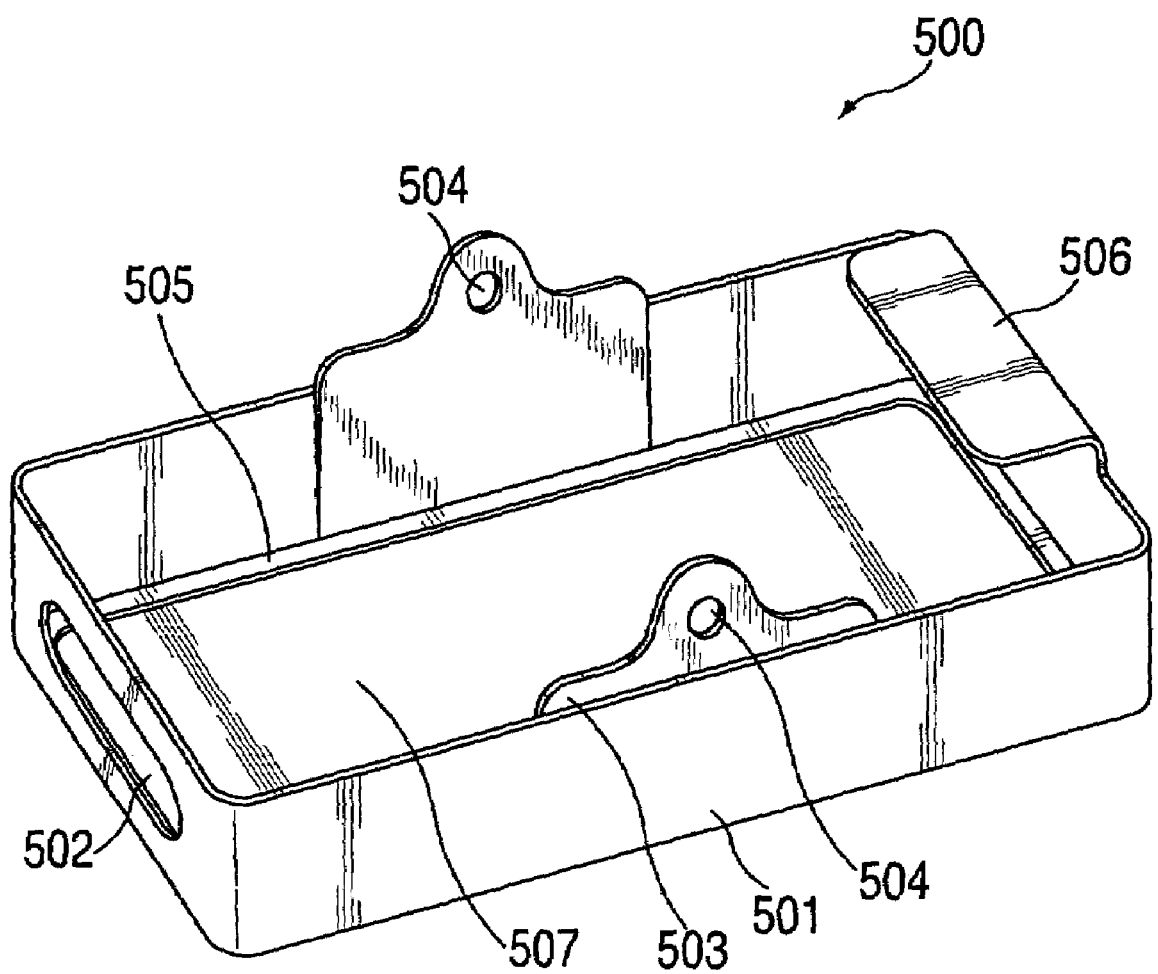
FIG. 52 is a perspective view of the iPod® security frame of this invention with the back side facing up.

For example, FIG. 52 shows metal frame 500 which is sized to encircle the iPod® 550. The iPod® 550 is inserted from the back and its front faces forward with edge 505 preventing the iPod® 550 from falling through large opening 507. Opening 502 on one end of housing sides 501 is to accommodate the iPod® connector.

Side ears 503 with holes 504 for rod 510 (as in FIG. 53) are used to lock frame 500 to clamp 520 (as in FIG. 54) with the aid of bent tab 506.

Figure 53:
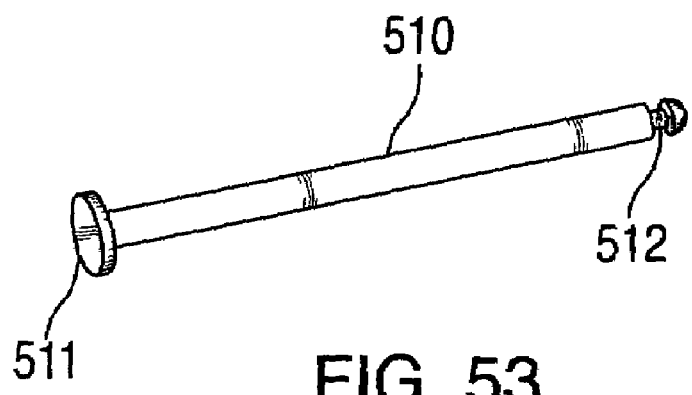
FIG. 53 is a perspective view of the locking rod for the iPod® locking device.
Figure 54:
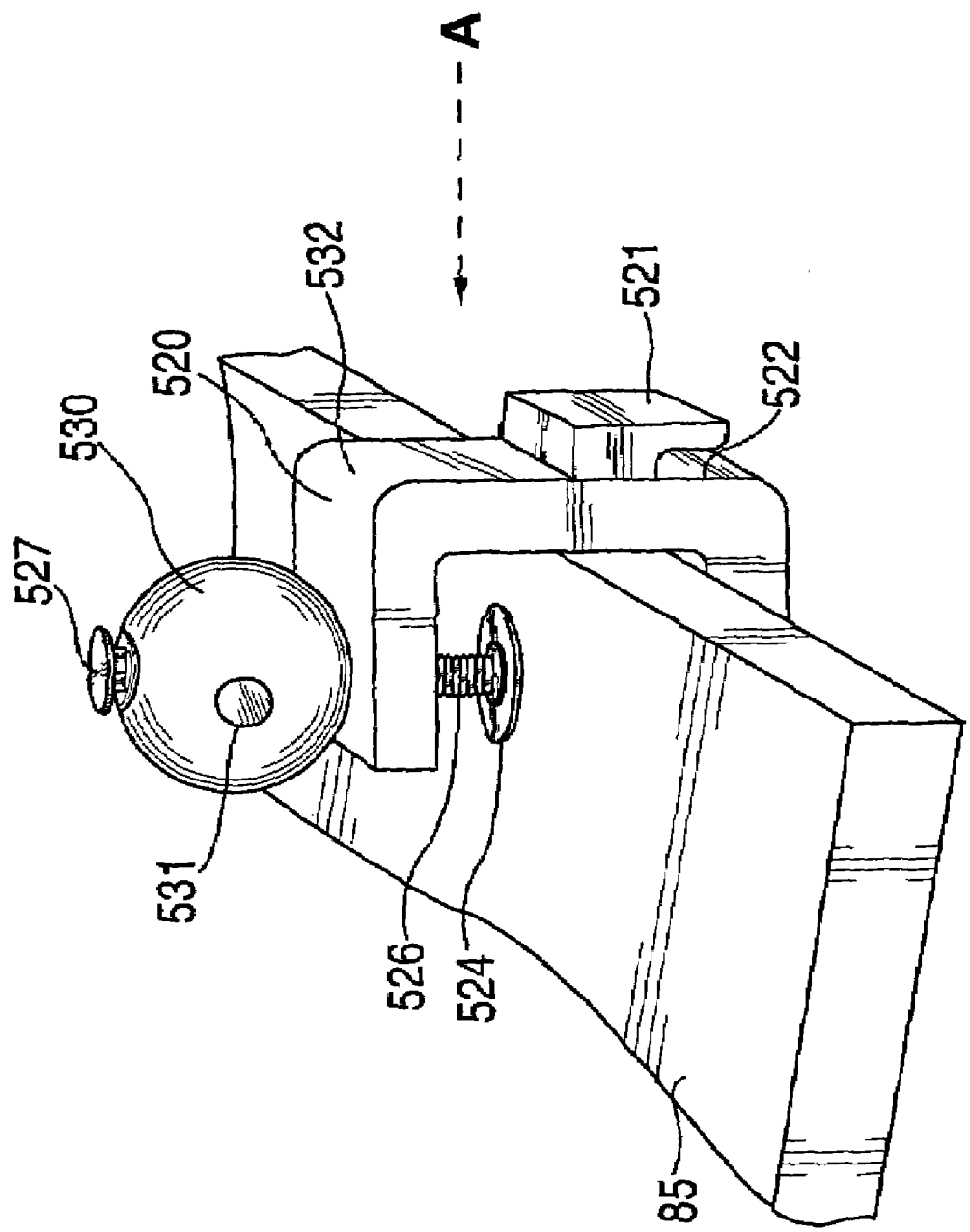
FIG. 54 is a perspective view of the tabletop clamp for the iPod® locking device.

FIG. 54 shows clamp 520 which is tightened against table top 85 by lifting spherical knob 530 thereby engaging square feature under head 527 of screw 526. Offset transverse hole 531 in knob 530 is sized for the diameter of locking pin 510 with head 511 and groove 512 at the distal end. Although a radial groove is shown in FIG. 53, other features compatible with a particular pin lock may be used instead. A clamping groove 522 is formed by side extension 521; this receives the end of bent tab 506 of iPod® frame 500.

After tightening of clamp 520 by lifting and turning knob 530 to force pad 524 against surface of table top 85, knob 530 can be turned to any desired orientation when it is down from head 527 and therefore disengaged. When secured, the back side of the iPod® 550 rests at an angle against or close to rounded corner 532 of clamp 520.

Figure 55:
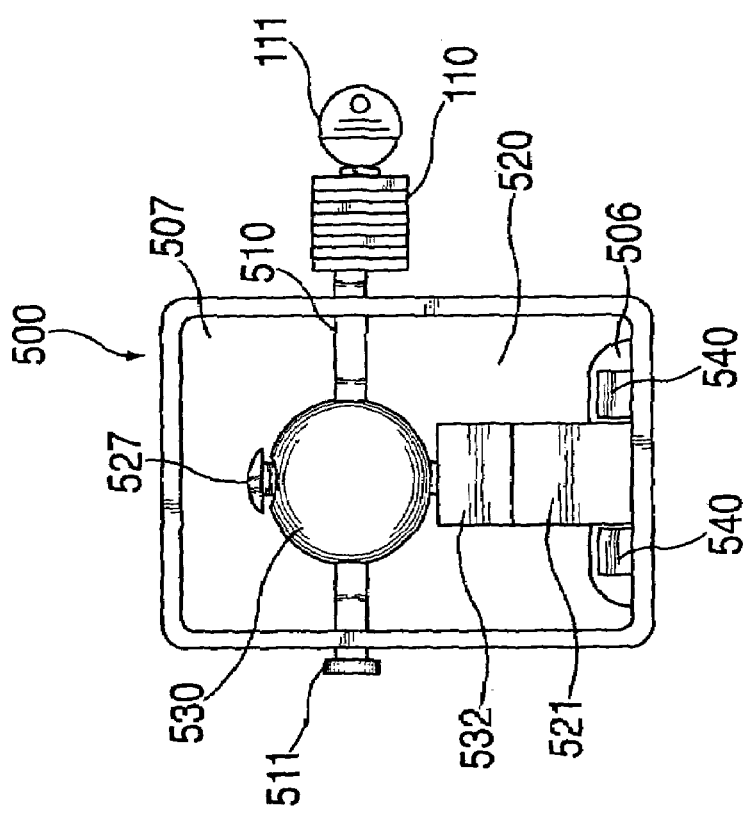
FIG. 55 is a front view in the direction of "A" in FIG. 54 showing the frame of FIG. 52 locked to the clamp of FIG. 54 without the iPod® installed.

FIG. 55 is a front view of frame 500 secured to clamp 520. For illustrative purposes, the iPod® 550 is not depicted secured inside frame 500 in this view. The details of the engagement are viewed through front opening 507. Except for the presence of key 111 in pin lock 110, frame 500 is secure; it may be stored this way when not in use.

In FIG. 55 pin 510 is clearly shown penetrating the sides of frame 500 (at holes 504), as well as transversing offset knob hole 531. Tab 506 is shown in groove 522 formed by feature 521. On each side of 521 are blocks 540 attached to the end housing of frame 500. These aid in locating frame 500 laterally within the grasp of clamp 520. They also provide a secure groove to receive the end of the iPod® 550 between blocks 540 and front frame 505.

In the configuration shown in FIG. 55, knob 530 cannot be lifted very far nor rotated, since tab 506 limits lifting and rod 510 and tab 506 prevent rotation.

Figure 56:
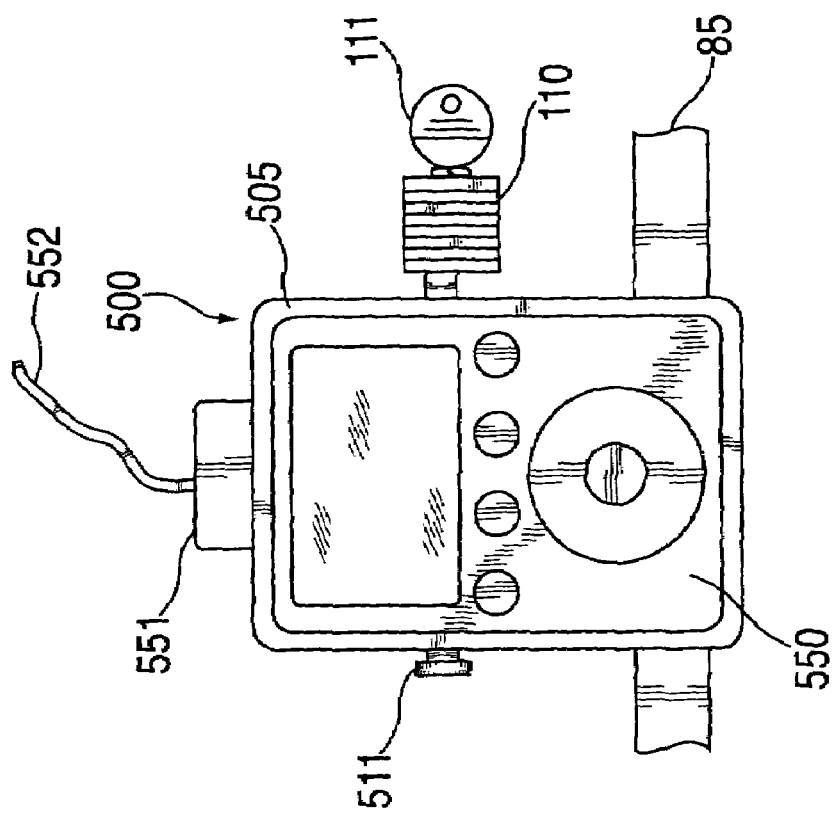
FIG. 56 is a front view in the same direction of FIG. 55, but with the iPod® installed and secure.

FIG. 56 shows the same view with iPod® 550 secured within frame 500. Although it is not shown in this view, reference to FIG. 54 reveals that frame 500 and iPod® 550 are tilted with respect to the edge of table top 85, with the back side of iPod® 550 at or near rounded corner 522. Connector 551 is shown plugged into iPod® 550 with wire leads 552.

Figure 57:
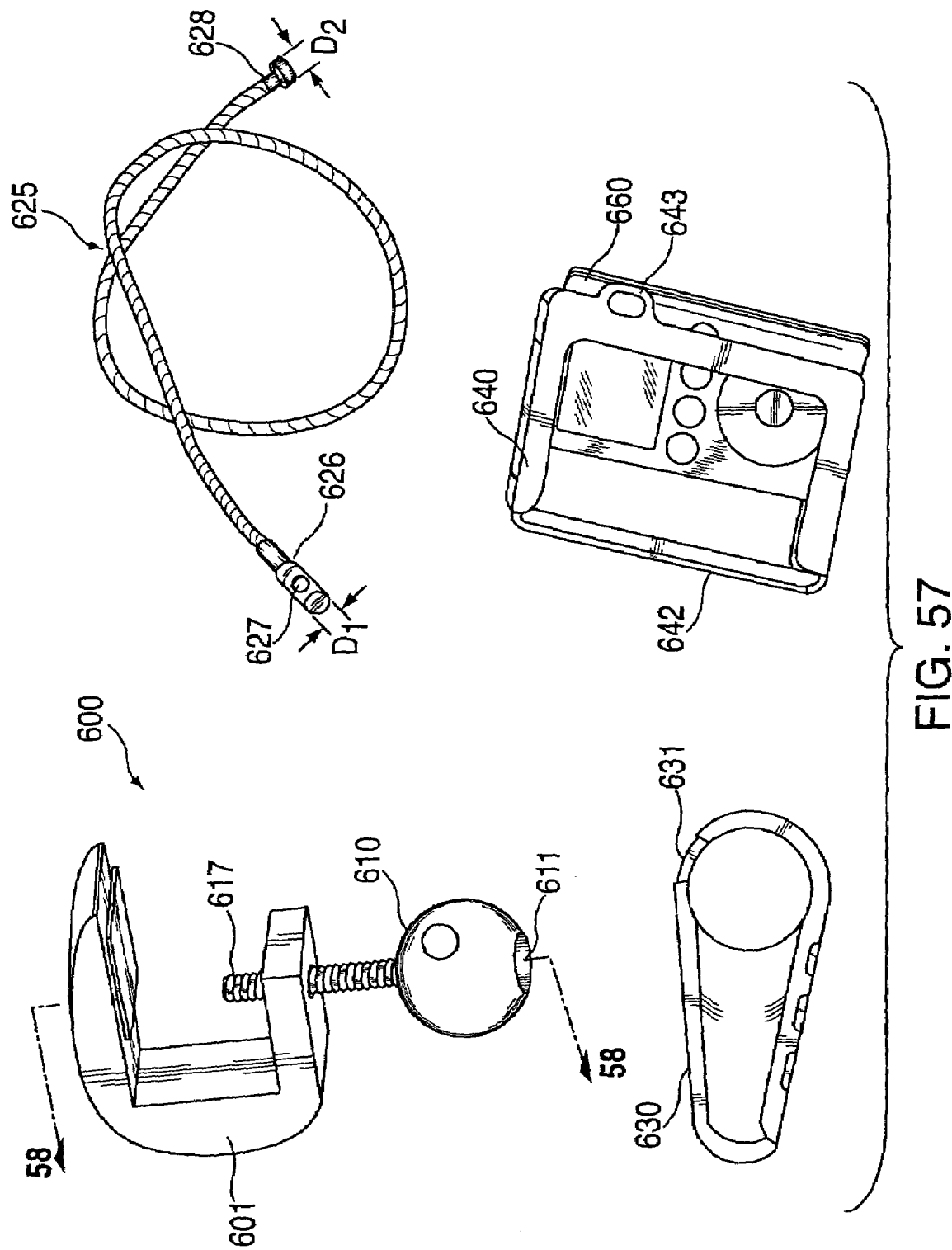
FIG. 57 is a perspective view of the cable clamp, cable, padlock, and iPod® security frame of the preferred embodiment.

FIGS. 57-60 illustrate the preferred embodiment of a digital music/video playback device security frame. FIG. 57 shows music/video playback device 660, such as, for example, an iPod® digital music/video playback device of Apple Corporation, being inserted into security frame 640 through its open edge; note that the top and bottom edges are U-shaped channels which terminate in a flat back edge 642. Also shown is steel cable 625, cable clamp 600, and lock 630 with its unique circular hasp; a standard key-operated or combination padlock can be substituted.

Figure 58:
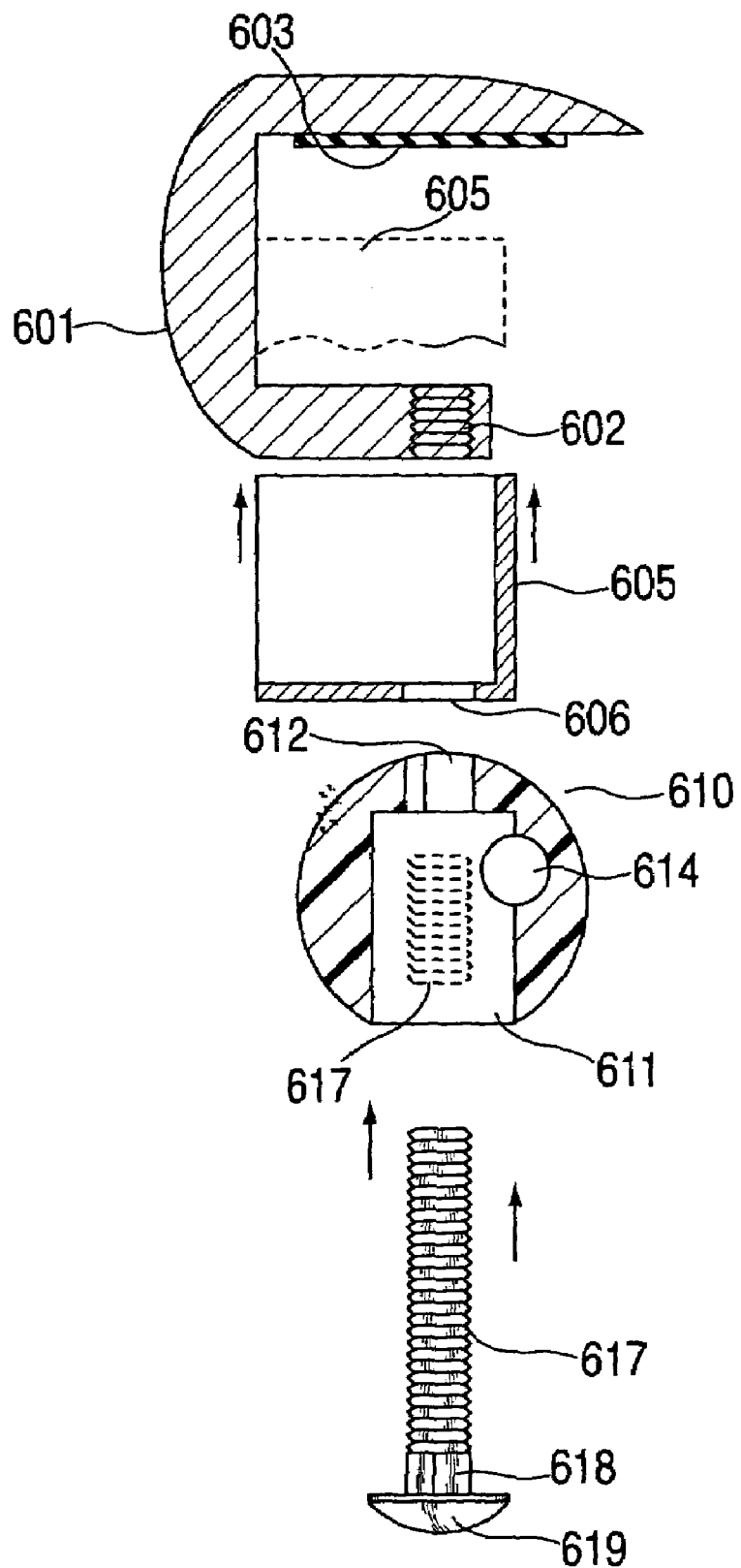
FIG. 58 is a side exploded crossectional view of the cable clamp of FIG. 57.

The operation of clamp 600 is described by the exploded view of FIG. 58. Frame 601 is shown in crossection with threaded hole 602 in lower jaw section and optional resilient pad 603 to prevent marring of desk or tabletop. An optional four-sided metal security box 605 is shown with screw clearance hole 606. Box 605 is slipped over screw 617 between knob 610 and clamp frame 601 to minimize access to the shank of screw 617 as by bolt cutters; it fits over the sides of frame 601 and is pushed up by knob 610 as screw 617 is advanced. (Box 605 is not used in the illustration of FIG. 57.) The minimum attachment edge thickness M is a function of screw 617 length. The range of adjustment "R" is noted. Screw 617 is a standard carriage bolt with smooth rounded head 619 and square under-head shank 618. Knob 610 has blind bottom end hole 611 with a diameter slightly larger than that of bolt head 619. At the distal end of blind hole 611, is square hole 612 which permits egress of the threaded portion of screw 617 but engages square shank 618 when pulled down and turned slightly into registration. Clamp 600 is assembled by pushing screw 617 through knob 610 (and box 605, if used) and then threading into hole 602 of clamp frame 601.

Figure 59:
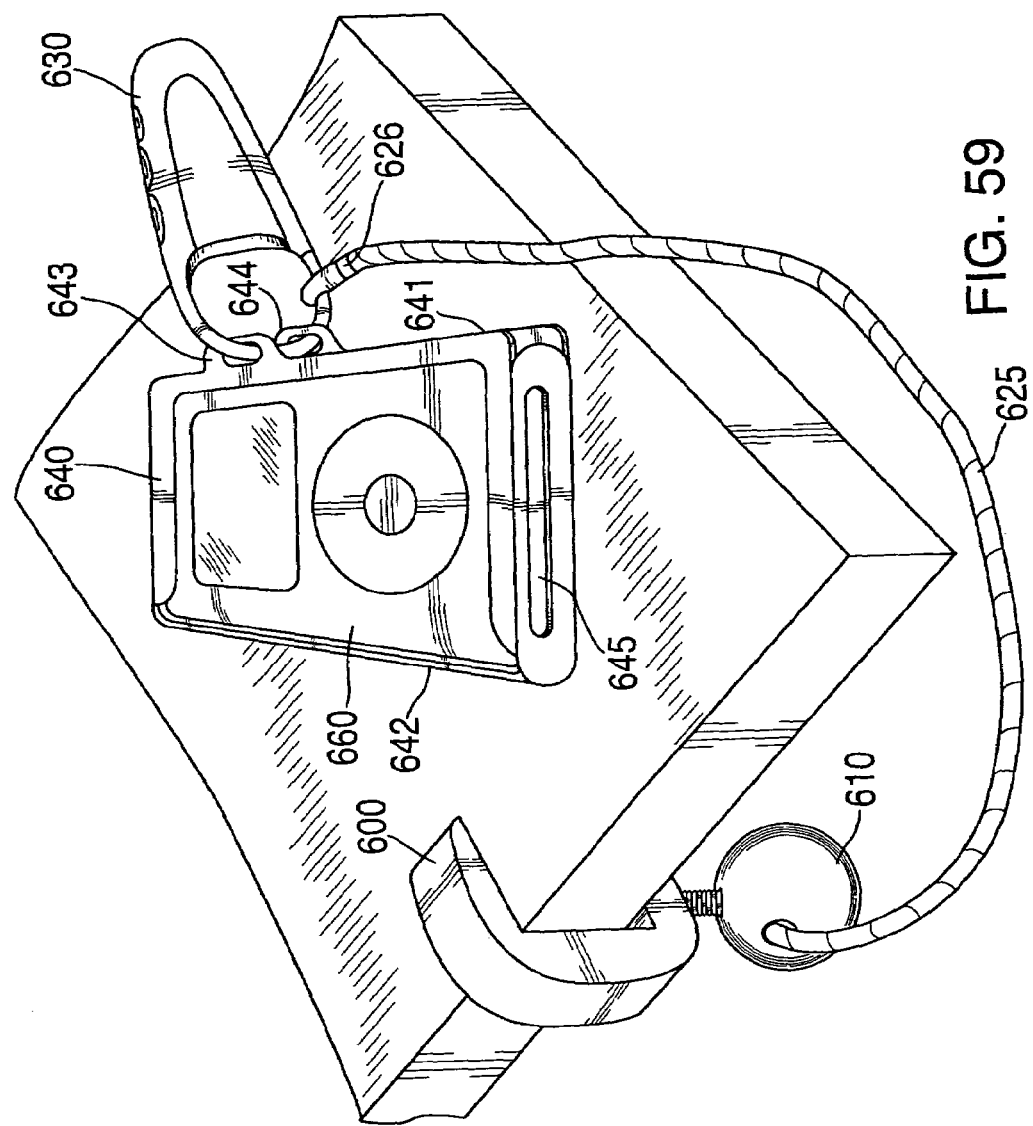
FIG. 59 is a perspective view of preferred embodiment iPod® security frame in use with a cable.

Clamp 600 is placed over the edge of a table or desk as shown in FIG. 59 and knob 610 is used to tighten screw 617 by keeping a slight downward pressure on it while turning. Then knob 610 is pushed up creating a space between head 619 and the distal end of blind hole 611 thereby disengaging square shank 618. In fact, head 619 should be below transverse hole 614 which is tangent to the position of threaded portion of screw 617 (see FIG. 58). At this point, cable ferrule 626 (with diameter D1 smaller than the diameter of transverse hole 614) is introduced with the entire cable following until cable stop 628 with diameter D2 is encountered. D2 is larger than hole 614 diameter. It is noted that with cable 625 inserted through knob 610, square shank 618 is prevented from engaging square hole 612 because head 619 cannot get past cable 625 within hole 611. Thus any rotation of knob 610 while cable 625 is present will not loosen (or tighten!) screw 617. To remove clamp 600, cable 625 must be completely withdrawn from transverse hole 614; slight pulling on knob 610 against screw head 619 will engage shank 618, and turning and loosening can proceed to effect removal.

FIG. 59 shows music/video playback device 660 secured to a desktop via clamp 600 and cable 625. Connector opening 645 is located in a bottom edge of security frame 640; a similar opening is in the top edge (not shown). The hasp of lock 630 engages both top loop extension 643 and bottom loop extension 644 as well as hole 627 of cable ferrule 626 to bridge open edge 641 and attach frame 640 to secure cable 625.

Figure 60:
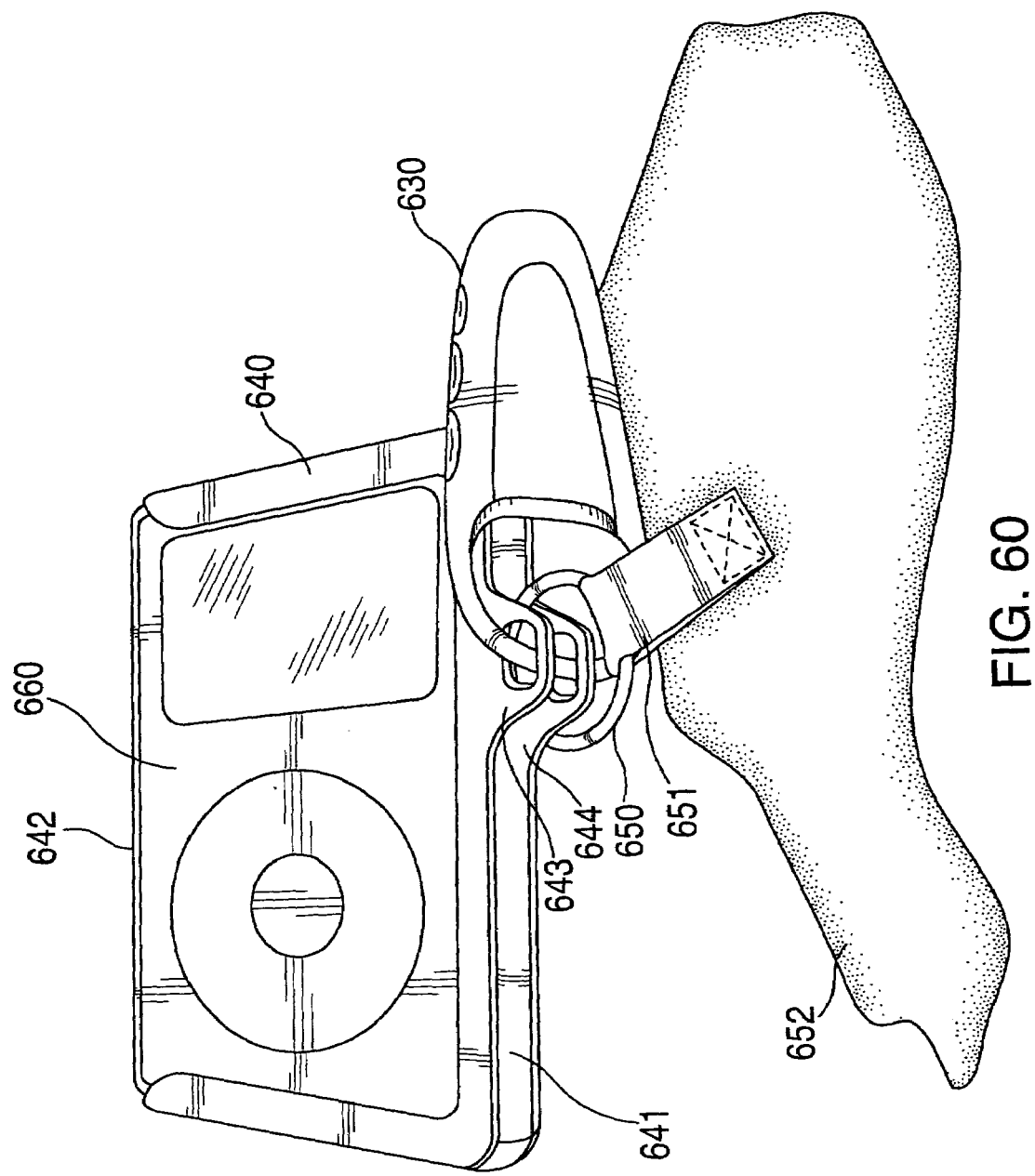
FIG. 60 is a close-up perspective view illustrating the method of attaching the preferred embodiment iPod® security frame to a back pack directly with a padlock; and, FIG. 61 is a perspective view of a further alternative embodiment of iPod® security frame with two hinged sections.

FIG. 60 shows an alternative attachment method which does not use clamp 600 nor cable 625. Here, frame 640 is directly attached to backpack 652 by lock 630 engaging both loop extensions 643 and 644 as well as ring 650 which is attached via sewn strap 651. A similar method can be used to attach frame 640 to a belt loop or to attachment rings on luggage, briefcases, pocketbooks, etc.

Figure 61:
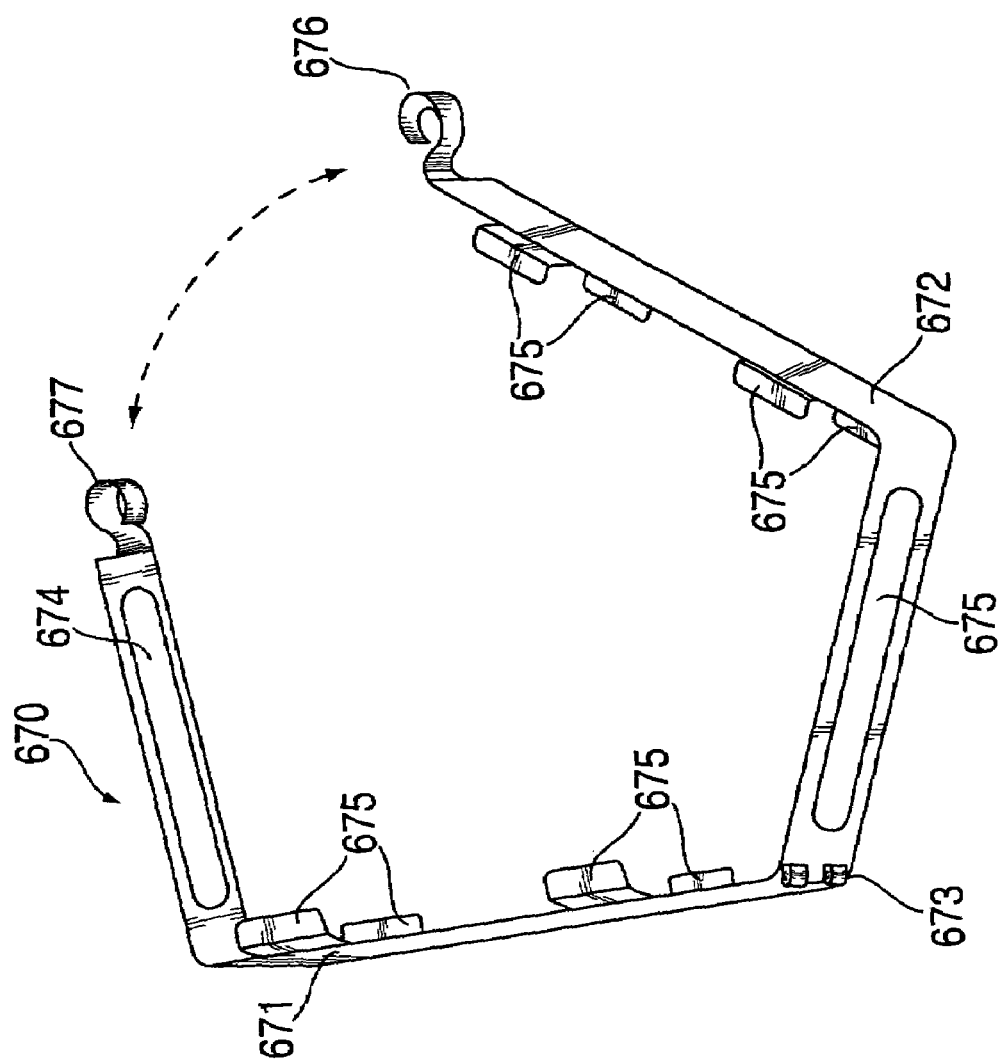

FIG. 61 shows frame 670 which is a further alternative embodiment of a security frame for a digital music/video playback device. Frame 670 includes two right angle sections 671 and 672 hinged at 673. Note that when distal end loops 676 and 677 are swung into registration, a rectangular frame sized to accommodate a digital music/video playback device is formed. The digital music/video playback device is held in place by bent-over tabs 675. Openings 674 and 675 accommodate digital music/video playback device connectors. Frame 670 can be attached to a secure cable and locked by engaging a distal cable ferrule as well as loops 676 and 677 in the hasp of a padlock.

Attachment to other objects without cable or clamp as shown for the preferred embodiment is possible in similar fashion for frame 670.

Figure 62:
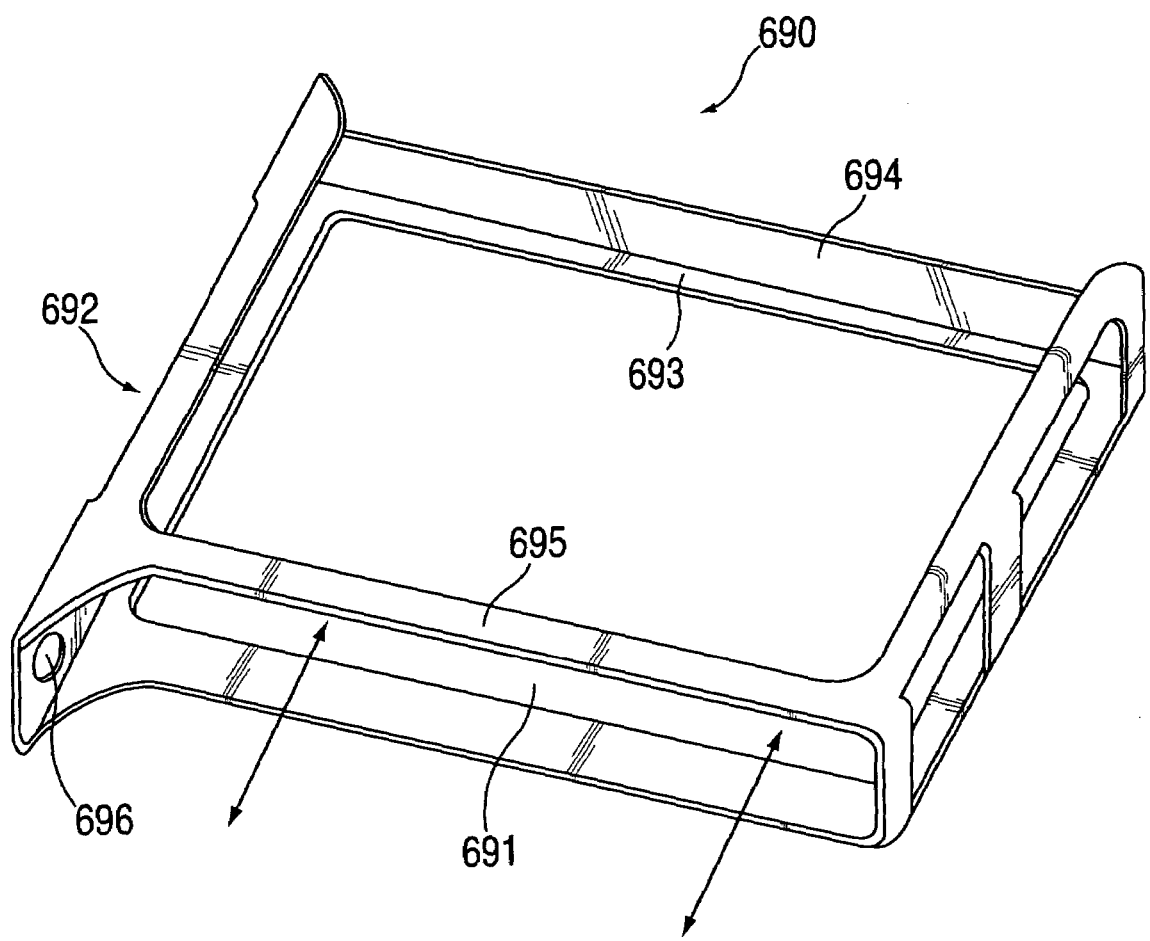
FIG. 62 is a perspective view of an alternate embodiment of music/video playback device locking frame with device entry at the long edge and securing hole at a side extension of the shorter top edge of the frame.
Figure 63:
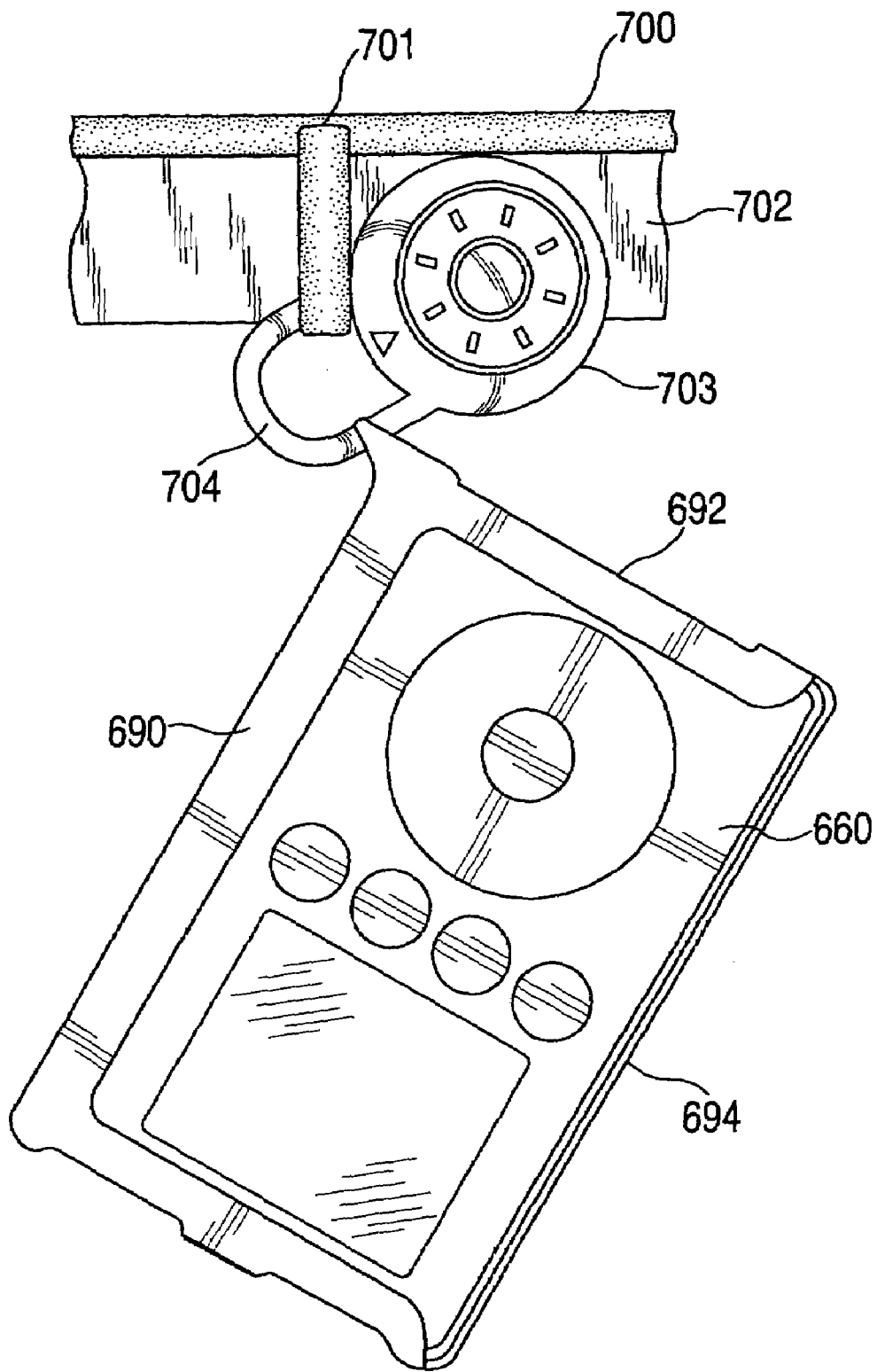
FIG. 63 is a front elevation of the frame of FIG. 62 with playback device secured within and dangling from a belt loop.

FIGS. 62 and 63 show alternate embodiment locking frame 690 for digital music/video playback device 660. The open long edge 691 permits insertion and retrieval of digital music/video playback device 660. Open central area 692 at the top edge of frame 690 provides access to attachment socket at the bottom of digital music/video playback device 660 if so equipped. Frame 690 has a low wall 694 and bottom frame members 693 which capture device 660. Note padlock hole 696 on a side extension of the top frame 690 edge.

FIG. 63 shows a portion of garment 700 with belt 702 and belt loop 701 which engages padlock 703 via hasp 704 which also goes through hole 696. Digital music/video playback device 660 is retained within frame 690 by the interference of hasp 704; it dangles with screen toward the bottom which facilitates easy reading while still attached to belt loop 701.

Figure 64:
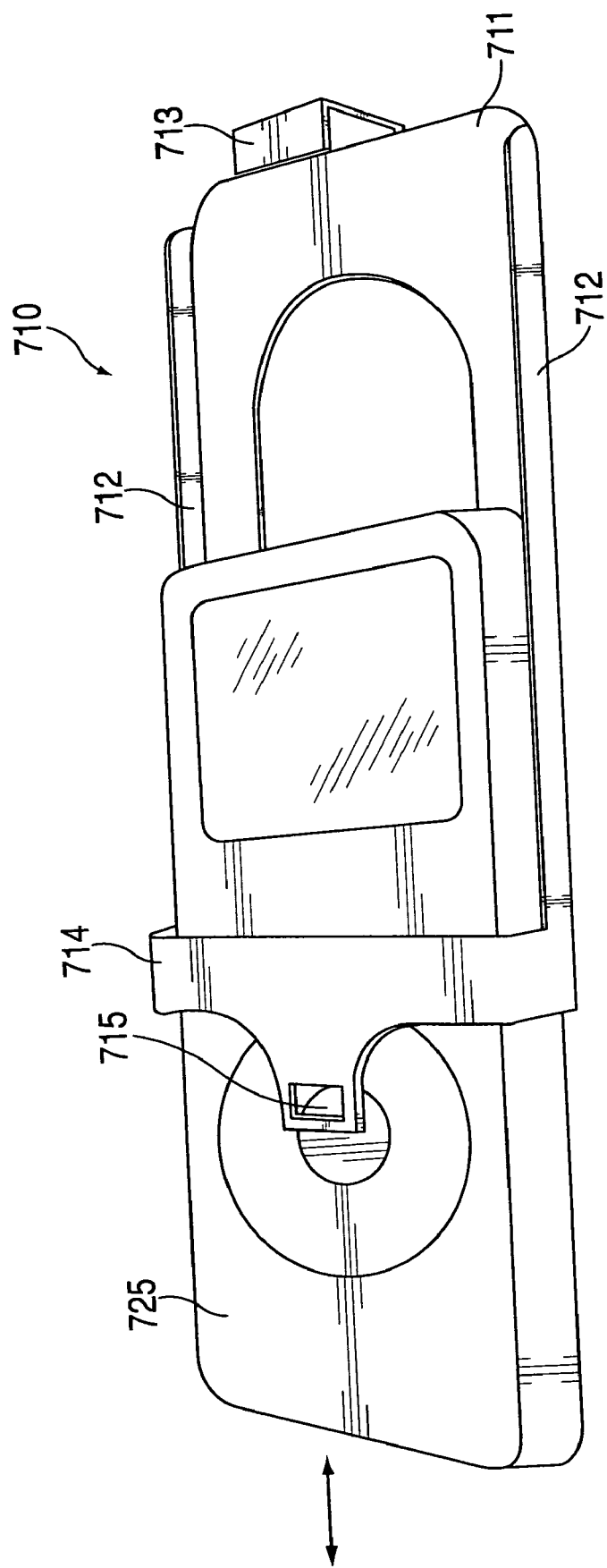
FIG. 64 is a perspective view of a further alternate embodiment with a music/video playback device being inserted through the band loop at the top of the frame.

FIGS. 64 and 65 show alternate embodiment locking frame 710 with digital music/video playback device 725.

In FIG. 64, digital music/video playback device 725 is being inserted or withdrawn from frame 710 through band loop 714 which has a hole 715 on a short extension for attachment. Frame 710 has a back side 711 with open central area, low guidance sides 712 and a distal hook 713 which engages the top (screen) end of digital music/video playback device 725 by looping over the front surface.

FIG. 65 shows digital music/video playback device 725 secured within frame 710 by padlock 703 which also engages belt loop 701. Hasp 704 prevents digital music/video playback device 725 from being withdrawn through band loop 714.

Figure 67:
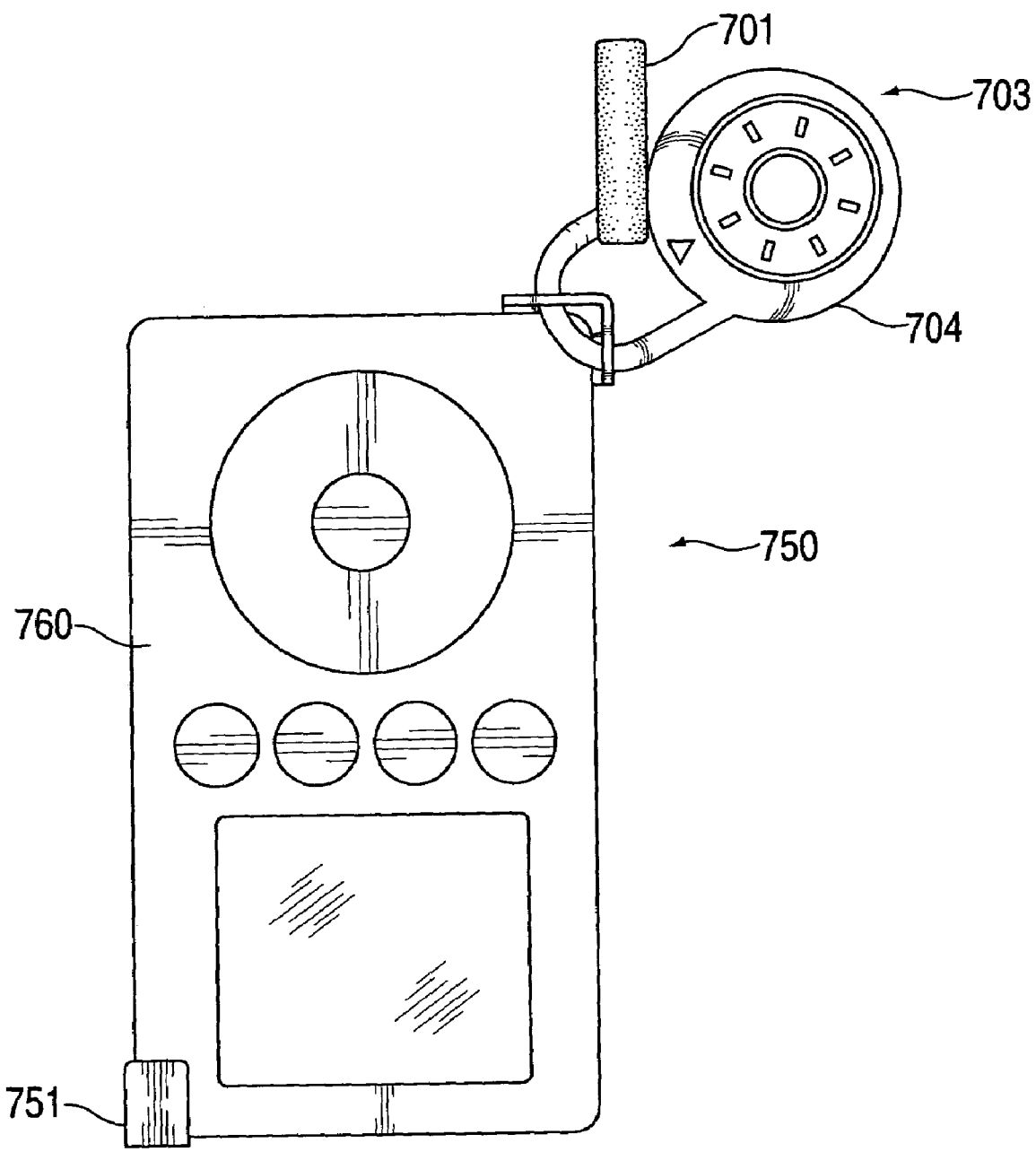
FIG. 67 is a front elevation of the locking bar of FIG. 66 with playback device securely engaged and dangling from a belt loop.

FIGS. 66 and 67 show alternate embodiment locking device 750 which is a diagonal bar 752 with distal pocket 751 and proximal pocket 753 formed of two orthogonal sides with locking holes 754. Note how hasp 704 of padlock 703 will secure digital music/video playback device 760 to locking device 750 by preventing the corner of device 760 from being lifted out of pocket 753. Distal pocket 751 engages the opposite diagonal corner of digital music/video playback device 760.

Figure 68:
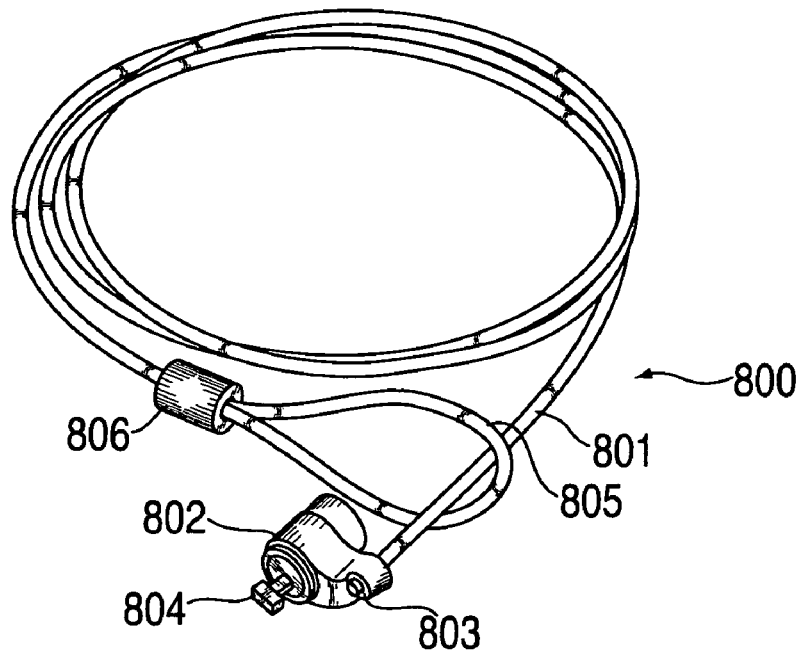
FIG. 68 is a perspective view of a prior art computer security cable with a loop at one end and a permanently attached lock at the other.

A prior art computer security cable 800 is shown in FIG. 68. It is a KENSINGTON® cable with their special lock 802 permanently attached via a swivel coupling 803 to steel cable 801. The other end of the cable is permanently formed into a loop 805 by ferrule 806. Lock 802 has protruding rectangular feature 804 that mates with the KENSINGTON® recess in a portable computer. In normal use, lock 802 is passed through loop 805 also engaging a secure anchoring member such as a pipe or handrail prior to locking it into the recess in the computer.

Figure 69:
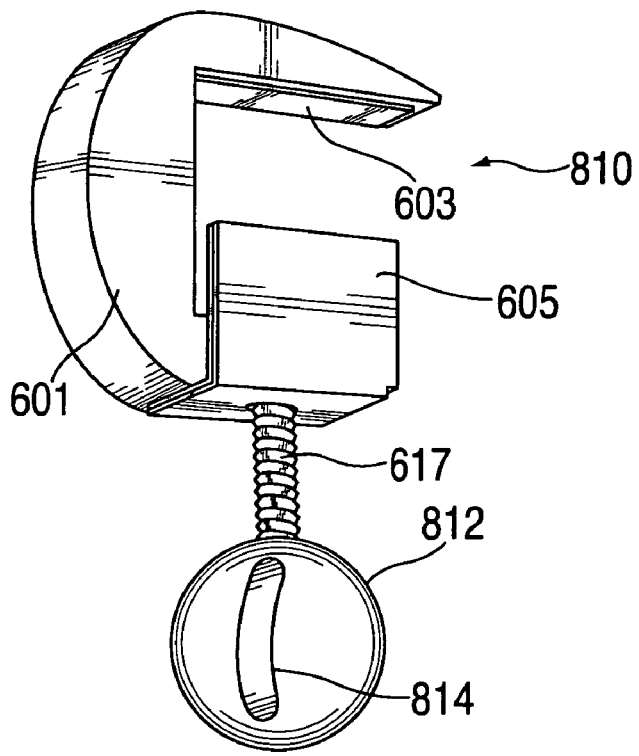
FIG. 69 is a perspective view of an alternate embodiment cable clamp usable with the cable shown in FIG. 68.

FIG. 69 shows an alternate embodiment cable clamp 810 which is similar in features and operation to clamp 600 shown in the exploded view of FIG. 58. Note the distinguishing feature of transverse slot 814 in operating knob 812. In FIG. 58, transverse cable hole 614 in knob 610 would not be able to admit either lock 802 not loop 805 of cable 800.

However, as shown in FIG. 70, loop 805 can enter through transverse slot 814 up to ferrule 806 thereby permitting lock 802 to enter the distal end of loop 805 engaging clamp 810. In operation, clamp 810 is first tightened onto a desk or table top using knob 812 pulled down engaging square feature 618 on screw 617. Then knob 812 is pushed up and loop 805 is inserted through slot 814 thereby making it impossible for knob 812 to re-seat onto screw head 619 to attempt to loosen clamp 810 (until loop 805 is again withdrawn). Any cable assembly with a permanent loop at one end and a permanently attached small lock at the other end can be accommodated by cable clamp 810. A small hasp lock can be used; then the notebook computer or other device to be secured simply needs a securely attached loop, not a specially designed recess.

FIG. 71 shows another embodiment of cable clamp 830 which has a grip range adjusting feature. The clamp frame is in two parts, top jaw part 831 and bottom jaw part 832. Jaw part 831 is pinned or otherwise rigidly attached to body screw 833. Bottom jaw part 832 can rotate on screw 833 by virtue of a threaded hole, thereby expanding or reducing the distance between pad 603 and end of screw 617. Note that with slot 814 in knob 812, this grip-range adjustable clamp 830 can accommodate any cable that is compatible with clamp 810.

FIGS. 72 and 73 show a sleeve frame for slidably securing a personal electronic entertainment device 925 within, such as an Apple® iPod® personal music player. Frame plate 901 forms a base from which short walls 903 and 905 extend in perpendicular arrangement. Short walls 903, 905 have top ends and opposite bottom ends. Frame plate 901 similarly has opposite top and bottom ends, and frame plate 901 is provided with a central opening.

Near the top ends of respective short walls 903 and 905 there are provided opposing grasp tabs 913 and 915. Grasp tabs 913 and 915 inwardly extending retaining lugs 914 and 916 extending therefrom for grasping and retaining the personal entertainment device.

Frame plate 901 is provided with a single grasp tab 904 extending from the bottom of it. Retaining lug 910 extends inwardly from grasp tabs 904.

Grasp tabs 904, 913 and 915 with corresponding respective retaining lugs 910, 914 and 916 comprise one grasping and retaining elements of sleeve frame 900.

Short wall 905 is further provided with tab 906 at its upper end, tab 906 comprising a short upward extension of wall 905. Tab 906 is provided with an aperture for receiving a lock hasp, said hasp preventing removal of the personal music player 925 from sleeve frame 900.

FIG. 73 shows sleeve frame 900 with personal music player 925 being inserted therein.

In the foregoing description, certain terms and visual depictions are used to illustrate the preferred embodiment. However, no unnecessary limitations are to be construed by the terms used or illustrations depicted, beyond what is shown in the prior art, since the terms and illustrations are exemplary only, and are not meant to limit the scope of the present invention.

It is further known that other modifications may be made to the present invention, without departing the scope of the invention.

I claim:

1. A locking device for a music playback device comprising:
   a frame encircling the music playback device;
   a clamp attachable to a table top; and,
   a rod securing said frame to said clamp with a pin lock;
   said clamp having a groove in an upright section of its respective frame, said groove receiving a tab from a bottom end of said frame;
   said tab in said clamp groove;
   said rod insertable through respective holes in extensions on respective sides of said frame and through an offset hole in a locking knob of said clamp;
   said music playback device being secured by said locking device and said clamp knob being prevented from loosening said clamp from said tabletop.

2. A security frame system for and in combination with a portable hand held electronic device comprising:
   a housing for accommodating said electronic device, said housing having a side opening for insertion of said electronic device, said housing having a wall opening for providing access to operating features of said electronic device while in said housing;
   loop extensions from said housing on opposite sides of said opening to accommodate a padlock to prevent unauthorized removal of said electronic device from said housing;
   a cable having a ferrule at one end having an opening for engaging said padlock;
   a clamp for attachment to a table top;
   said clamp having means for being engaged with an opposite end of said cable preventing removal of said clamp from said table top while said ferrule of said cable is engaged with said padlock, thereby providing security against theft of said electronic device.

3. The security frame system of claim 2 in which said clamp comprises:
   a C-shaped frame for straddling an edge of said table top having a lower jaw under said table top and an upper jaw above said table top;
   a threaded opening in said lower jaw to accommodate a fastener to press a distal end of said fastener against an underside of said table to force said upper jaw against a surface of said table top;
   a proximate end of said fastener having a smooth rounded head and a square under-head shank;
   a knob on said fastener under said lower jaw, said knob having a blind hole to receive said proximate end of said fastener, said blind hole having an opening allowing said fastener to exit said knob and pass through said threaded opening of said lower jaw; and
   said knob having a locking hole extending through said blind hole below said rounded head of said fastener when said fastener is completely threaded through said lower jaw;
   said cable passing through said locking hole to prevent said fastener from being removed from said table top, the opposite end of said cable having a cable stop whose diameter is too large to pass through said locking hole, said ferrule having a smaller diameter able to pass through said locking hole after removal from said padlock, thereby preventing unauthorized removal of said housing and/or electronic device when said padlock is in place.

4. The security frame system of claim 3 in which the blind hole fastener opening is square to accommodate the square shank of said fastener.

5. The security frame system of claim 4 in which said knob is spherical.

6. The security frame system of claim 5 in which said upper jaw has a resilient pad to prevent marring a finish on said table top.

7. The security frame system of claim 3 having a security box on said fastener between said knob and said lower jaw to block exposure to bolt cutters.

8. The security frame system of claim 7 in which said security box is four sided with a clearance hole for said fastener.

9. A security frame system for and in combination with a portable hand held electronic device comprising:
   a integral one piece housing for accommodating said electronic device, said integral housing having a side opening for insertion of said electronic device, said integral housing having a wall opening for providing access to operating features of said electronic device while in said housing;
   loop extensions from said integral one piece housing on opposite sides of said side opening to accommodate a padlock to prevent unauthorized removal of said electronic device from said integral housing;
   said loop extensions of said integral one piece housing including a pair of grasping tabs having lugs extending across said portable hand held electronic device, forming a partial band loop partially encircling said portable hand held electronic device;
   a cable having a ferrule at one end having an opening for engaging said padlock.

10. A security frame system for and in combination with a portable hand held electronic device comprising:
    a housing for accommodating said electronic device, said housing having a side opening for insertion of said electronic device, said housing having a wall opening for providing access to operating features of said electronic device while in said housing;
    loop extensions from said housing on opposite sides of said opening to accommodate a padlock to prevent unauthorized removal of said electronic device from said housing;
    a cable having a ferrule at one end having an opening for engaging said padlock,
    a clamp for attachment to a table top;
    said clamp having means for being engaged with an opposite end of said cable preventing removal of said clamp from said table top while said ferrule of said cable is engaged with said padlock, thereby providing security against theft of said electronic device.

11. The security frame system of claim 10 in which said clamp comprises:
    a C-shaped frame for straddling an edge of said table top having a lower jaw under said table top and an upper jaw above said table top;
    a threaded opening in said lower jaw to accommodate a fastener to press a distal end of said fastener against an underside of said table to force said upper jaw against a surface of said table top;
    a proximate end of said fastener having a smooth rounded head and a square under-head shank;
    a knob on said fastener under said lower jaw, said knob having a blind hole to receive said proximate end of said fastener, said blind hole having an opening allowing said fastener to exit said knob and pass through said threaded opening of said lower jaw; and
    said knob having a locking hole extending through said blind hole below said rounded head of said fastener when said fastener is completely threaded through said lower jaw;
    said cable passing through said locking hole to prevent said fastener from being removed from said table top, the opposite end of said cable having a cable stop whose diameter is too large to pass through said locking hole, said ferrule having a smaller diameter able to pass through said locking hole after removal from said padlock, thereby preventing unauthorized removal of said housing and/or electronic device when said padlock is in place.

12. The security frame system of claim 10 in which the blind hole fastener opening is square to accommodate the square shank of said fastener.

13. The security frame system of claim 11 in which said knob is spherical.

14. The security frame system of claim 13 in which said upper jaw has a resilient pad to prevent marring a finish on said table top.

15. The security frame system of claim 14 having a security box on said fastener between said knob and said lower jaw to block exposure to bolt cutters.

16. The security frame system of claim 15 in which said security box is four sided with a clearance hole for said fastener.

17. A locking device for a music playback devices comprising:
    a frame encircling the music playback device;
    a clamp attachable to a table top; and,
    a rod securing said frame to said clamp with a pin lock;
    said clamp having a groove in an upright section of its respective frame, said groove receiving a tab from a bottom end of said frame;
    said tab in said clamp groove;
    said rod insertable through respective holes in extensions on respective sides of said frame and through an offset hole in a locking knob of said clamp;
    said music playback device being secured by said locking device and said clamp knob being prevented from loosening said clamp from said tabletop.

18. A locking device for a music/video playback devices comprising:
    a frame encircling the music/video playback device;
    said frame having an open side along an edge to permit the playback device to be inserted therein;
    said frame having a band loop near a top of said frame, said frame further having a hook engaging a front of the music/video playback device;
    the playback device being secured within said frame by engaging a hasp of a lock within a hole on an extension of an edge of said band loop of said frame; the hasp providing an interference preventing the withdrawal of the music/video device from said frame.

19. The locking device as claim 18 wherein said extension is a side extension of a top edge of said band loop of said frame.

20. The locking device as claim 18 wherein said extension is a side extension of a side edge of said band loop of said frame.

21. A locking device for a music/video playback devices comprising:
    a frame encircling the music/video playback device;
    said frame having a band loop near a top of said frame sized to permit the music/video playback device to be inserted through it to a distal hook at an opposite edge of said frame, said hook engaging a front of the music/video playback device near a center of a top edge of the screen of the top edge of the music/video playback device, whereby said insertion opening in said frame is as wide as a shorter dimension of said playback device,
    said top band loop having a short central extension on a front side thereof with a hole to accept a hasp of a lock, said hasp preventing the withdrawal of the device from said frame.

22. The music/video playback device as in claim 21 wherein said hasp also engages a belt loop, thereby securing the device to a belt loop or backpack ring which is also engaged with said lock hasp.

23. The music/video playback device as in claim 21 wherein said hasp also engages a backpack ring, thereby securing the device to the backpack ring which is also engaged with said lock hasp.

24. A locking device for a music/video playback devices comprising:
   an integral one piece frame encircling the music/video playback device;
   said an integral one piece frame capturing the music/video playback device at only two diagonal opposite corners thereof;
   said an integral one piece frame being a flat bar which is positioned in contact with a back side of the music/video playback device;
   said an integral one piece frame extending only diagonally from a top corner of said music/video playback device to a bottom opposite corner of said music/video playback device;
   each end of said an integral one piece frame having a recess pocket engaging the playback device at an opposite corner of the screen of the music/video playback device with a small portion thereof extending over a screen frame of the face of the music/video playback device.

25. The music/video playback device as in claim 24 wherein each said diagonally opposite recess pocket is a three-sided rectangular recess pocket permitting opposite corners of the playback device to nestle within the frame formed by said diagonal bar resting against the back side of the music/video playback device.

26. The music/video playback device as in claim 24 wherein respective sides of one of said recess pockets are higher than a predetermined thickness of the playback device, said recess pocket having two orthogonal holes placed above said device thickness, wherein further the music/video playback device is secured within said frame having said diagonal bar when the hasp of a lock is passed through said two orthogonal holes thereby preventing the bottom corner of the music/video device from being lifted up away from said frame having said diagonal bar.

27. A frame system for securing a portable hand held electronic device to a garment/backpack comprising:
   an integral one piece housing for accommodating said electronic device, said housing having a side opening between a pair of side walls for insertion of said electronic device and a wall opening in said housing for providing access to operating features of said electronic device while in said housing attached to said garment/backpack;
   said integral one piece housing having a band loop near a top of said housing, said housing further having a hook engaging a front of the music/video playback device;
   said band loop having an extension with a padlock hole;
   a padlock secured to said housing through said padlock hole blocking removal of said electronic device from said housing; and
   said padlock also secured to a loop portion of said garment/backpack, said padlock requiring the use of a key to release said padlock from said garment/backpack and/or said side wall extension.

28. The frame system of claim 27 in which said side walls have portions which overlap edges of said electronic device to secure said electronic device within said housing.

29. A frame system for securing a portable hand held electronic device to a garment/backpack comprising:
   a housing for accommodating said electronic device, said housing having a back side, a pair of guide walls along opposite side edges of said back side, and a band loop mounted on a front edge of said housing shaped to permit said electronic device to slide through said loop along said back side between said guide walls;
   an L-shaped hook mounted on a rear edge of said back side to receive a leading edge of said electronic device, said hook preventing lifting of said electronic device from said back side;
   said band loop having a padlock opening for a padlock, said padlock when engaged with said padlock opening preventing removal of said electronic device through said band loop; and
   said padlock also secured to a loop portion of said garment/backpack, said padlock requiring the use of a key to release said padlock from said garment/backpack and/or said band loop.

30. The frame system of claim 29 in which said band loop has a forward extending portion in which said padlock opening is located.

31. A sleeve frame for theft-proof retention of a personal entertainment device, comprising:
   a frame plate having a hollow central portion, said frame plate extending between opposite top and bottom ends, said frame plate extending laterally between an opposite pair of short, sidewalls projecting perpendicularly from said frame plate; and wherein
   said sidewalls respectively have opposite top and bottom ends; and wherein
   said sidewalls respectively have grasping tabs comprised of an enlarged segment of said top end of each respective sidewall; and wherein
   said grasping tabs respectively have an inwardly projecting retaining lug extending from said respective grasping tabs; and wherein
   said bottom end of said frame plate has a grasping tab extending perpendicularly therefrom; and said frame plate grasping tab further having an inwardly projecting retaining lug extending therefrom; and wherein
   at least one of said sidewalls has an upward extension thereof, said at least one extension comprising at least one locking tab, having an aperture for receiving a padlock hasp therethrough.

32. An integral sleeve frame for theft-proof retention of a personal entertainment device, comprising: a base plate having top and bottom ends, said base plate comprising short sidewalls extending perpendicular therefrom; wherein said integral sleeve frame has a band loop with at least one securing stop, for stopping a personal entertainment device being inserted therein; and wherein said integral sleeve frame has at least one apertured tab for receiving a padlock hasp; said integral sleeve frame having an aperture for inserting or alternately removing the personal device.

* * * * *